(12) United States Patent
Yu et al.

(10) Patent No.: US 11,967,119 B2
(45) Date of Patent: Apr. 23, 2024

(54) SYSTEMS AND METHODS FOR CODING

(71) Applicant: ZHEJIANG DAHUA TECHNOLOGY CO., LTD., Zhejiang (CN)

(72) Inventors: Pan Yu, Hangzhou (CN); Zhuqing Zhu, Hangzhou (CN); Qi Chen, Hangzhou (CN); Wei Fang, Hangzhou (CN); Yinchang Yang, Hangzhou (CN)

(73) Assignee: ZHEJIANG DAHUA TECHNOLOGY CO., LTD., Hangzhou (CN)

( * ) Notice: Subject to any disclaimer, the term of this patent is extended or adjusted under 35 U.S.C. 154(b) by 367 days.

(21) Appl. No.: 17/643,837

(22) Filed: Dec. 12, 2021

(65) Prior Publication Data

US 2022/0101562 A1    Mar. 31, 2022

Related U.S. Application Data

(63) Continuation of application No. PCT/CN2020/075539, filed on Feb. 17, 2020.

(30) Foreign Application Priority Data

Jul. 22, 2019    (CN) .......................... 201910662290.9

(51) Int. Cl.
*G06T 7/70* (2017.01)
*G06F 1/03* (2006.01)
(Continued)

(52) U.S. Cl.
CPC .................. *G06T 9/00* (2013.01); *G06F 1/03* (2013.01); *H03M 7/3079* (2013.01); *H03M 7/6011* (2013.01)

(58) Field of Classification Search
CPC ...... H04N 19/13; H04N 7/0127; G06F 1/329; G06F 1/03; G09G 5/18; G09G 3/3208; G06T 9/00; H04W 24/08; G06N 20/00
See application file for complete search history.

(56) References Cited

U.S. PATENT DOCUMENTS

2011/0091123 A1    4/2011    Fukuhara et al.
2013/0114687 A1*   5/2013    Kim ..................... H04N 19/625
                                                  375/240.03
(Continued)

FOREIGN PATENT DOCUMENTS

CN    1207917 C      6/2005
CN    101193287 A    6/2008
(Continued)

OTHER PUBLICATIONS

International Search Report in PCT/CN2020/075539 dated May 20, 2020, 4 pages.
(Continued)

*Primary Examiner* — Phuoc H Doan
(74) *Attorney, Agent, or Firm* — METIS IP LLC

(57) ABSTRACT

The present disclosure relates to systems and methods for coding. The methods may include receiving at least two contexts, for each of the at least two contexts, obtaining at least one coding parameter corresponding to the context from at least one lookup table, determining a probability interval value corresponding to the context based on a previous probability interval value and the at least one coding parameter, determining a normalized probability interval value corresponding to the context by performing a normalization operation on the probability interval value, determining a probability interval lower limit corresponding to the context based on a previous probability interval lower limit and the at least one coding parameter, determining a normalized probability interval lower limit corresponding to
(Continued)

the context by performing the normalization operation on the probability interval lower limit, and outputting at least one byte based on the normalized probability interval lower limit.

20 Claims, 19 Drawing Sheets

(51) Int. Cl.
*G06T 9/00* (2006.01)
*H03M 7/30* (2006.01)

(56) References Cited

U.S. PATENT DOCUMENTS

| | | | |
|---|---|---|---|
| 2013/0300591 A1* | 11/2013 | Marpe | H03M 7/4006 341/67 |
| 2017/0310999 A1 | 10/2017 | Hebel et al. | |

FOREIGN PATENT DOCUMENTS

| | | |
|---|---|---|
| CN | 101841707 A | 9/2010 |
| CN | 101848387 A | 9/2010 |
| CN | 101820549 B | 10/2011 |
| CN | 105791828 A | 7/2016 |
| CN | 104683806 B | 12/2017 |
| JP | 2015115665 A | 6/2015 |
| WO | 2021012666 A1 | 1/2021 |

OTHER PUBLICATIONS

Written Opinion in PCT/CN2020/075539 dated May 20, 2020, 5 pages.
First Office Action in Chinese Application No. 201910662290.9 dated Jun. 5, 2020, 16 pages.
The Extended European Search Report in European Application No. 20844298.8 dated May 23, 2022, 9 pages.
Liu, Kai et al., A High Performance MQ Encoder Architecture in JPEG2000, Integration—the VLSI Journal, 43: 305-317, 2010.
Chiang, Jen-Shiun et al., High-speed EBCOT with Dual Context-Modeling Coding Architecture for JPEG2000, IEEE International Symposium on Circuits and Systems, III 865-III 868, 2004.

* cited by examiner

2100

| | MBS | | | LBS |
|---|---|---|---|---|
| C-register | 0000 cbbb | bbbb bsss | xxxx xxxx | xxxx xxxx |
| A-register | 0000 0000 | 0000 0000 | aaaa aaaa | aaaa aaaa |

| Previous byte | c bit on C-register | b bit on C-register | New byte | Previous byte | C value after byteout |
|---|---|---|---|---|---|
| B | Cc | Cb | B1 | B | C |
| =ff | 0 | | {Cc, Cb[7:1]} | =ff | {m' d0, Cb[0],Cs,Cx,n' d0} |
| =ff | 1 | | {Cc, Cb[7:1]} | =ff | {m' d0, Cb[0],Cs,Cx,n' d0} |
| =fe | 1 | | {1'b0, Cb[7:1]} | =ff | {m' d0, Cb[0],Cs,Cx,n' d0} |
| <fd | 0 | | Cb[7:0] | =B | {m' d0, Cs,Cx,n' d0} |
| <fe | 1 | | Cb[7:0] | =B+1 | {m' d0, Cs,Cx,n' d0} |

Data before byteout | Data after byteout

SYSTEMS AND METHODS FOR CODING

CROSS-REFERENCE TO RELATED APPLICATIONS

This application is a continuation of International Application No. PCT/CN2020/075539, filed on Feb. 17, 2020, which claims priority to Chinese Patent Application No. 201910662290.9 filed on Jul. 22, 2019, the contents of which are incorporated herein by reference in their entirety.

TECHNICAL FIELD

The present disclosure generally relates to communication field, and in particular, to systems and methods for coding.

BACKGROUND

With the development of communication technology and multimedia technology, the exploration of image coding has developed rapidly nowadays. Commonly, take an arithmetic coding method used in JPEG 2000 as an example, an image coding system can circularly receive contexts from a bit plane coding module and circularly update probability interval values and probability interval lower limits associated with the contexts. However, a traditional arithmetic coding method requires relatively high and complex hardware resources and the processing efficiency is relatively low. Therefore, it is desirable to provide systems and methods for coding efficiently and effectively.

SUMMARY

An aspect of the present disclosure relates to a method for arithmetic entropy coding. The method may include updating a probability interval value of each of two context-decision pairs. The two context-decision pairs may be input in parallel. The method may further include performing a shift processing on the updated probability interval value. The method may further include updating a probability interval lower limit of each of the two context-decision pairs. And the method may also include normalizing the probability interval lower limit and outputting a code stream.

Another aspect of the present disclosure relates to a system for coding. The system may include at least one storage medium including a set of instructions and at least one processor in communication with the at least one storage medium. When executing the set of instructions, the at least one processor may be directed to cause the system to receive at least two contexts including a first context and a second context. The at least one processor may be directed to cause the system further to, for each of the at least two contexts, obtain, from at least one lookup table, at least one coding parameter corresponding to the context, determine a probability interval value corresponding to the context based on a previous probability interval value and the at least one coding parameter, determine a normalized probability interval value corresponding to the context by performing a normalization operation on the probability interval value, determine a probability interval lower limit corresponding to the context based on a previous probability interval lower limit and the at least one coding parameter, determine a normalized probability interval lower limit corresponding to the context by at least performing the normalization operation on the probability interval lower limit, and output at least one byte corresponding to the context based on the normalized probability interval lower limit.

A further aspect of the present disclosure relates to a method implemented on a computing device including at least one processor, at least one storage medium, and a communication platform connected to a network. The method may include receiving at least two contexts including a first context and a second context. The method may further include, for each of the at least two contexts, obtaining, from at least one lookup table, at least one coding parameter corresponding to the context, determining a probability interval value corresponding to the context based on a previous probability interval value and the at least one coding parameter, determining a normalized probability interval value corresponding to the context by performing a normalization operation on the probability interval value, determining a probability interval lower limit corresponding to the context based on a previous probability interval lower limit and the at least one coding parameter, determining a normalized probability interval lower limit corresponding to the context by at least performing the normalization operation on the probability interval lower limit, and outputting at least one byte corresponding to the context based on the normalized probability interval lower limit.

A still further aspect of the present disclosure relates to a system for coding. The system may include a context receiving module configured to receive at least two contexts including a first context and a second context. The system may further include a coding parameter obtaining module configured to, for each of the at least two contexts, obtain, from at least one lookup table, at least one coding parameter corresponding to the context. The system may further include a probability interval value determination module configured to determine a probability interval value corresponding to the context based on a previous probability interval value and the at least one coding parameter. The system may further include a normalized probability interval value determination module configured to determine a normalized probability interval value corresponding to the context by performing a normalization operation on the probability interval value. The system may further include a probability interval lower limit determination module configured to determine a probability interval lower limit corresponding to the context based on a previous probability interval lower limit and the at least one coding parameter. The system may further include a normalized probability interval lower limit determination module configured to determine a normalized probability interval lower limit corresponding to the context by at least performing the normalization operation on the probability interval lower limit. And the system may also include a byte output module configured to output at least one byte corresponding to the context based on the normalized probability interval lower limit.

A still further aspect of the present disclosure relates to a non-transitory computer readable medium including executable instructions that, when executed by at least one processor, direct the at least one processor to perform a method. The method may include receiving at least two contexts including a first context and a second context. The method may further include, for each of the at least two contexts, obtaining, from at least one lookup table, at least one coding parameter corresponding to the context, determining a probability interval value corresponding to the context based on a previous probability interval value and the at least one coding parameter, determining a normalized probability interval value corresponding to the context by performing a normalization operation on the probability interval value, determining a probability interval lower limit corresponding to the context based on a previous probability interval lower limit and the at least one coding parameter, determining a normalized probability interval lower limit corresponding to the context by at least performing the normalization operation on the probability interval lower limit, and outputting at least one byte corresponding to the context based on the normalized probability interval lower limit.

A still further aspect of the present disclosure relates to a system for coding. The system may include at least one storage medium including a set of instructions and at least one processor in communication with the at least one storage medium. When executing the set of instructions, the at least one processor may be directed to cause the system to receive a first context and a second context, obtain, from at least one lookup table, at least one first coding parameter corresponding to the first context and at least one second coding parameter corresponding to the second context, determine a first probability interval value corresponding to the first context based on a previous probability interval value and the at least one first coding parameter, determine a first normalized probability interval value corresponding to the first context by performing a first normalization operation on the first probability interval value, determine a first probability interval lower limit corresponding to the first context based on a previous probability interval lower limit and the at least one first coding parameter, determine a first normalized probability interval lower limit corresponding to the first context by performing the first normalization operation on the first probability interval lower limit, determine a second probability interval value corresponding to the second context based on the first normalized probability interval value and the at least one second coding parameter, determine a second normalized probability interval value corresponding to the second context by performing a second normalization operation on the second probability interval value, determine a second probability interval lower limit corresponding to the second context based on the first normalized probability interval lower limit and the at least one second coding parameter, determine a second normalized probability interval lower limit corresponding to the second context by performing the second normalization operation on the second probability interval lower limit, and output at least one byte corresponding to the first context based on the first normalized probability interval lower limit and at least one byte corresponding to the second context based on the second normalized probability interval lower limit.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
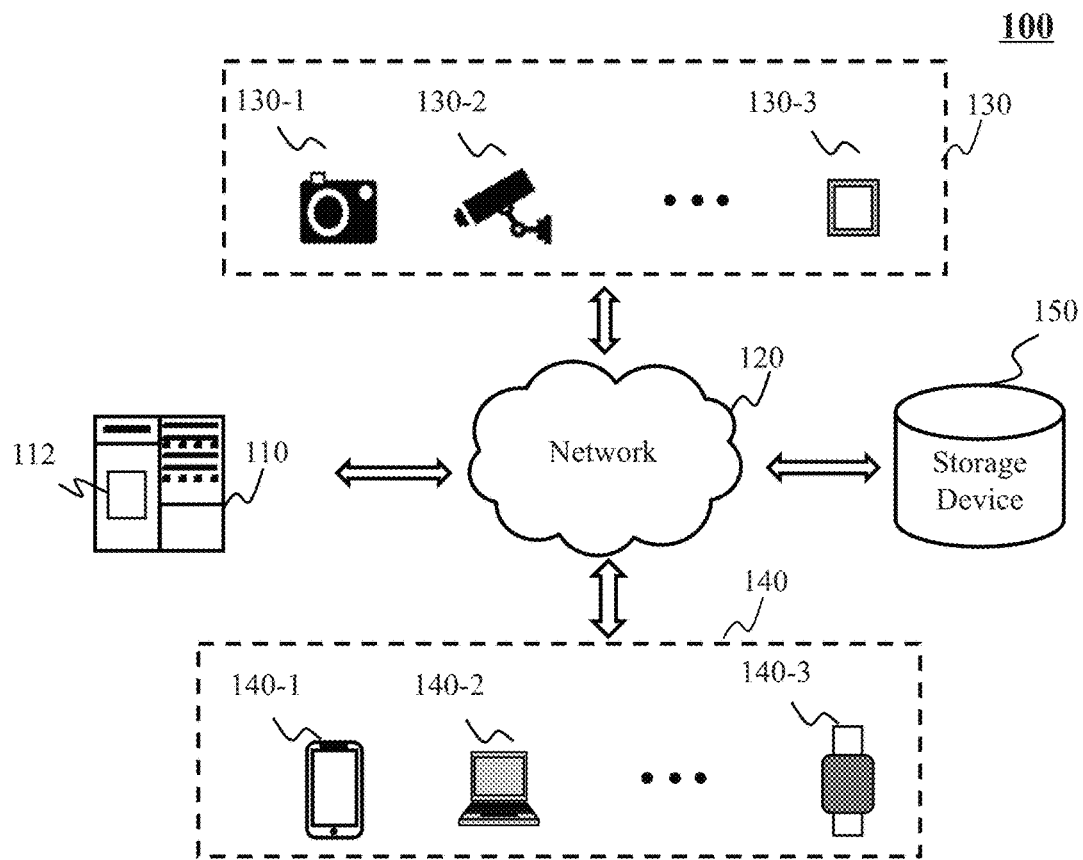
FIG. 1 is a schematic diagram illustrating an exemplary image processing system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

It will be understood that the terms "system," "engine," "unit," "module," and/or "block" used herein are one method to distinguish different components, elements, parts, sections, or assemblies of different levels in ascending order. However, the terms may be displaced by other expression if they may achieve the same purpose.

Generally, the words "module," "unit," or "block" used herein, refer to logic embodied in hardware or firmware, or to a collection of software instructions. A module, a unit, or a block described herein may be implemented as software and/or hardware and may be stored in any type of non-transitory computer-readable medium or other storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 220 illustrated in FIG. 2) may be provided on a computer readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules (or units or blocks) may be included in connected logic components, such as gates and flip-flops, and/or can be included in programmable units, such as programmable gate arrays or processors. The modules (or units or blocks) or computing device functionality described herein may be implemented as software modules (or units or blocks), but may be represented in hardware or firmware. In general, the modules (or units or blocks) described herein refer to logical modules (or units or blocks) that may be combined with other modules (or units or blocks) or divided into sub-modules (or sub-units or sub-blocks) despite their physical organization or storage.

It will be understood that when a unit, an engine, a module, or a block is referred to as being "on," "connected to," or "coupled to" another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

The terminology used herein is for the purposes of describing particular examples and embodiments only and is not intended to be limiting. As used herein, the singular forms "a," "an," and "the" may be intended to include the plural forms as well, unless the context clearly indicates otherwise. It will be further understood that the terms "include" and/or "comprise," when used in this disclosure, specify the presence of integers, devices, behaviors, stated features, steps, elements, operations, and/or components, but do not exclude the presence or addition of one or more other integers, devices, behaviors, features, steps, elements, operations, components, and/or groups thereof.

In addition, it should be understood that in the description of the present disclosure, the terms "first", "second", or the like, are only used for the purpose of differentiation, and cannot be interpreted as indicating or implying relative importance, nor can be understood as indicating or implying the order.

The flowcharts used in the present disclosure illustrate operations that systems implement according to some embodiments of the present disclosure. It is to be expressly understood, the operations of the flowcharts may be implemented not in order. Conversely, the operations may be implemented in inverted order, or simultaneously. Moreover, one or more other operations may be added to the flowcharts. One or more operations may be removed from the flowcharts.

An aspect of the present disclosure relates to systems and methods for coding (e.g., arithmetic entropy coding). The systems may receive at least two contexts including a first context and a second context. For each of the at least two contexts, the systems may obtain at least one coding parameter corresponding to the context from at least one lookup table. The systems may further determine a probability interval value corresponding to the context based on a previous probability interval value and the at least one coding parameter. The systems may further determine a normalized probability interval value corresponding to the context by performing a normalization operation on the probability interval value. The systems may also determine a probability interval lower limit corresponding to the context based on a previous probability interval lower limit and the at least one coding parameter. The systems may further determine a normalized probability interval lower limit corresponding to the context by performing the normalization operation on the probability interval lower limit. The systems may also output at least one byte corresponding to the context based on the normalized probability interval lower limit. According to the systems and methods of the present disclosure, at least two contexts can be processed in a single clock by a single hardware logic, thereby improving the coding efficiency.

FIG. 1 is a schematic diagram illustrating an exemplary image processing system according to some embodiments of the present disclosure. The image processing system 100 may be used in various scenarios including, for example, a security technology, a transportation management, a prison management system, a communication industry, a medical treatment, an education system, a financial service, or the like, or any combination thereof. In some embodiments, the image processing system 100 or a portion thereof may be implemented in a camera device (e.g., a digital camera). As illustrated, the image processing system 100 may include a server 110, a network 120, an acquisition device 130, a user device 140, and a storage device 150.

The server 110 may be a single server or a server group. The server group may be centralized or distributed (e.g., the server 110 may be a distributed system). In some embodiments, the server 110 may be local or remote. For example, the server 110 may access information and/or data stored in the acquisition device 130, the user device 140, and/or the storage device 150 via the network 120. As another example, the server 110 may be directly connected to the acquisition device 130, the user device 140, and/or the storage device 150 to access stored information and/or data. In some embodiments, the server 110 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the server 110 may be implemented on a computing device 200 including one or more components illustrated in FIG. 2 of the present disclosure.

In some embodiments, the server 110 may include a processing device 112. The processing device 112 may process information and/or data relating to image processing to perform one or more functions described in the present disclosure. For example, the processing device 112 may obtain an image from the acquisition device 130 and perform an image coding on the image. Specifically, the processing device 112 may receive at least two contexts associated with the image and output bytes corresponding to the at least two contexts by circularly updating a probability interval value and probability interval lower limit corresponding to each of the at least two contexts. In some embodiments, the processing device 112 may include one or more processing devices (e.g., single-core processing device(s) or multi-core processor(s)). Merely by way of example, the processing device 112 may include a central processing unit (CPU), an application-specific integrated circuit (ASIC), an application-specific instruction-set processor (ASIP), a graphics processing unit (GPU), a physics processing unit (PPU), a digital signal processor (DSP), a field programmable gate array (FPGA), a programmable logic device (PLD), a controller, a microcontroller unit, a reduced instruction-set computer (RISC), a microprocessor, or the like, or any combination thereof.

In some embodiment, the server 110 may be unnecessary and all or part of the functions of the server 110 may be implemented by other components (e.g., the acquisition device 130, the user device 140) of the image processing system 100. For example, the processing device 112 may be integrated into the acquisition device 130 or the user device 140 and the functions (e.g., image coding) of the processing device 112 may be implemented by the acquisition device 130 or the user device 140.

The network 120 may facilitate exchange of information and/or data for the image processing system 100. In some embodiments, one or more components (e.g., the server 110, the acquisition device 130, the user device 140, the storage device 150) of the image processing system 100 may transmit information and/or data to other component(s) of the image processing system 100 via the network 120. For example, the acquisition device 130 may transmit images to the server 110 via the network 120. As another example, the server 110 may obtain images from the storage device 150 via the network 120. In some embodiments, the network 120 may be any type of wired or wireless network, or combination thereof. Merely by way of example, the network 120 may include a cable network (e.g., a coaxial cable network), a wireline network, an optical fiber network, a telecommunications network, an intranet, an Internet, a local area network (LAN), a wide area network (WAN), a wireless local area network (WLAN), a metropolitan area network (MAN), a public telephone switched network (PSTN), a Bluetooth network, a ZigBee network, a near field communication (NFC) network, or the like, or any combination thereof.

The acquisition device 130 may be configured to acquire an image (the "image" herein may refer to a single image or a frame of a video) and/or a video. In some embodiments, the acquisition device 130 may include a camera 130-1, a video recorder 130-2, an image sensor 130-3, or the like, or any combination thereof. The camera 130-1 may include a gun camera, a dome camera, an integrated camera, a monocular camera, a binocular camera, a multi-view camera, or the like, or any combination thereof. The video recorder 130-2 may include a PC Digital Video Recorder (DVR), an embedded DVR, or the like, or any combination thereof. The image sensor 130-3 may include a Charge Coupled Device (CCD), a Complementary Metal Oxide Semiconductor (CMOS), or the like, or any combination thereof. The image acquired by the acquisition device 130 may be a one-dimensional image, a two-dimensional image, a three-dimensional image, a four-dimensional image, etc. In some embodiments, the acquisition device 130 may transmit the acquired image to one or more components (e.g., the server 110, the user device 140, the storage device 150) of the image processing system 100 via the network 120.

The user device 140 may be configured to receive information and/or data from the server 110, the acquisition device 130, and/or the storage device 150 via the network 120. For example, the user device 140 may receive a processed image (e.g., a compressed image obtained by image coding) from the server 110. In some embodiments, the user device 140 may provide a user interface via which a user may view information and/or input data and/or instructions to the image processing system 100. For example, the user may view the compressed image via the user interface. As another example, the user may input one or more image processing parameters (e.g., an image coding parameter) to the image processing system 100 via the user interface. In some embodiments, the user device 140 may include a mobile phone 140-1, a computer 140-2, a wearable device 140-3, or the like, or any combination thereof. In some embodiments, the user device 140 may include a display that can display information in a human-readable form, such as text, image, audio, video, graph, animation, or the like, or any combination thereof. The display of the user device 140 may include a cathode ray tube (CRT) display, a liquid crystal display (LCD), a light emitting diode (LED) display, a plasma display panel (PDP), a three dimensional (3D) display, or the like, or a combination thereof.

The storage device 150 may be configured to store data and/or instructions. The data and/or instructions may be obtained from, for example, the server 110, the acquisition device 130, the user device 140, and/or any other component of the image processing system 100. In some embodiments, the storage device 150 may store data and/or instructions that the server 110 may execute or use to perform exemplary methods described in the present disclosure. For example, the storage device 150 may store at least one lookup table including at least one coding parameter (also referred to as "coding-related parameter") corresponding to a context associated with an image. In some embodiments, the storage device 150 may include a mass storage, a removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components (e.g., the server 110, the acquisition device 130, the user device 140) of the image processing system 100. One or more components of the image processing system 100 may access the data or instructions stored in the storage device 150 via the network 120. In some embodiments, the storage device 150 may be directly connected to or communicate with one or more components (e.g., the server 110, the acquisition device 130, the user device 140) of the image processing system 100. In some embodiments, the storage device 150 may be part of other components of the image processing system 100, such as the server 110, the acquisition device 130, or the user device 140.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 2:
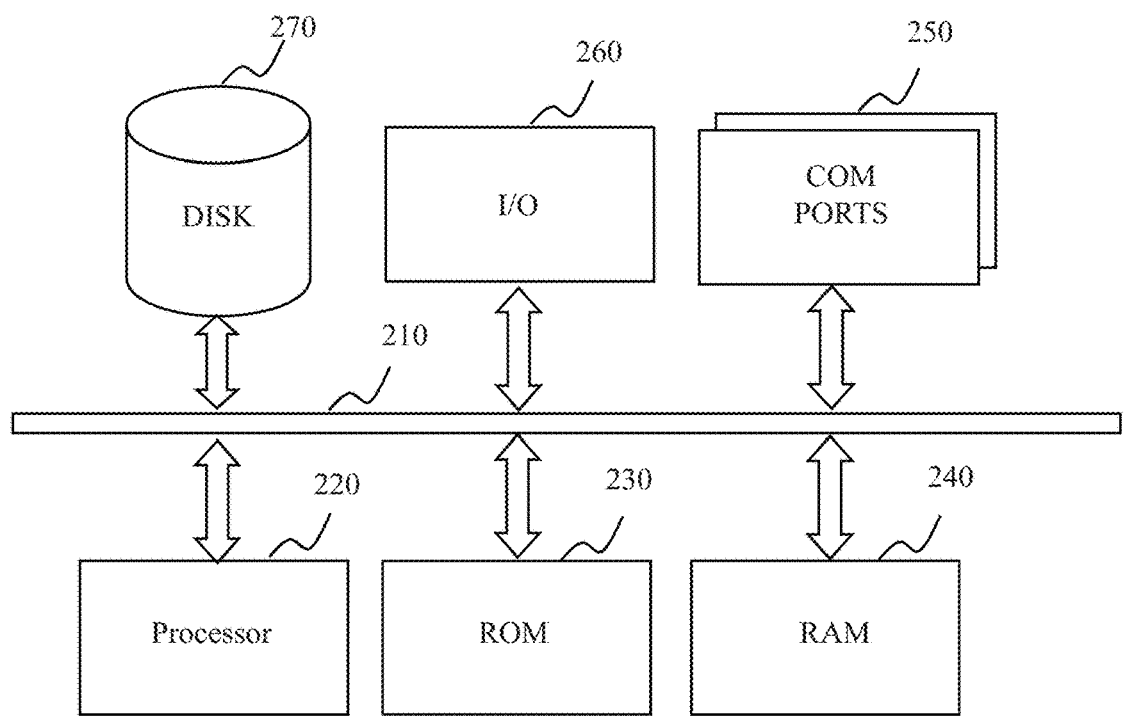
FIG. 2 is a schematic diagram illustrating exemplary hardware and/or software components of an exemplary computing device according to some embodiments of the present disclosure.

FIG. 2 is a schematic diagram illustrating exemplary hardware and/or software components of an exemplary computing device according to some embodiments of the present disclosure. In some embodiments, the server 110 may be implemented on the computing device 200. For example, the processing device 112 may be implemented on the computing device 200 and configured to perform functions of the processing device 112 disclosed in this disclosure.

The computing device 200 may be used to implement any component of the image processing system 100 as described herein. For example, the processing device 112 may be implemented on the computing device 200, via its hardware, software program, firmware, or a combination thereof. Although only one such computer is shown, for convenience, the computer functions relating to image processing as described herein may be implemented in a distributed fashion on a number of similar platforms to distribute the processing load.

The computing device 200, for example, may include COM ports 250 connected to and from a network connected thereto to facilitate data communications. The computing device 200 may also include a processor (e.g., the processor 220), in the form of one or more processors (e.g., logic circuits), for executing program instructions. For example, the processor 220 may include interface circuits and processing circuits therein. The interface circuits may be configured to receive electronic signals from a bus 210, wherein the electronic signals encode structured data and/or instructions for the processing circuits to process. The processing circuits may conduct logic calculations, and then determine a conclusion, a result, and/or an instruction encoded as electronic signals. Then the interface circuits may send out the electronic signals from the processing circuits via the bus 210.

The computing device 200 may further include program storage and data storage of different forms including, for example, a disk 270, a read-only memory (ROM) 230, or a random-access memory (RAM) 240, for storing various data files to be processed and/or transmitted by the computing device 200. The computing device 200 may also include program instructions stored in the ROM 230, RAM 240, and/or another type of non-transitory storage medium to be executed by the processor 220. The methods and/or processes of the present disclosure may be implemented as the program instructions. The computing device 200 may also include an I/O component 260, supporting input/output between the computing device 200 and other components. The computing device 200 may also receive programming and data via network communications.

Merely for illustration, only one processor is illustrated in FIG. 2. Multiple processors 220 are also contemplated; thus, operations and/or method steps performed by one processor 220 as described in the present disclosure may also be jointly or separately performed by the multiple processors. For example, if in the present disclosure the processor 220 of the computing device 200 executes both step A and step B, it should be understood that step A and step B may also be performed by two different processors 220 jointly or separately in the computing device 200 (e.g., a first processor executes step A and a second processor executes step B, or the first and second processors jointly execute steps A and B).

Figure 3:
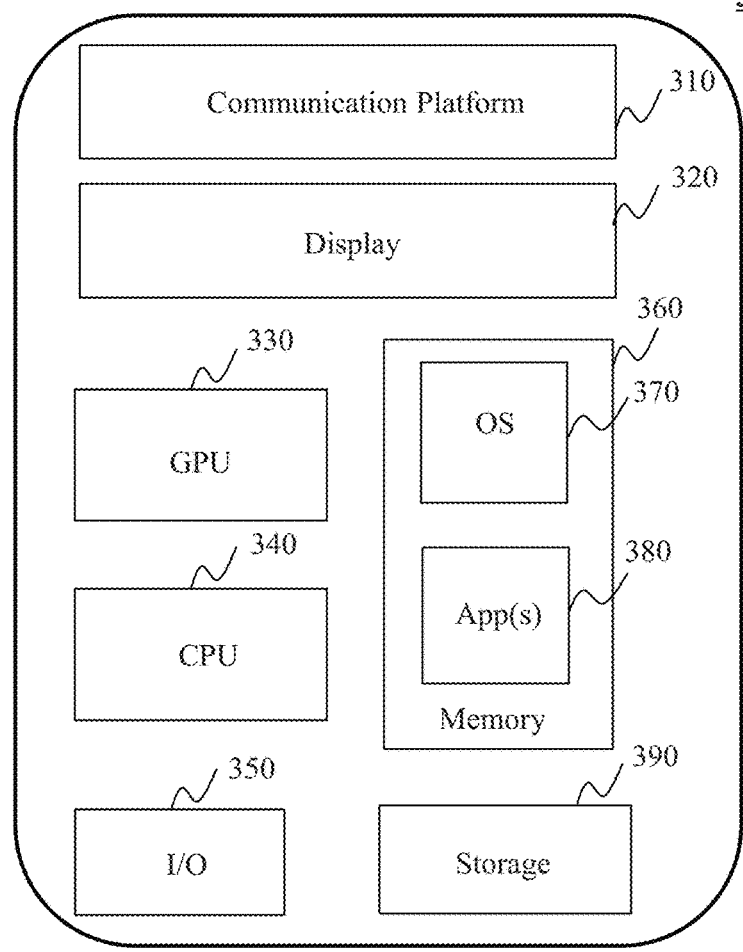
FIG. 3 is a schematic diagram illustrating exemplary hardware and/or software components of an exemplary mobile device according to some embodiments of the present disclosure.

FIG. 3 is a schematic diagram illustrating exemplary hardware and/or software components of an exemplary mobile device according to some embodiments of the present disclosure. In some embodiments, the user device 140 may be implemented on the mobile device 300.

As illustrated in FIG. 3, the mobile device 300 may include a communication platform 310, a display 320, a graphic processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300.

In some embodiments, the communication platform 310 may include a transmission device (not shown) via which the communication platform 310 may transmit information and/or data to external components. In some embodiments, the transmission device may include a Network Interface Controller (NIC) configured to connect to an external network device to communicate with the network 120. In some embodiments, the transmission device may include a Radio Frequency (RF) module configured to communicate with the network 120 via a wireless connection.

In some embodiments, the central processing unit (CPU) 340 may include a microcontroller unit (MCU), a field programmable gate array (FPGA), etc.

In some embodiments, the storage 390 may store a computer program (e.g., a software program and/or a module of an application software). The CPU 340 may execute various functions and data processing by running the computer program. In some embodiments, the storage 390 may include a high-speed random access storage, a non-volatile storage such as a magnetic storage device, a flash storage, etc.

In some embodiments, an operating system 370 (e.g., iOS™, Android™, Windows Phone™) and one or more applications (Apps) 380 may be loaded into the memory 360 from the storage 390 in order to be executed by the CPU 340. The applications 380 may include a browser or any other suitable mobile apps for receiving and rendering information relating to image processing or other information from the processing device 112. User interactions may be achieved via the I/O 350 and provided to the processing device 112 and/or other components of the image processing system 100 via the network 120.

Figure 4:
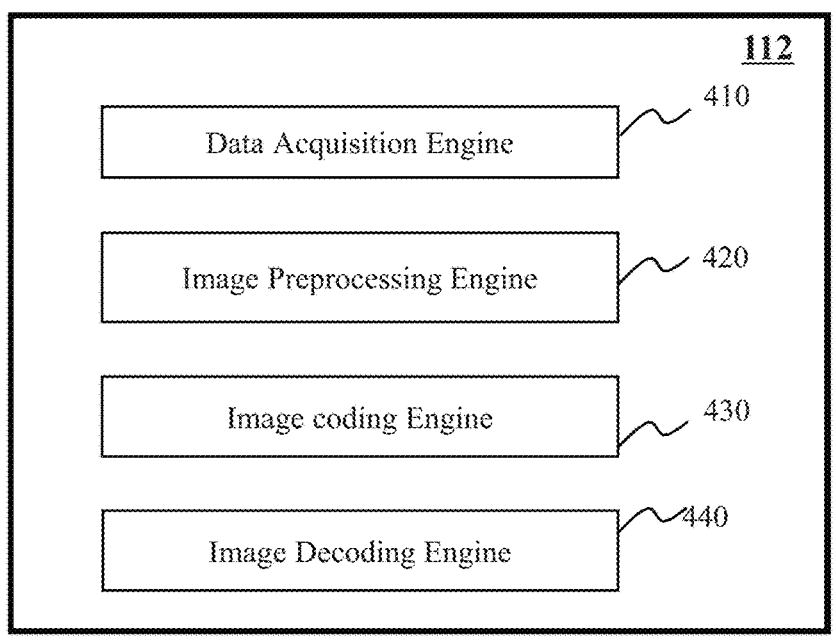
FIG. 4 is a schematic diagram illustrating an exemplary processing device according to some embodiments of the present disclosure.

FIG. 4 is a schematic diagram illustrating an exemplary processing device according to some embodiments of the present disclosure. As illustrated in FIG. 4, the processing device 112 may include a data acquisition engine 410, an image pre-processing engine 420, an image coding engine 430, and an image decoding engine 440.

The data acquisition engine 410 may be configured to obtain image data and/or reference data associated with the image data. The data acquisition engine 410 may obtain the image data and/or the reference data from the acquisition device 130, the user device 140, the storage device 150, or an external device. In some embodiments, the image data may be obtained from an image (e.g., a still image) or a video (or a video frame thereof). In some embodiments, the reference data associated with the image data may include control data (e.g., image acquisition parameters), interaction data (e.g., user instructions), or the like, or any combination thereof. In some embodiments, the image data and/or reference data may be analog data or digital data.

The image pre-processing engine 420 may be configured to preprocess the data received by the data acquisition engine 410. For example, the image pre-processing engine 420 may perform a preprocess operation on the image data including, for example, an image tiling, a direct-current (DC) level shifting, a color transforming, etc. For example, the image pre-processing engine 420 may perform the image tiling by dividing a whole image into one or more image tiles (e.g., rectangular and non-overlapping tiles with an equal size). As another example, for each component of an image tile (e.g., a red component, a green component, or a blue component), the image pre-processing engine 420 may perform the DC level shifting by subtracting samples (i.e., pixel values) of the image tile component using a same quantity. As a further example, the color transforming may include a reversible color transforming (RCT), an irreversible color transforming (ICT), etc.

The image coding engine 430 may be configured to code the image data (or the preprocessed image data). In some embodiments, according to JPEG 2000, the image coding engine 430 may perform a forward transform (e.g., a two dimensional (2D) wavelet transform) for each preprocessed image tile. For example, for each preprocessed image tile, the image coding engine 430 may determine transform coefficients for the preprocessed image tile and decompose the preprocessed image tile into one or more sub-bands. The image coding engine 430 may further quantize the transform coefficients based on a scalar quantization. For example, according to the scalar quantization, the image coding engine 430 may map each of the transform coefficients to a quantization coefficient. In some embodiments, after quantizing the transform coefficients, the image coding engine 430 may divide each of the one or more sub-bands into a plurality of non-overlapping code blocks, each of which may be coded independently, without interactions with other code blocks. Further, the image coding engine 430 may perform an entropy coding on each of the plurality of non-overlapping code blocks. Specifically, for each of the plurality of code blocks, the image coding engine 430 may decompose the quantization coefficients corresponding to the code block into one or more bit-planes ranging from a most significance bit-plane (MSB) to a least significant bit-plane (LSB). Then the image coding engine 430 may perform a bit-plane coding for each of the one or more bit-planes. In some embodiments, the image coding engine 430 may perform the bit-plane coding along a significance propagation pass (SIG pass), a magnitude refinement pass (REF pass), and/or a cleanup pass (CLN pass). Specifically, the bit-plane may include a plurality of coefficient bits each of which may be coded in only one of the three coding passes (i.e., the SIG pass, the REF pass, and the CLN pass). Take a specific coefficient bit as an example, in a coding pass, a zero coding (ZC), a sign coding (SC), and/or a run length coding (RLC) may be applied and a decision and a context corresponding to the coefficient bit may be output. As a result, output data of the bit-plane coding of the plurality of coefficient bits may include a plurality of contexts each of which corresponds to a decision.

In some embodiments, the image coding engine 430 may further perform an arithmetic entropy coding (e.g., using an MQ-coder) on the plurality of contexts and the decision corresponding to each of the plurality of contexts. Specifically, for each of the plurality of contexts, the image coding engine 430 may obtain at least one coding parameter corresponding to the context. The image coding engine 430 may determine a probability interval value corresponding to the context based on a previous probability interval value and the at least one coding parameter. The image coding engine 430 may further determine a normalized probability interval value corresponding to the context by performing a normalization operation on the probability interval value. Further, the image coding engine 430 may determine a probability interval lower limit corresponding to the context based on a previous probability interval lower limit and the at least one coding parameter. Furthermore, the image coding engine 430 may determine a normalized probability interval lower limit corresponding to the context by performing the normalization operation on the probability interval lower limit. Moreover, the image coding engine 430 may output at least one byte corresponding to the context based on the normalized probability interval lower limit. Output bytes corresponding to the plurality of contexts may form a code stream that may be stored and/or transmitted to other components of the processing device 112 (e.g., the image decoding engine 440).

The image decoding engine 440 may be configured to decode image data (e.g., the code stream received from the image coding engine 430). The code stream may include information regarding a plurality of code blocks of each image tile of the image data. For each image tile, the image decoding engine 440 may parse the code stream and determine the information regarding the plurality of code blocks. Then for each of the plurality of code blocks, the image decoding engine 440 may also parse the information regarding the plurality of code blocks and determine a plurality of bit-planes. Further, for each of the plurality of bit-planes, the image decoding engine 440 may determine at least one query-plane. As used herein, the query-plane may include a two-dimensional array of positions corresponding to a plurality of coefficient bits of the bit-plane. Furthermore, for each of the plurality of bit-planes, the image decoding engine 440 may decode the bit plane based on the at least one query-plane. Moreover, the image decoding engine 440 may perform an inverse quantization, an inverse transform for each code block and, further generate reconstructed image data after the inverse transform.

The engines in the processing device 112 may be connected to or communicated with each other via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth, a ZigBee, a Near Field Communication (NFC), or the like, or any combination thereof. Two or more of the engines may be combined into a single engine, and any one of the engines may be divided into two or more modules. For example, the processing device 112 may also include an image scaling engine (not shown) which may be configured to scale the image data (e.g., the reconstructed image data) and an image post-processing engine which may be configured to perform a post-processing (e.g., a rendering, a fusion, a clipping, a binarization, an enhancement) on the reconstructed image data. As another example, the image pre-processing engine 420 may be integrated into the image coding engine 430. As a further example, the image pre-processing engine 420 may be unnecessary.

Figure 5:
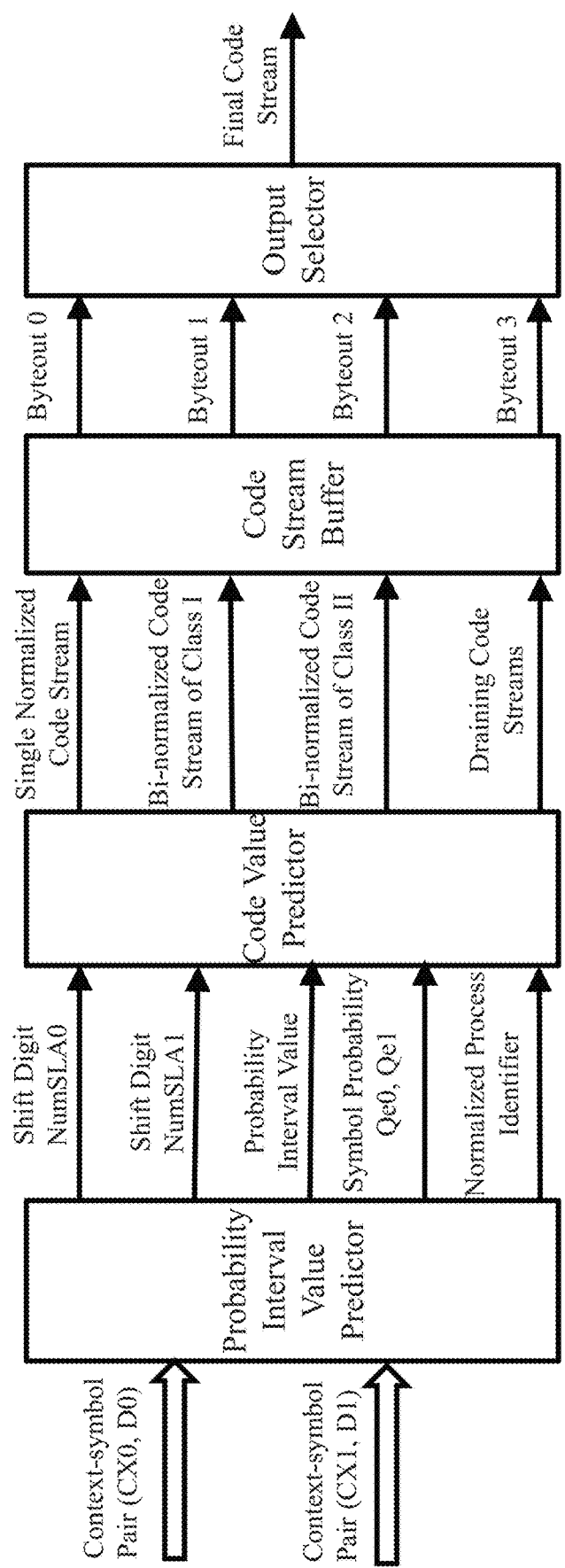
FIG. 5 is a schematic diagram illustrating an exemplary MQ-coder in the prior art.

FIG. 5 is a schematic diagram illustrating an exemplary MQ-coder in the prior art. As illustrated in FIG. 5, a structure of the MQ-coder may include a probability interval value predictor, a code value predictor, a code stream buffer, and an output selector.

The probability interval value predictor may receive two context-decision pairs, determine symbol types to be coded (e.g., a more probable symbol (MPS), a less probable symbol (NLPS)) based on the two context-decision pairs, and update a probability interval value of each of the two context-decision pairs. The code value predictor may update a code value of each of the two context-decision pairs based on the symbol types and output three types of normalized code streams and a draining code stream. The code stream buffer and output selector may complete a final code stream output in sequence. It can be seen that core modules of the MQ-coder in the prior art are the probability interval value predictor and the code value predictor.

Figure 6:
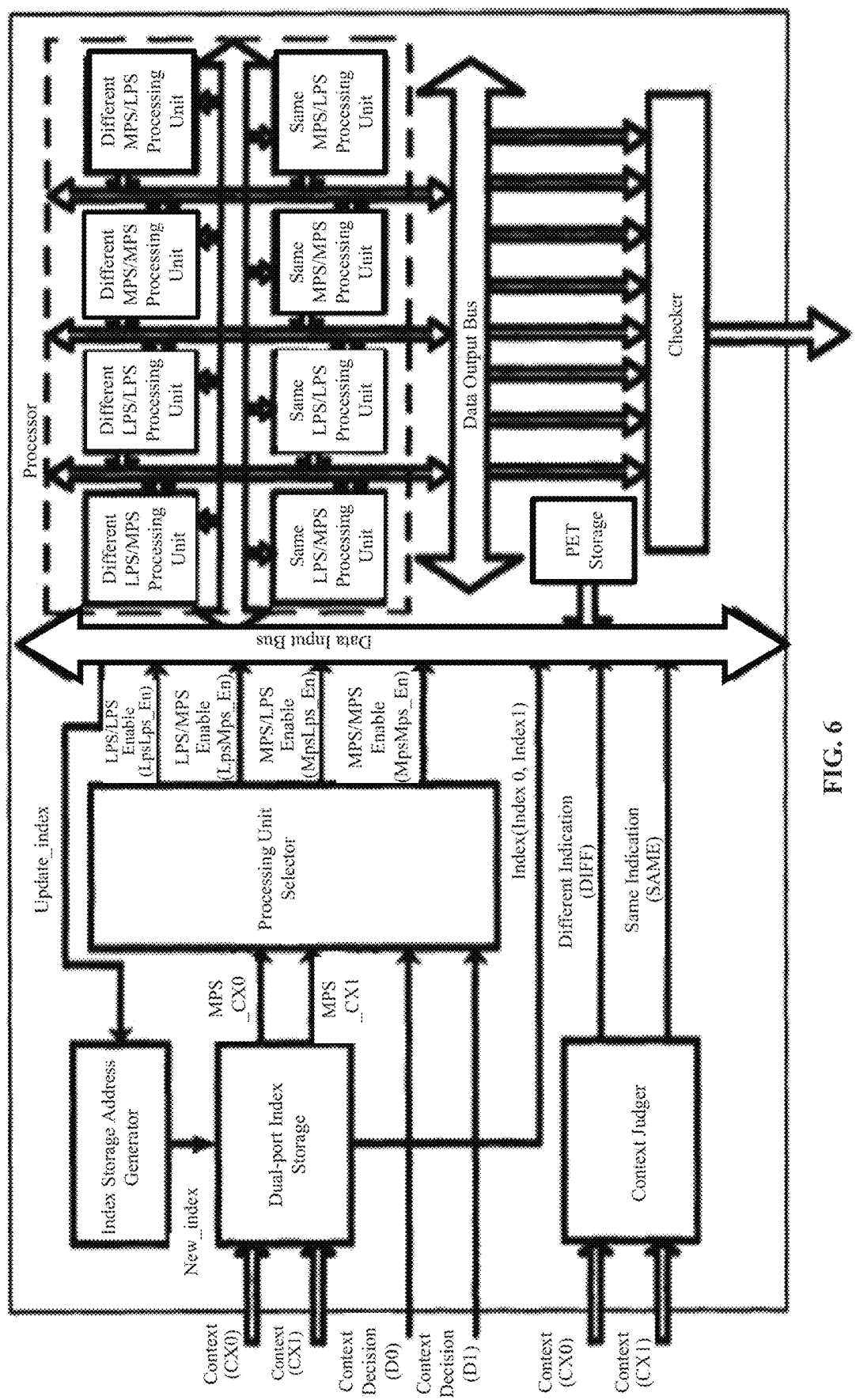
FIG. 6 is a schematic diagram illustrating an exemplary probability interval value predictor of an MQ-coder in the prior art.

FIG. 6 is a schematic diagram illustrating an exemplary probability interval value predictor of the MQ-coder in the prior art. As illustrated in FIG. 6, the probability interval value predictor may obtain a probability determination signal, an indication signal, and an index pair based on the two context-decision pairs. Then the probability interval value predictor may further perform eight different probability calculation processes by using internal processing units in the probability interval value predictor, wherein each of the eight different probability calculation processes includes a probability interval value calculation, a shift digit calculation of a code value, and a normalization enablement.

Figure 7:
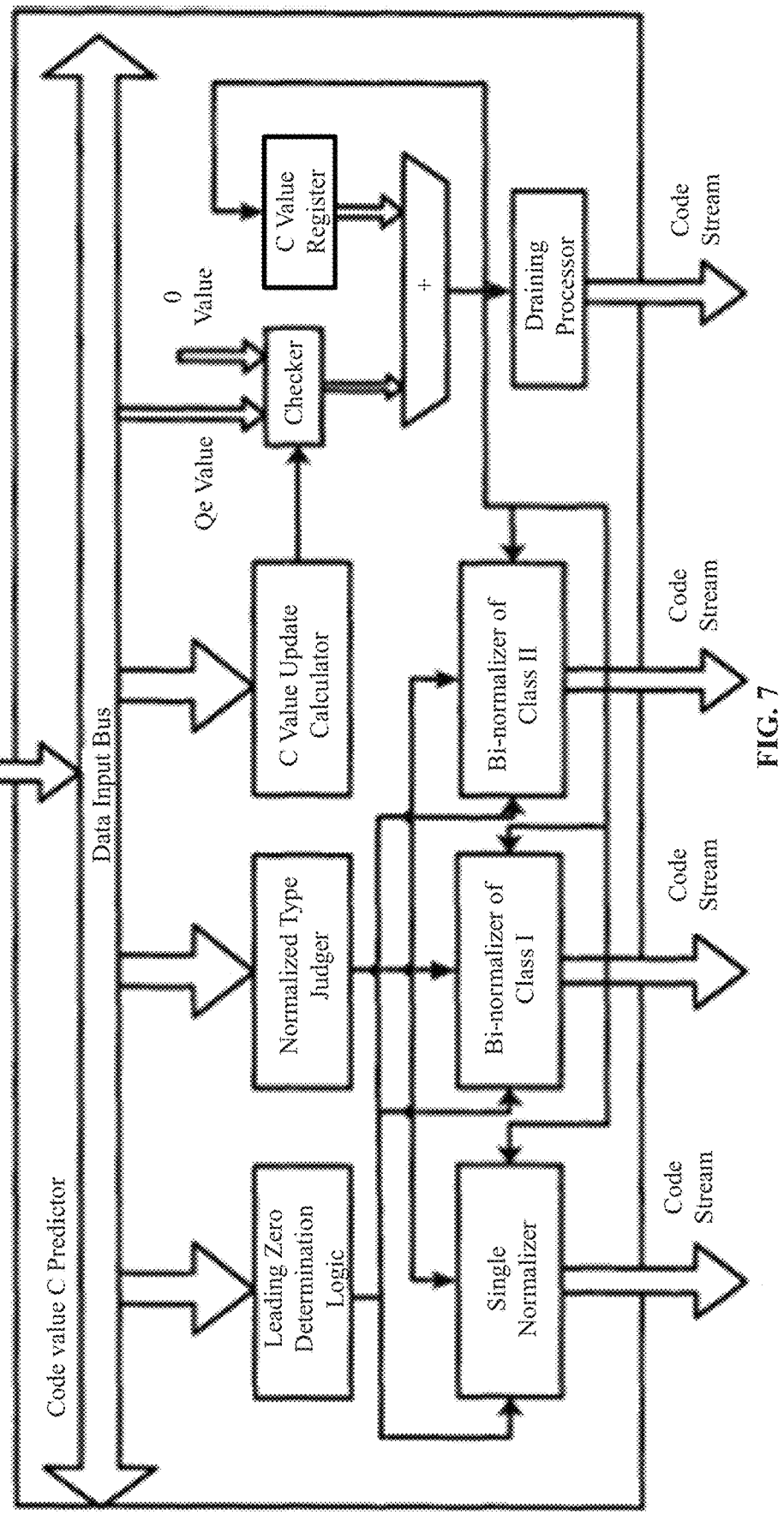
FIG. 7 is a schematic diagram illustrating an exemplary code value predictor of an MQ-coder in the prior art.

FIG. 7 is a schematic diagram illustrating an exemplary code value predictor of the MQ-coder in the prior art. As illustrated in FIG. 7, the code value predictor may determine a normalization type and then select a corresponding normalizer based on the normalization type. Further, the code value predictor may output a normalized code stream. After the coding process of the two context-decision pairs, a draining processor may output valid code streams remaining in a code value register.

As illustrated in FIGS. 5-7, the MQ-coder in the prior art performs the calculation of the probability interval value and the shift digit of the code value using eight different processing units, each of which completes a corresponding processing. In addition, the code value predictor uses three normalizers, each of which completes a corresponding normalization operation. Further, four code stream buffers are required. That is, the MQ-coder in the prior art has many parallel structures, which may result in that a plurality of hardware resources may be consumed and implementation cost of a chip thereof may be relatively high.

Figure 8:
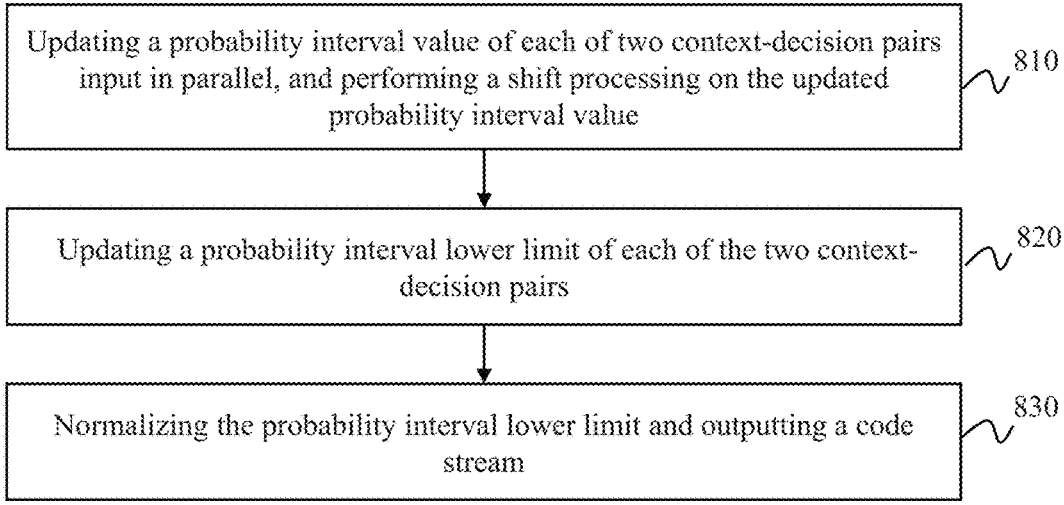
FIG. 8 is a flowchart illustrating an exemplary process for arithmetic entropy coding according to some embodiments of the present disclosure.

FIG. 8 is a flowchart illustrating an exemplary process for arithmetic entropy coding according to some embodiments of the present disclosure. In some embodiments, the process 800 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 800. The operations of the illustrated process presented below are intended to be illustrative. In some embodiments, the process 800 may be accomplished with one or more additional operations not described, and/or without one or more of the operations discussed. Additionally, the order in which the operations of the process 800 as illustrated in FIG. 8 and described below is not intended to be limiting.

In 810, a probability interval value of each of two context-decision pairs (e.g., a first context-decision pair, a second context-decision pair) may be updated, wherein the two context-decision pairs may be input in parallel. In some embodiments, each of the two context-decision pairs may include a context and a decision corresponding to the context. For example, the first context-decision pair includes a first context and a first decision; the second context-decision pair includes a second context and a second decision. As described in connection with FIG. 4, the context and the decision may be output data of a bit-plane coding. In some embodiments, the context may be expressed as a numeral within 0~18, the decision may be 0 or 1, and the probability interval value of the context-decision pair may refer to an interval (e.g., [0.75, 1.5]) that the context-decision pair corresponds to.

In some embodiments, for each of the two context-decision pairs, to update the probability interval value of the context-decision pair, an initial probability interval value (also referred to as a "previous probability interval value") of the context-decision pair may be obtained and the initial probability interval value may be updated. Specifically, at least one first coding-related parameter (also referred to as "first coding parameter") of the first context-decision pair and at least one second coding-related parameter (also referred to as "second coding parameter") of the second context-decision pair may be determined respectively. The at least one first coding-related parameter may include a first context probability (Qe0), a first next less probable symbol (NLPS) index, a first next more probable symbol (NMPS) index, a first more probable symbol (MPS) index, a first interval switch flag (switch), a first count of leading zeros (LZs), or the like, or a combination thereof. The at least one second coding-related parameter may include a second context probability (Qe1), a second next less probable symbol (NLPS) index, a second next more probable symbol (NMPS) index, a second more probable symbol (MPS) index, a second interval switch flag (switch), a second count of leading zeros (LZs), or the like, or a combination thereof. Further, a first initial probability interval value of the first context-decision pair and a second initial probability interval value of the second context-decision pair may be updated based on the at least one first coding-related parameter and the at least one second coding-related parameter respectively.

In some embodiments, to determine the at least one first coding-related parameter and the at least one second coding-related parameter, whether the first context is equal to the second context may be determined. In response to a determination that the first context is not equal to the second context, the at least one first coding-related parameter and the at least one second coding-related parameter may be obtained from a pre-stored lookup table (e.g., a LUT illustrated in FIG. 9) respectively. In response to a determination that the first context is equal to the second context, the at least one first coding-related parameter of the first context-decision pair may be obtained from the pre-stored lookup table. Further, the at least one second coding-related parameter of the second context-decision pair may be obtained from a pre-stored probability estimation table (e.g., a PET illustrated in FIG. 9) based on the first NLPS index or the first LAMPS index of the first context-decision pair. Specifically, whether the first MPS index of the first context-decision pair is equal to the first decision may be determined. In response to a determination that the first MPS index is equal to the first decision, the at least one second coding-related parameter of the second context-decision pair may be obtained from the pre-stored probability estimation table by using the first LAMPS index of the first context-decision pair as an index. In response to a determination that the first MPS index is not equal to the first decision, the at least one second coding-related parameter of the second context-decision pair may be obtained from the pre-stored probability estimation table by using the first NLPS index of the first context-decision pair as an index. More descriptions regarding a determination of the at least one coding-related parameter may be found elsewhere in the present disclosure (e.g., FIG. 9, FIG. 10, and the descriptions thereof).

In some embodiments, after the at least one first coding-related parameter and the at least one second coding-related parameter are obtained, the first initial probability interval value of the first context-decision pair and the second initial probability interval value of the second context-decision pair may be updated based on the at least one first coding-related parameter and the at least one second coding-related parameter respectively.

Specifically, for the first context-decision pair, a first updated probability interval value may be obtained by updating the first initial probability interval value of the first context-decision pair based on the first decision, the first MPS index, and the first context probability. Then a first normalized probability interval value may be obtained by normalizing the first updated probability interval value. For the second context-decision pair, a second updated probability interval value may be obtained by updating the second initial probability interval value (which is designated to be the first normalized probability interval value) of the second context-decision pair based on the second decision, the second MPS index, and the second context probability. More descriptions regarding updating the initial probability interval value may be found elsewhere in the present disclosure (e.g., FIG. 12A, FIG. 12B, and the descriptions thereof).

In some embodiments, a first shift processing may be further performed on the first updated probability interval value of the first context-decision pair and a second shift processing may be performed on the second updated probability interval value of the second context-decision pair respectively. As used herein, the shift processing may be used as a normalization operation for normalizing the updated probability interval value. Specifically, a first shift digit of the first context-decision pair and a second shift digit of the second context-decision pair may be determined respectively. Further, a first shift processing may be performed on the first updated probability interval value and a second shift processing may be performed on the second updated probability interval value respectively based on the first shift digit and the second shift digit. More descriptions regarding the shift processing may be found elsewhere in the present disclosure (e.g., FIGS. 13-16B and the descriptions thereof).

In 820, a probability interval lower limit of each of the two context-decision pairs may be updated. As used herein, the probability interval lower limit may refer to the smallest value of a probability interval value. For example, the probability interval value may be [0.75, 1.5], a probability interval lower limit thereof may be 0.75.

In some embodiments, for the first context-decision pair, a first updated probability interval lower limit may be determined based on a first indication signal of an update mode for updating a first initial probability interval lower limit (also referred to as a "previous probability interval lower limit") of the first context-decision pair. As used herein, an indication signal may be obtained in a process (e.g., process 1210, process 1220) for updating the probability interval value update. Then a first normalized probability interval lower limit of the first context-decision pair may be obtained by normalizing the first updated probability interval lower limit. For the second context-decision pair, a second updated probability interval lower limit may be determined based on the first normalized probability interval lower limit. The second updated probability interval lower limit may be determined based on a second indication signal of an update mode for updating a second initial probability interval lower limit (which is designated to be the first normalized probability interval lower limit) of the second context-decision pair. More descriptions regarding updating the probability interval lower limit may be found elsewhere in the present disclosure (e.g., FIG. 17, FIG. 19, and the descriptions thereof).

In 830, the updated probability interval lower limit may be normalized and a code stream may be output. In some embodiments, for the first context-decision pair, the first updated probability interval lower limit may be normalized and the first normalized probability interval lower limit may be obtained. Specifically, the first updated probability interval lower limit may be normalized based on the first shift digit of the first context-decision pair and a first normalized shift identifier of the first context-decision pair. As used herein, a normalized shift identifier may be obtained in a shift processing (e.g., process 1410, process 1610) performed on the updated probability interval value. Further, a first code stream may be output. For the second context-decision pair, the second updated probability interval lower limit may be normalized and a second normalized probability interval lower limit of the second context-decision pair may be obtained. Specifically, the second updated probability interval lower limit may be normalized based on the second shift digit of the second context-decision pair and a second normalized shift identifier of the second context-decision pair. Further, a second code stream may be output. More descriptions regarding normalizing the updated probability interval lower limit and outputting the code stream may be found elsewhere in the present disclosure (e.g., FIG. 18, FIG. 20, and the descriptions thereof).

In some embodiments, the process 800 may further include an operation for updating the first MPS index of the first context-decision pair and the second MPS index of the second context-decision pair. The first updated MPS index of the first context-decision pair and the second updated MPS index of the second context-decision pair may be maintained into the lookup table. More descriptions regarding updating an MPS index may be found elsewhere in the present disclosure (e.g., FIG. 11 and the description thereof).

It should be noted that the above description of the process 800 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, one or more other optional operations (e.g., a storing operation) may be added elsewhere in the process 800. In the storing operation, information and/or data (e.g., the updated probability interval value, the updated probability interval lower limit, the code stream) associated with the arithmetic entropy coding may be stored in a storage device (e.g., the storage device 150) disclosed elsewhere in the present disclosure.

Figure 9:
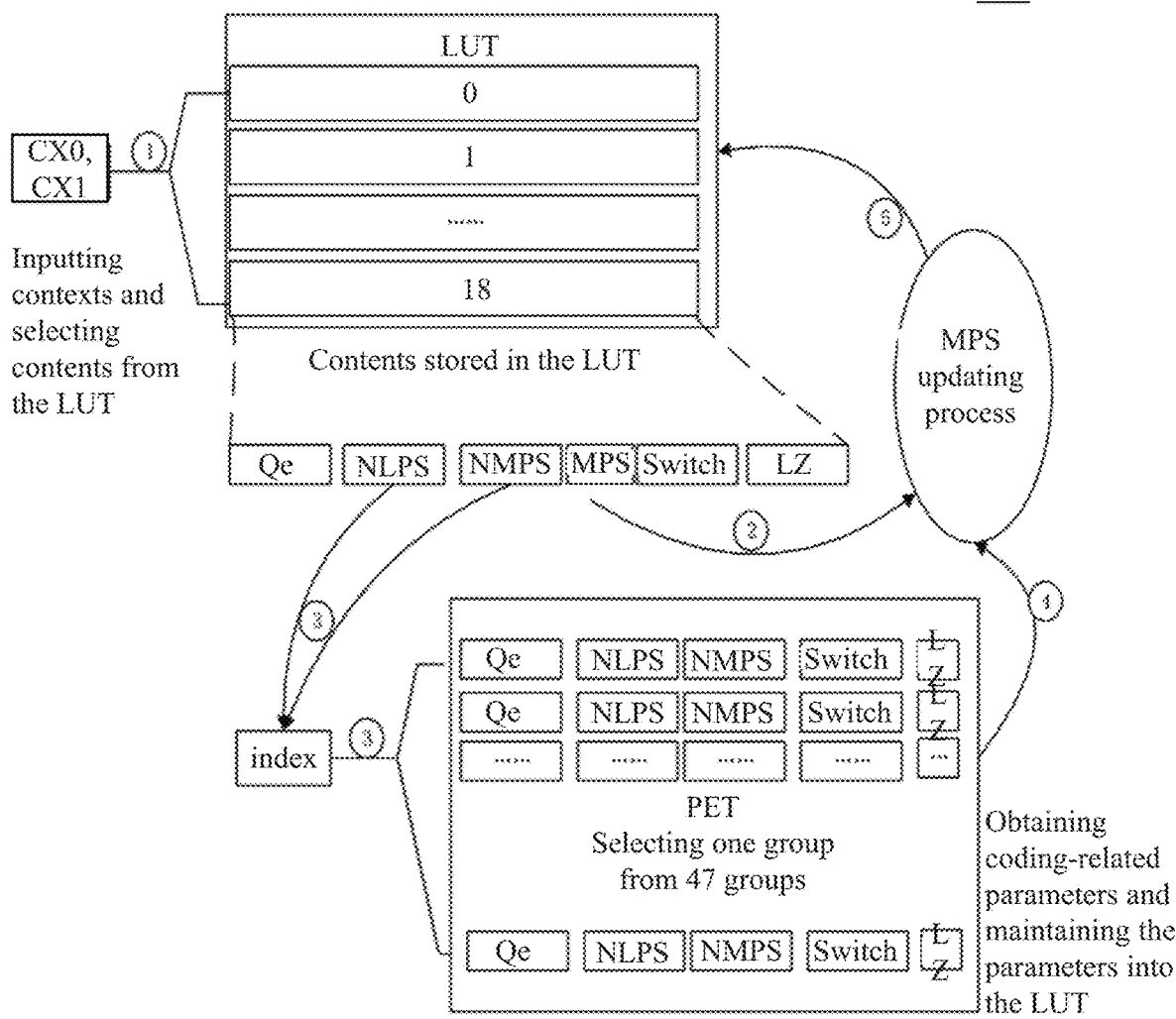
FIG. 9 is a schematic diagram illustrating an exemplary process for obtaining at least one coding-related parameters from a pre-stored lookup table according to some embodiments of the present disclosure.

FIG. 9 is a schematic diagram illustrating an exemplary process for obtaining at least one coding-related parameter from a pre-stored lookup table according to some embodiments of the present disclosure. In some embodiments, the process 900 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 900. The operations of the illustrated process presented below are intended to be illustrative. In some embodiments, the process 900 may be accomplished with one or more additional operations not described, and/or without one or more of the operations discussed. Additionally, the order in which the operations of the process 900 as illustrated in FIG. 9 and described below is not intended to be limiting.

As illustrated in FIG. 9, a pre-stored lookup table (i.e., a LUT) and a pre-stored probability estimation table (i.e., a PET) may be used to obtain the at least one first coding-related parameter and the at least one second coding-related parameter. In some embodiments, the LUT may be implemented on a register and may be obtained by combining a probability lookup table and an index lookup table used in the prior art. Specifically, as described in connection with FIG. 8, the LUT stores 19 sets of coding-related parameters and each of the 19 sets corresponds to a context type (which can be expressed as a numeral within 0~18). In some embodiments, the PET may be obtained based on a traditional PET in JPEG 2000. Specifically, the PET may be obtained by adding "a count of LZs" into the traditional PET which only includes Qe, NLPS index, NMPS index, and Switch. In some embodiments, the PET stores 47 sets of coding-related parameters and each of the 47 sets corresponds to an index type.

In some embodiments, the first context-decision pair and the second context-decision pair may be input in parallel. If the first context is not equal to the second context, at least one first coding-related parameter of the first context-decision pair and at least one second coding-related parameter of the second context-decision pair may be obtained respectively from the LUT. If the first context is equal to the second context, the at least one first coding-related parameter of the first context-decision pair may be obtained from the LUT. Further, the first MPS index in the at least one first coding-related parameter may be compared with the first decision. According to a comparison result, the first NLPS index (when the first MPS index is not equal to the first decision) or the first NMPS index (when the first MPS index is equal to the first decision) may be determined as an index used for obtaining the at least one second coding-related parameter of the second context-decision pair from the PET.

In some embodiments, the at least one first coding-related parameter and the at least one second coding-related parameter may be used in a further process (e.g., a process for updating a probability interval value, a shift processing of an updated probability interval value) and at least one first updated coding-related parameter and at least one second updated coding-related parameter may be generated in the further process. In some embodiments, the at least one first updated coding-related parameter and the at least one second updated coding-related parameter may be maintained into the LUT (e.g., the 19 sets of coding-related parameters) for a next cycle.

Specifically, as indicated in branch 1, the first context-decision pair and the second context-decision pair may be received. If the first context (CX0) is not equal to the second context (CX1) (i.e., CX0!=CX1), the at least one first coding-related parameter and the at least one second coding-related parameter may be obtained respectively. Further, as indicated in branch 2, the first MPS index in the at least one first coding-related parameter and the second MPS index in the at least one second coding-related parameter may be updated respectively. More descriptions regarding updating an MPS index may be found elsewhere in the present disclosure (e.g., FIG. 11 and the description thereof). Additionally, other than the first MPS index and the second MPS index, other first coding-related parameter(s) and other second coding-related parameter(s) also may be updated respectively. For example, for the first context-decision pair, the first NLPS index (when the first MPS index is not equal to the first decision) or the first NMPS index (when the first MPS index is equal to the first decision) may be used as an index to obtain at least one first updated coding-related parameter other than the first updated MPS index from the PET. Similarly, for the second context-decision pair, the second NLPS index (when the second MPS index is not equal to the second decision) or the second NMPS index (when the second MPS index is equal to the second decision) may be used as an index to obtain at least one second updated coding-related parameter other than the second updated MPS index from the PET. Further, as indicated in branch 5, the at least one first updated coding-related parameter and the at least one second updated coding-related parameter may be maintained into the LUT.

If the first context is equal to the second context (i.e., CX0=CX1), the first context may be processed firstly, that is, only the at least one first coding-related parameter may be obtained from the LUT. Further, as indicated in branch 2, the first MPS index may be updated and may be designated as the second MPS index corresponding to the second context. Further, as indicated in branch 3, the first NLPS index (when the first MPS index is not equal to the first decision) or the first NMPS index (when the first MPS index is equal to the first decision) may be used as an index to look up the PET to obtain the at least one second coding-related parameter other than the second MPS index. Similar to the above, it also can be considered as a process for updating the at least one first coding-related parameter. That is, the at least one first updated coding-related parameter can be designated as the at least one second coding-related parameter. As indicated in branch 4, the second MPS index (which is designated to be the first updated MPS index) may be updated. Similar to the above, the second NLPS index (when the second MPS index is not equal to the second decision) or the second NMPS index (when the second MPS index is equal to the second decision) may be used as an index to obtain at least one second updated coding-related parameter other than the second updated MPS index from the PET. Further, as indicated in branch 5, the at least one second updated coding-relating parameter may be maintained into the LUT.

According to the process 900, the at least one first coding-related parameter and the at least one second coding-related parameter can be obtained substantially at the same time, that is, the coding-related parameters of two contexts can be obtained through a single process which takes only a single clock; whereas, in JPEG 2000, the coding-related parameters of two contexts are obtained through two single processes, each of which takes at least 10 clocks. According to the present disclosure, the processing efficiency can be improved and the processing time can be reduced.

Figure 10:
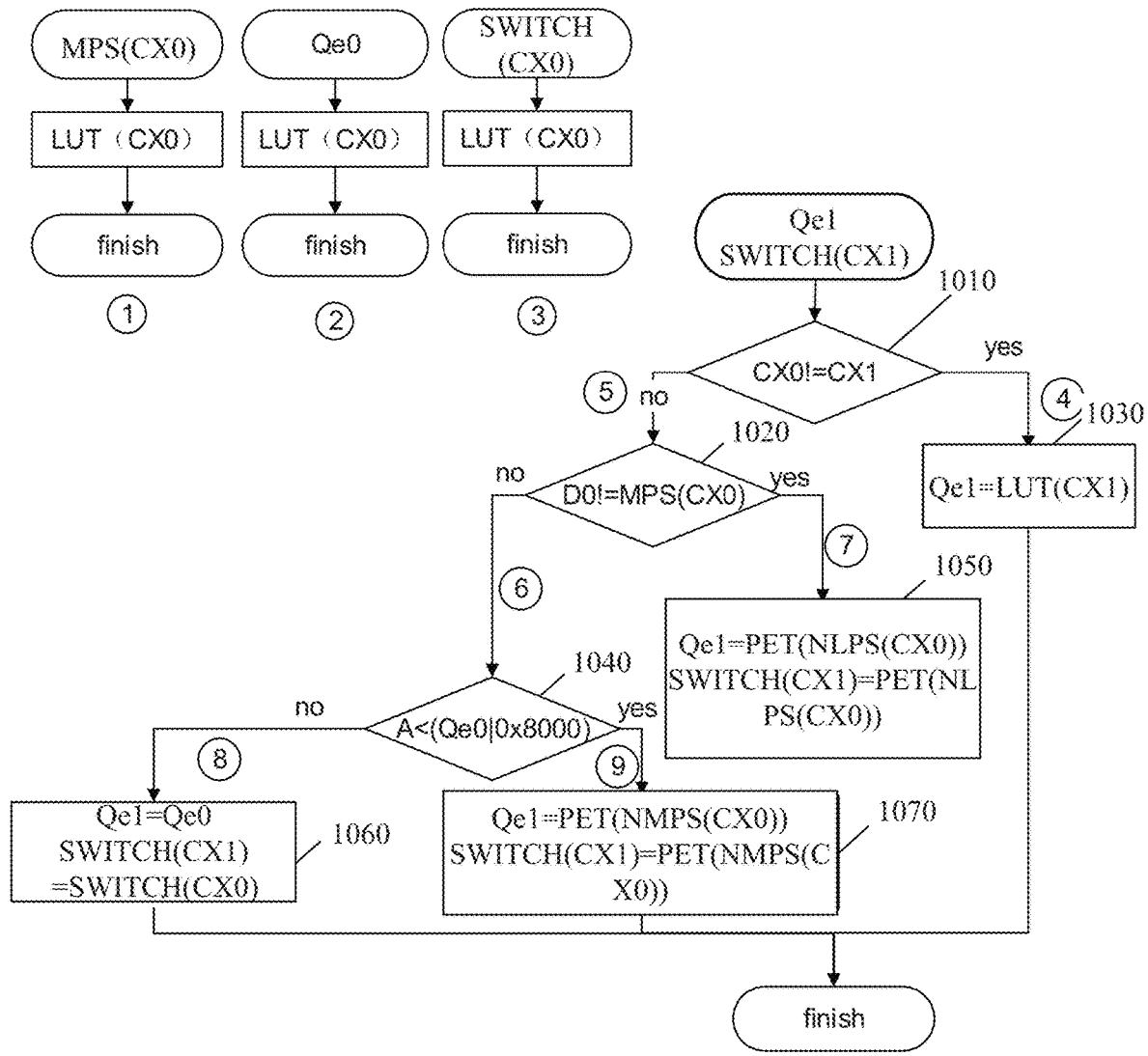
FIG. 10 is a flowchart illustrating an exemplary process for obtaining at least one coding-related parameters according to some embodiments of the present disclosure.

FIG. 10 is a flowchart illustrating an exemplary process for obtaining at least one coding-related parameter according to some embodiments of the present disclosure. In some embodiments, the process 1000 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1000. The operations of the illustrated process presented below are intended to be illustrative. In some embodiments, the process 1000 may be accomplished with one or more additional operations not described, and/or without one or more of the operations discussed. Additionally, the order in which the operations of the process 1000 as illustrated in FIG. 10 and described below is not intended to be limiting.

As illustrated in FIG. 10, a first MPS index (MPS(CX0)), a first context probability (Qe0), and a first switch (switch (CX0)) of a first context (CX0) may be obtained by looking up the LUT through branch 1, branch 2, and branch 3 respectively.

In 1010, whether the first context is not equal to a second context (i.e., CX0!=CX1) may be determined.

As indicated in branch 4, in response to a determination that the first context is not equal to the second context, in 1030, a second context probability (Qe1) of the second context may be obtained by looking up the LUT.

In 1020, whether a first decision corresponding to the first context is not equal to the first MPS index (i.e., D0!=MPS (CX0)) may be determined.

As indicated in branch 7 (which indicates an LPS coding process for the first context), in response to a determination that the first decision is not equal to the first MPS index, in 1050, a second context probability (Qe1) and a second switch (switch (CX1)) of the second context may be obtained by looking up the PET with a first NLPS index (NLPS (CX0) of the first context as an index.

As indicated in branch 6 (which indicates an MPS coding process for the first context), in response to a determination that the first decision is equal to the first MPS index, in 1040, whether a first initial probability interval value is less than an OR operation result of the first context probability and a predetermined value (i.e., A<(Qe0|0x8000)) may be determined. In the present disclosure, the OR operation is introduced, which requires a relatively small computation than a subtraction operation (i.e., A−Qe0<0x8000) used in JPEG 2000.

As indicated in branch 8, in response to a determination that the first initial probability interval value is not less than the OR operation result of the first context probability and the predetermined value, in 1060, the second context probability may be determined to be equal to the first context probability (i.e., Qe1=Qe0) and the second switch may be determined to be equal to the first switch (i.e., switch(CX1)=switch(CX0)), which may indicate that it is not needed to update the first initial probability interval value of the first context after the MPS coding process for the first context.

As indicated in branch 9, in response to a determination that the first initial probability is less than the OR operation result of the first context probability and the predetermined value, in 1070, the second context probability (Qe1) and the second switch (switch (CX1) of the second context may be obtained by looking up the PET with a first LAMPS index as an index, which indicates that it is needed to update the first LAMPS index after the MPS coding process for the first context and the second context probability can be obtained by looking up the PET with the first updated LAMPS index as an index.

It should be noted that the above description of the process 1000 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 11:
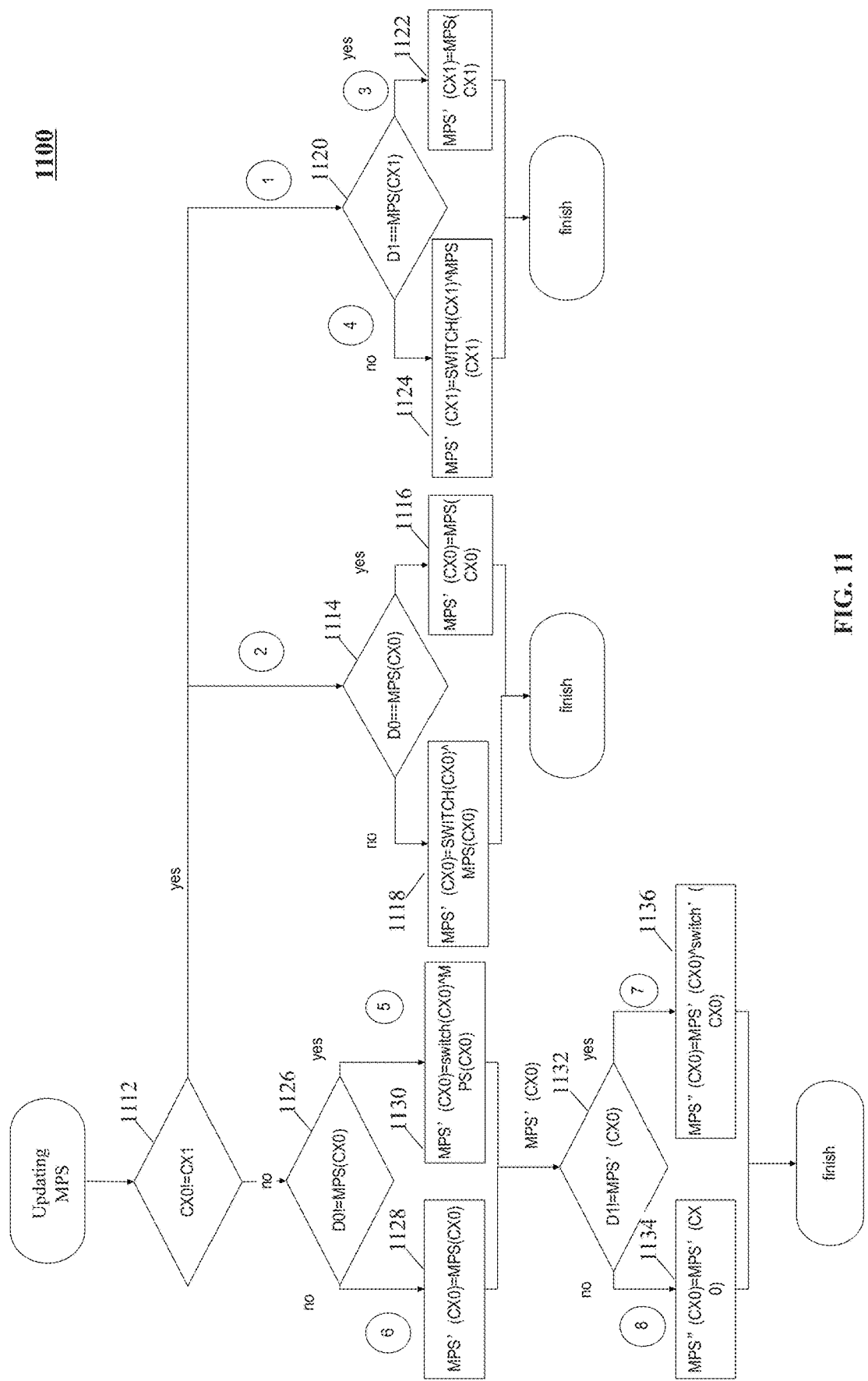
FIG. 11 is a flowchart illustrating an exemplary process for updating a more probable symbol index according to some embodiments of the present disclosure.

FIG. 11 is a flowchart illustrating an exemplary process for updating an MPS index according to some embodiments of the present disclosure. In some embodiments, the process 1100 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1100. The operations of the illustrated process presented below are intended to be illustrative. In some embodiments, the process 1100 may be accomplished with one or more additional operations not described, and/or without one or more of the operations discussed. Additionally, the order in which the operations of the process 1100 as illustrated in FIG. 11 and described below is not intended to be limiting.

In 1112, whether the first context is not equal to the second context (i.e., CX0!=CX1) may be determined. In response to a determination that the first context is not equal to the second context, as indicated in branch 1, a first updated MPS index (MPS'(CX0)) may be determined; as indicated in branch 2, a second updated MPS index (MPS'(CX1)) may be determined.

In 1114, whether the first decision is equal to the first MPS index (i.e., D0==MPS (CX0)) may be determined. In response to a determination that the first decision is equal to the first MPS index, in 1116, the first updated MPS index may be determined to be equal to the first MPS index (i.e., MPS'(CX0)=MPS(CX0)). In response to a determination that the first decision is not equal to the first MPS index, in 1118, the first updated MPS index may be determined based on the first MPS index and the first switch (e.g., MPS'(CX0)=SWITCH(CX0)^MPS(CX0)).

In 1120, whether the second decision is equal to the second MPS index (i.e., D1==MPS (CX1)) may be determined. In response to a determination that the second decision is equal to the second MPS index, in 1122, the second updated MPS index may be determined to be equal to the second MPS index (i.e., MPS'(CX1)=MPS(CX1)). In response to a determination that the second decision is not equal to the second MPS index, in 1124, the second updated MPS index may be determined based on the second MPS index and the second switch (e.g., MPS'(CX1)=SWITCH (CX1)^MPS(CX1)).

In response to a determination that the first context is equal to the second context, in 1126, whether the first decision is not equal to the first MPS index (i.e., D0!=MPS (CX0)) may be determined. In response to a determination that the first decision is equal to the first MPS index, in 1128, the first updated MPS index may be determined to be equal to the first MPS index (i.e., MPS'(CX0)=MPS(CX0)). In response to a determination that the first decision is not equal to the first MPS index, in 1130, the first updated MPS index may be determined based on the first MPS index and the first switch (e.g., MPS'(CX0)=SWITCH(CX0)^MPS(CX0)).

In 1132, whether the second decision is not equal to the first updated MPS index (i.e., D1!=MPS'(CX0)) may be determined. In response to a determination that the second decision is equal to the first updated MPS index, in 1134, a third updated MPS index (i.e., the second updated MPS index) may be determined to be equal to the first updated MPS index (i.e., MPS"(CX0)=MPS'(CX0)). In response to a determination that the second decision is not equal to the first updated MPS index, in 1136, the third updated MPS index (i.e., the second updated MPS index) may be determined based on the first updated MPS index and a first updated switch (e.g., MPS"(CX0)=MPS'(CX0)^SWITCH' (CX0)).

It should be noted that the above description of the process 1100 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 12A:
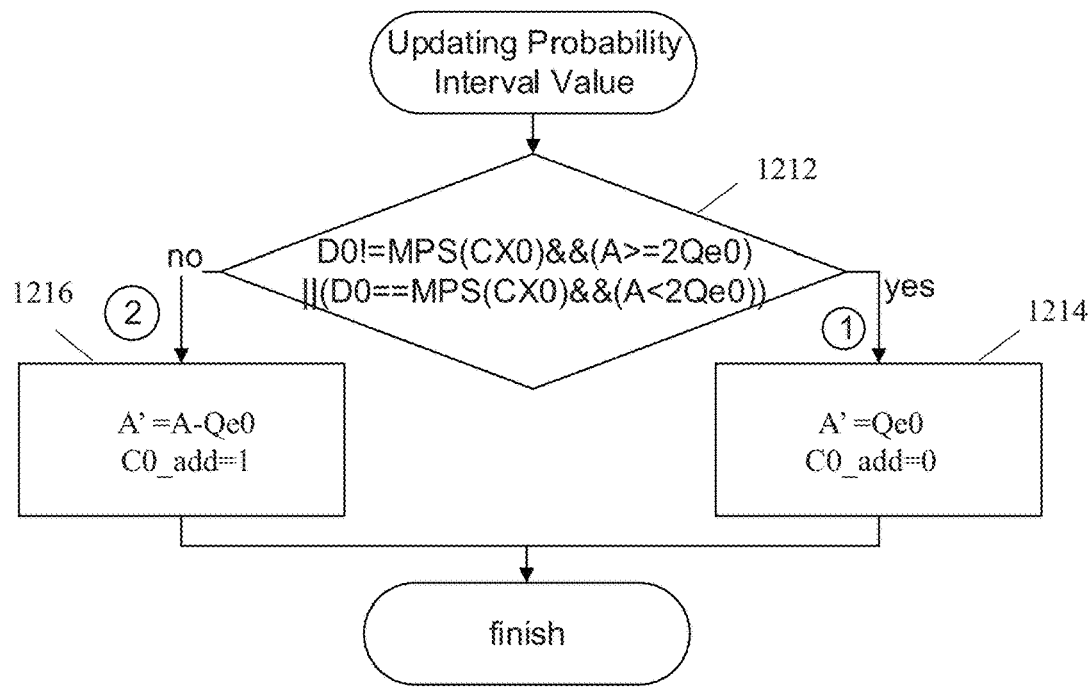
FIG. 12A is a flowchart illustrating an exemplary process for updating a first initial probability interval value of a first context according to some embodiments of the present disclosure.

FIG. 12A is a flowchart illustrating an exemplary process for updating a first initial probability interval value of a first context according to some embodiments of the present disclosure. In some embodiments, the process 1210 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1210. The operations of the illustrated process presented below are intended to be illustrative. In some embodiments, the process 1210 may be accomplished with one or more additional operations not described, and/or without one or more of the operations discussed. Additionally, the order in which the operations of the process 1210 as illustrated in FIG. 12A and described below are not intended to be limiting.

In 1212, whether the first decision, the first MPS index, the first context probability, and a first initial probability interval value (A) satisfy a first preset condition may be determined. For example, the first preset condition may be "D0!=MPS(CX0)&&(A>=2Qe0)||D0==MPS(CX0)&& (A<2Qe0)" which refers to that the first decision is not equal to the first MPS index and the first initial probability interval value is larger than or equal to twice of the first context probability, or the first decision is equal to the first MPS index and the first initial probability interval value is less than twice of the first context probability.

As indicated in branch 1, in response to a determination that the first decision, the first MPS index, the first context probability, and the first initial probability interval value satisfy the first preset condition, in 1214, a first updated probability interval value (A') may be determined to be equal to the first context probability (i.e., A'=Qe0). Further, a first indication signal (C0_add) of an update mode for updating the first initial probability interval lower limit may be determined as 0 (i.e., C0_add=0).

As indicated in branch 2, in response to a determination that the first decision, the first MPS index, the first context probability, and the first initial probability interval value do satisfy the first preset condition, in 1216, the first updated probability interval value may be determined to be equal to a difference between the first initial probability interval value and the first context probability (i.e., A'=A−Qe0). Further, the first indication signal of the update mode for updating the first initial probability interval lower limit may be determined as 1 (i.e., C0_add=1).

Figure 12B:
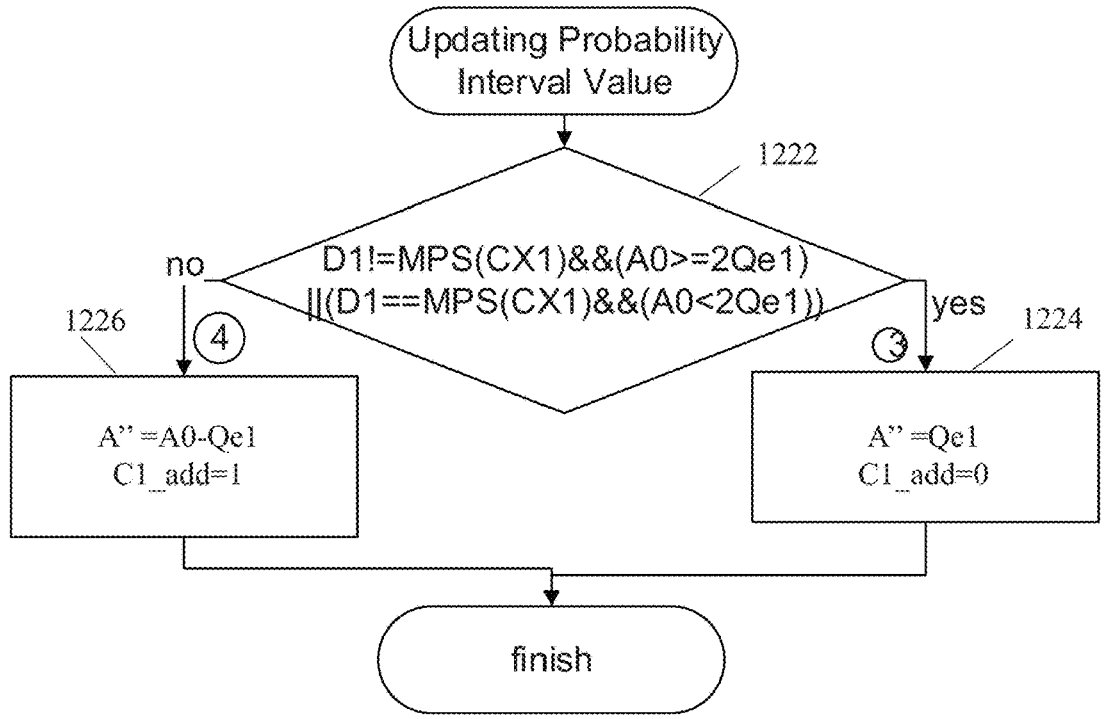
FIG. 12B is a flowchart illustrating an exemplary process for updating a second initial probability interval value of a second context according to some embodiments of the present disclosure.

FIG. 12B is a flowchart illustrating an exemplary process for updating a second initial probability interval value of a second context according to some embodiments of the present disclosure. In some embodiments, the process 1220 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1220. The operations of the illustrated process presented below are intended to be illustrative. In some embodiments, the process 1220 may be accomplished with one or more additional operations not described, and/or without one or more of the operations discussed. Additionally, the order in which the operations of the process 1220 as illustrated in FIG. 12B and described below are not intended to be limiting.

In 1222, whether the second decision, the second MPS index, the second context probability, and a second initial probability interval value (which is designated to be a first normalized probability interval value (A0) (more descriptions may be found in FIG. 14A and FIG. 14B) satisfy a second preset condition may be determined. For example, the second preset condition may be "D1!=MPS(CX1)&&(A0>=2Qe1)||D1==MPS(CX1)&&(A0<2Qe1)" which refers to that the second decision is not equal to the second MPS index and the second initial probability interval value is larger than or equal to twice of the second context probability, or the second decision is equal to the second MPS index and the second initial probability interval value is less than twice of the second context probability.

As indicated in branch 3, in response to a determination that the second decision, the second MPS index, the second context probability, and the second initial probability interval value satisfy the second preset condition, in 1224, a second updated probability interval value (A") may be determined to be equal to the second context probability (i.e., A"=Qe1). Further, a second indication signal (C1_add) of an update mode for updating the second initial probability interval lower limit may be determined as 0 (i.e., C1_add=0).

As indicated in branch 4, in response to a determination that the second decision, the second MPS index, the second context probability, and the second initial probability interval value do not satisfy the second preset condition, in 1226, the second updated probability interval value may be determined to be equal to a difference between the second initial probability interval value and the second context probability (i.e., A"=A0-Qe1). Further, the second indication signal of the update mode for updating the second initial probability interval lower limit may be determined as 1 (i.e., C1_add=1).

According to the process 1210 and the process 1220, traditional processes in JPEG 2000 for updating an initial probability interval value may be simplified by introducing into a determination condition. According to the determination condition, the first updated probability interval value of the first context and the second updated probability interval value of the second context can be obtained directly, thereby improving the coding efficiency.

It should be noted that the above descriptions of the process 1210 and the process 1220 are merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 13:
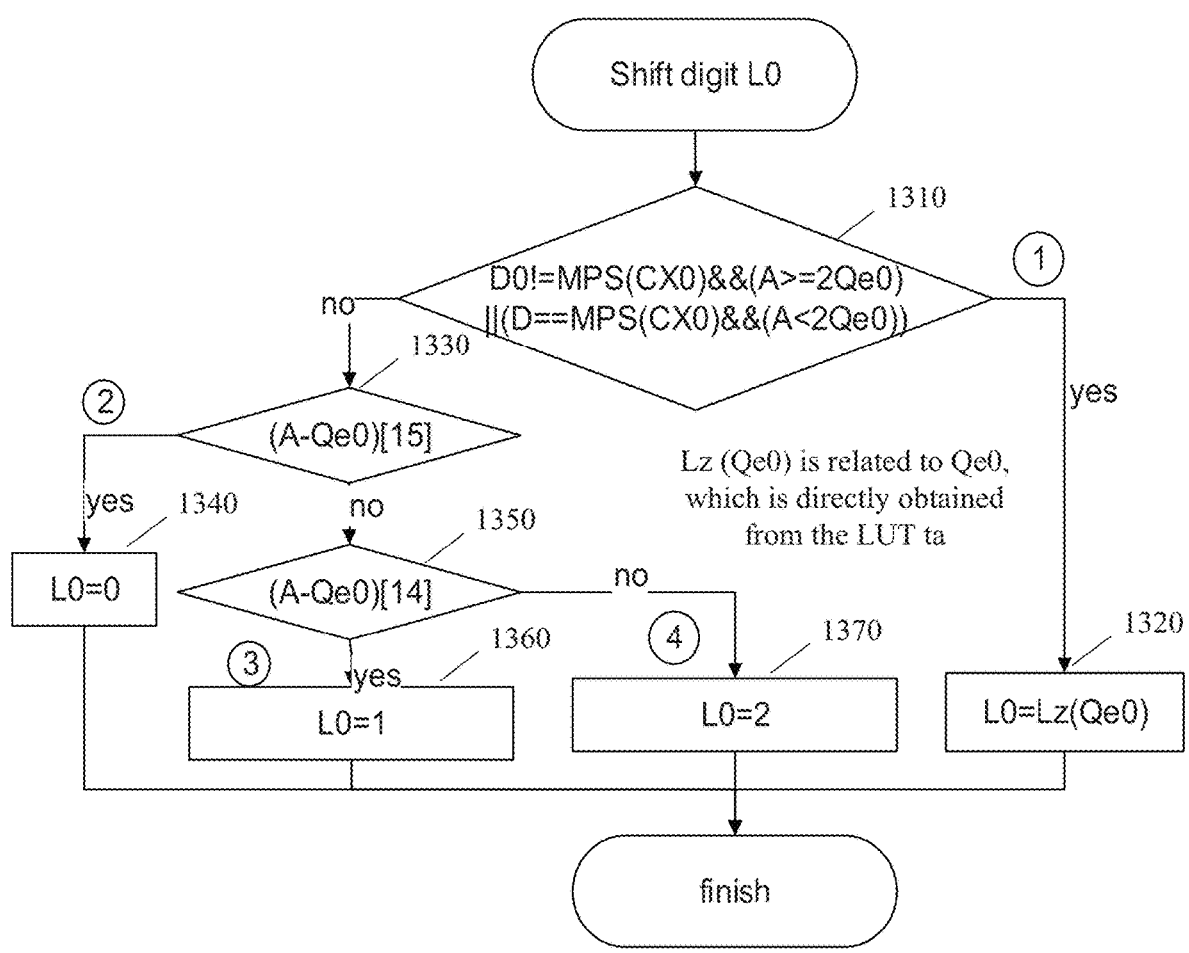
FIG. 13 is a flowchart illustrating an exemplary process for determining a first shift digit according to some embodiments of the present disclosure.

FIG. 13 is a flowchart illustrating an exemplary process for determining a first shift digit according to some embodiments of the present disclosure. In some embodiments, the process 1300 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1300. The operations of the illustrated process presented below are intended to be illustrative. In some embodiments, the process 1300 may be accomplished with one or more additional operations not described, and/or without one or more of the operations discussed. Additionally, the order in which the operations of the process 1300 as illustrated in FIG. 13 and described below is not intended to be limiting.

In 1310, whether the first decision, the first MPS index, the first context probability, and the first initial probability interval value satisfy the first preset condition (i.e., D0!=MPS(CX0)&&(A>=2Qe0)||D0==MPS(CX0)&&(A<2Qe0) illustrated in FIG. 12A) may be determined.

As described in connection with FIG. 12A, in response to a determination that the first decision, the first MPS index, the first context probability, and the first initial probability interval value satisfy the first preset condition, the first updated probability interval value may be determined to be equal to the first context probability (i.e., A'=Qe0). Accordingly, as indicated in branch 1, in 1320, the first shift digit (L0) may be determined as the first count of LZs of the first context probability (i.e., L0=LZ(Qe0)).

As described in connection with FIG. 12A, in response to a determination that the first decision, the first MPS index, the first context probability, and the first initial probability interval value do not satisfy the first preset condition, the first updated probability interval value may be determined to be equal to a difference between the first initial probability interval value and the first context probability (i.e., A'=A−Qe0). Accordingly, in 1330, whether the highest bit of the first updated probability interval value is equal to 1 (i.e., (A−Qe0)[15]) may be determined.

As indicated in branch 2, in response to a determination that the highest bit of the first updated probability interval value is equal to 1, in 1340, the first shift digit may be determined as 0 (i.e., L0=0).

In response to a determination that the highest bit of the first updated probability interval value is not equal to 1, in 1350, whether the second highest bit of the first updated probability interval value is equal to 1 (i.e., (A−Qe0)[14]) may be determined.

As indicated in branch 3, in response to a determination that the second highest bit of the first updated probability interval value is equal to 1, in 1360, the first shift digit may be determined as 1 (i.e., L0=1).

As indicated in branch 4, in response to a determination that the second highest bit of the first updated probability interval value is not equal to 1, in 1370, the first shift digit may be determined as 2 (i.e., L0=2).

It should be noted that the above description of the process 1300 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 14A:
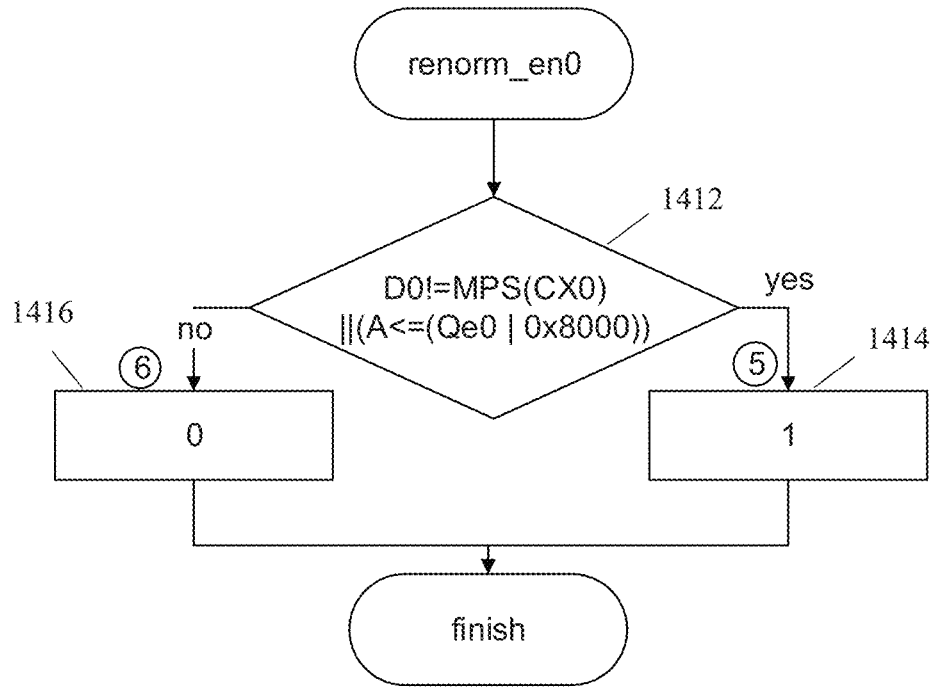
FIG. 14A is a flowchart illustrating an exemplary process for determining a first normalized shift identifier according to some embodiments of the present disclosure.

FIG. 14A is a flowchart illustrating an exemplary process for determining a first normalized shift identifier according to some embodiments of the present disclosure. In some embodiments, the process 1410 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1410. The operations of the illustrated process presented below are intended to be illustrative. In some embodiments, the process 1410 may be accomplished with one or more additional operations not described, and/or without one or more of the operations discussed. Additionally, the order in which the operations of the process 1410 as illustrated in FIG. 14A and described below are not intended to be limiting.

In 1412, whether the first decision, the first MPS index, the first initial probability interval value, and the first context probability satisfy a third preset condition may be determined. For example, the third preset condition may be "D0!=MPS(CX0)||A<=(Qe0|0x8000)" which refers to that the first decision is not equal to the first MPS context, or the first initial probability interval value is less than or equal to an OR operation result of the first context probability and the predetermined value (e.g., 0x8000).

As indicated in branch 5, in response to a determination that the first decision, the first MPS index, the first initial probability interval value, and the first context probability satisfy the third preset condition, in 1414, a first normalized shift identifier (renorm_en0) may be determined as 1. As used herein, the first normalized shift identifier may be used to determine whether it is needed to perform a shift processing on the first updated probability interval value. Additionally or alternatively, the first normalized shift identifier may also be used to determine whether it is needed to perform a normalization on a first updated probability interval lower limit (C') (more descriptions may be found in FIG. 18).

As indicated in branch 6, in response to a determination that the first decision, the first MPS index, the first initial probability interval value, and the first context probability do not satisfy the third preset condition, in 1416, the first normalized shift identifier may be determined as 0.

Figure 14B:
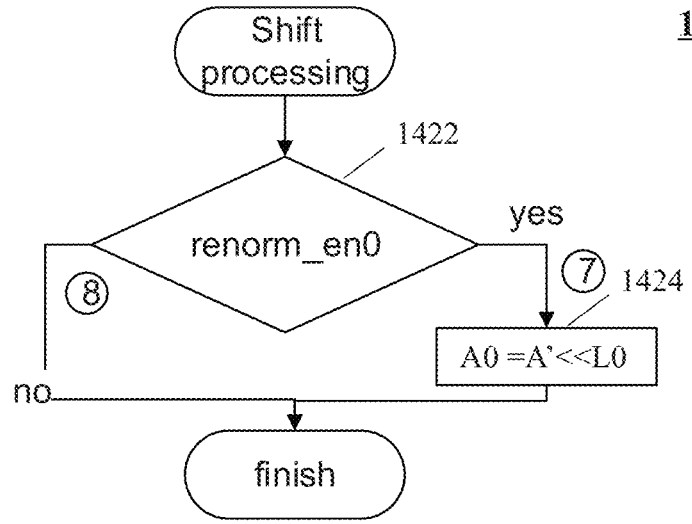
FIG. 14B is a flowchart illustrating an exemplary process for performing a first shift processing on a first updated probability interval value according to some embodiments of the present disclosure.

FIG. 14B is a flowchart illustrating an exemplary process for performing a first shift processing on a first updated probability interval value according to some embodiments of the present disclosure. In some embodiments, the first shift processing may be used to achieve a normalization operation on the first updated probability interval value. In some embodiments, the process 1420 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1420. The operations of the illustrated process presented below are intended to be illustrative. In some embodiments, the process 1420 may be accomplished with one or more additional operations not described, and/or without one or more of the operations discussed. Additionally, the order in which the operations of the process 1420 as illustrated in FIG. 14B, and described below are not intended to be limiting.

In 1422, whether the first normalized shift identifier is 1 may be determined.

As indicated in branch 8, in response to a determination that the first normalized shift identifier is not 1, the first shift processing on the first updated probability interval value may be canceled.

As indicated in branch 7, in response to a determination that the first normalized shift identifier is 1, in 1424, a first left-shift processing may be performed on the first updated probability interval value based on the first shift digit (i.e., A0=A'<<L0). Accordingly, a first normalized probability interval value (A0) may be obtained.

In the present disclosure, a shift digit may be determined and a normalized probability interval value may be obtained by directly performing a left-shift processing on the updated probability interval value based on the shift digit; whereas, in JPEG 2000, a normalized probability interval value may be obtained by performing a left-shift processing on the updated probability interval value bit by bit until a normalized probability interval value is not less than 0x8000. According to the present disclosure, a coding efficiency can be improved.

It should be noted that the above descriptions of the process 1410 and the process 1420 are merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 15:
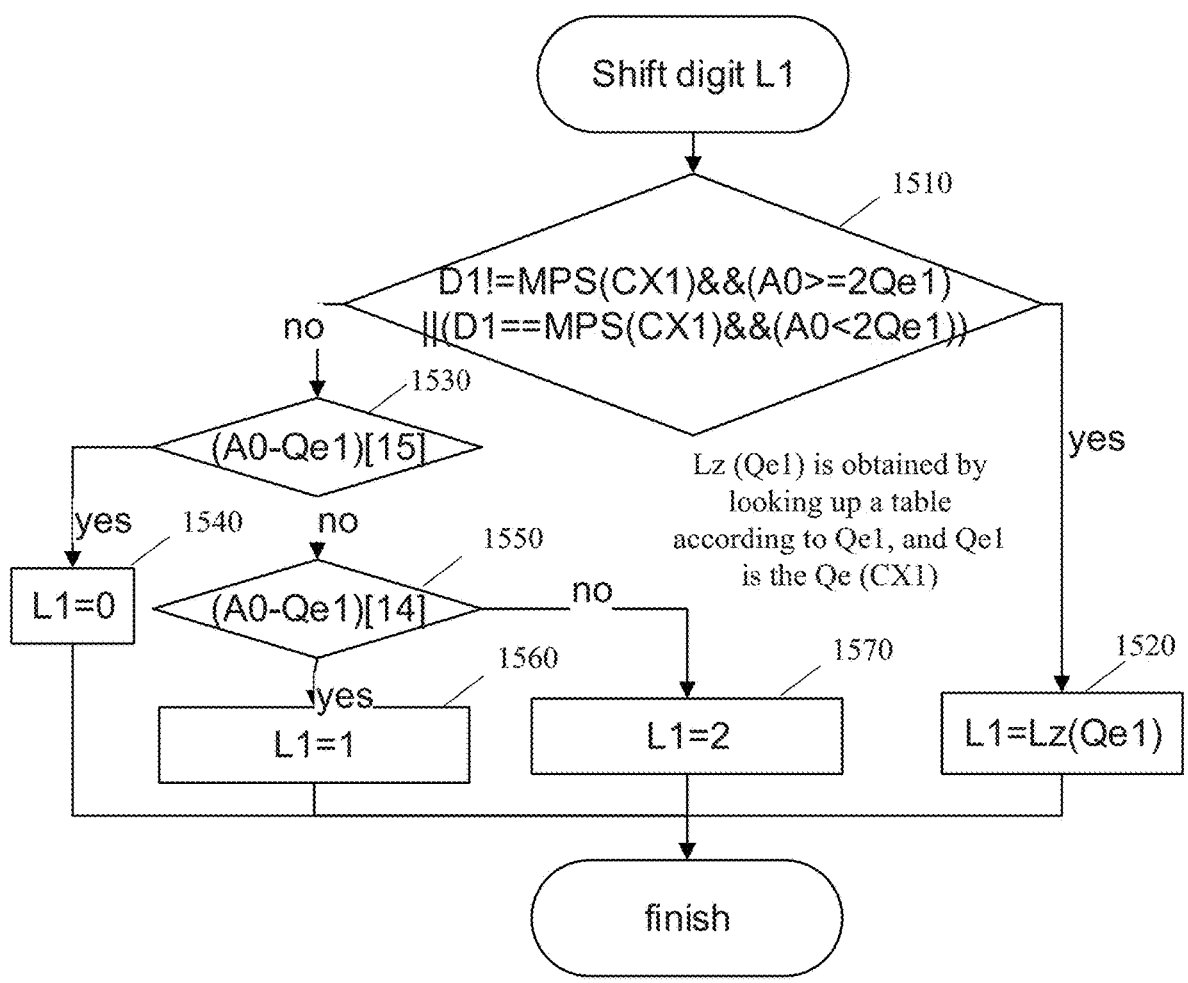
FIG. 15 is a flowchart illustrating an exemplary process for determining a second shift digit according to some embodiments of the present disclosure.

FIG. 15 is a flowchart illustrating an exemplary process for determining a second shift digit according to some embodiments of the present disclosure. In some embodiments, the process 1500 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1500. The operations of the illustrated process presented below are intended to be illustrative. In some embodiments, the process 1500 may be accomplished with one or more additional operations not described, and/or without one or more of the operations discussed. Additionally, the order in which the operations of the process 1500 as illustrated in FIG. 15 and described below is not intended to be limiting.

In 1510, whether the second decision, the second MPS index, the second context probability, and the second initial probability interval value (which is designated to be the first normalized probability interval value) satisfy the second preset condition (i.e., D1!=MPS(CX1)&&(A0>=2Qe1) ||D1==MPS(CX1)&&(A0<2Qe1)) illustrated in FIG. 12B) may be determined.

As described in connection with FIG. 12B, in response to a determination that the second decision, the second MPS index, the second context probability, and the second initial probability interval value satisfy the second preset condition, the second updated probability interval value may be determined to be equal to the second context probability (i.e., A"=Qe1). Accordingly, in 1520, the second shift digit (L1) may be determined as the second count of LZs of the second context probability (i.e., L1=LZ(Qe1)).

As described in connection with FIG. 12B, in response to a determination that the second decision, the second MPS index, the second context probability, and the second initial probability interval value do not satisfy the second preset condition, the second updated probability interval value may be determined to be equal to a difference between the second initial probability interval value and the second context probability (i.e., A"=A0−Qe1). Accordingly, in 1530, whether the highest bit of the second updated probability interval value is equal to 1 (i.e., (A0−Qe1)[15]) may be determined.

In response to a determination that the highest bit of the second updated probability interval value is equal to 1, in 1540, the second shift digit may be determined as 0 (i.e., L1=0).

In response to a determination that the highest bit of the first updated probability interval value is not equal to 1, in 1550, whether the second highest bit of the second updated probability interval value is equal to 1 (i.e., (A0–Qe1)[14]) may be determined.

In response to a determination that the second highest bit of the second updated probability interval value is equal to 1, in 1560, the second shift digit may be determined as 1 (i.e., L1=1).

In response to a determination that the second highest bit of the second updated probability interval value is not equal to 1, in 1570, the second shift digit may be determined as 2 (i.e., L1=2).

It should be noted that the above description of the process 1500 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 16A:
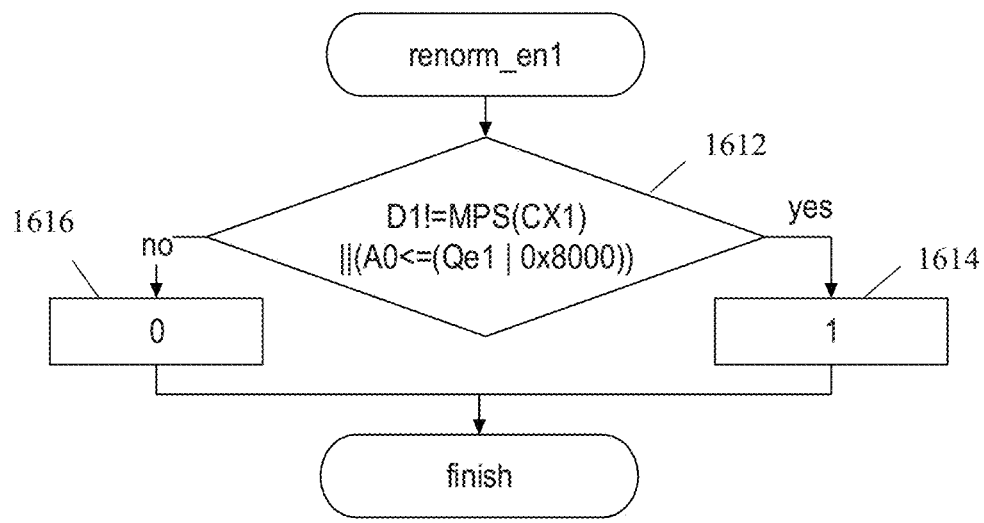
FIG. 16A is a flowchart illustrating an exemplary process for determining a second normalized shift identifier according to some embodiments of the present disclosure.

FIG. 16A is a flowchart illustrating an exemplary process for determining a second normalized shift identifier according to some embodiments of the present disclosure. In some embodiments, the process 1610 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1610. The operations of the illustrated process presented below are intended to be illustrative. In some embodiments, the process 1610 may be accomplished with one or more additional operations not described, and/or without one or more of the operations discussed. Additionally, the order in which the operations of the process 1610 as illustrated in FIG. 16A and described below are not intended to be limiting.

In 1612, whether the second decision, the second MPS index, the second initial probability interval value, and the second context probability satisfy a fourth preset condition may be determined. For example, the fourth preset condition may be "D1!=MPS(CX1)||A0<=(Qe0|0x8000)" which refers to that the second decision is not equal to the second MPS context, or the second initial probability interval value is less than or equal to an OR operation result of the second context probability and the predetermined value (e.g., 0x8000).

In response to a determination that the second decision, the second MPS index, the second initial probability interval value, and the second context probability satisfy the fourth preset condition, in 1614, a second normalized shift identifier (renorm_en1) may be determined as 1. As used herein, the second normalized shift identifier may be used to determine whether it is needed to perform a shift processing on the second updated probability interval value. Additionally or alternatively, the second normalized shift identifier may also be used to determine whether it is needed to perform a normalization on the second updated probability interval lower limit (C") (more descriptions may be found in FIG. 20).

In response to a determination that the second decision, the second MPS index, the second initial probability interval value, and the second context probability do not satisfy the fourth preset condition, in 1616, the second normalized shift identifier may be determined as 0.

Figure 16B:
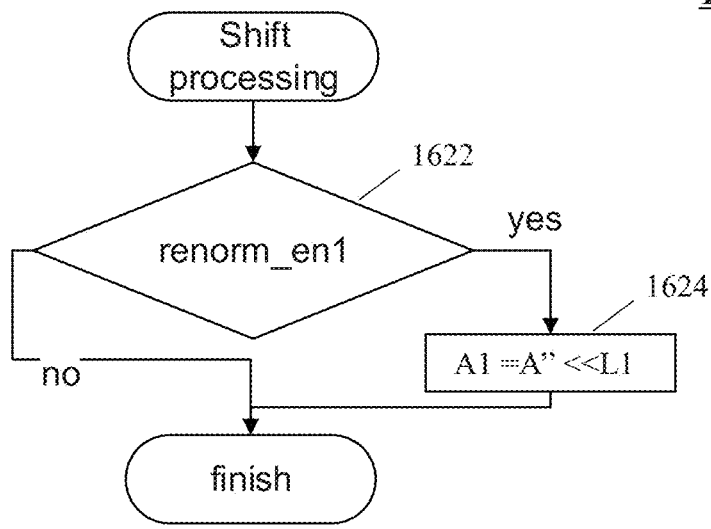
FIG. 16B is a flowchart illustrating an exemplary process for performing a second shift processing on a second updated probability interval value according to some embodiments of the present disclosure.

FIG. 16B is a flowchart illustrating an exemplary process for performing a second shift processing on a second updated probability interval value according to some embodiments of the present disclosure. In some embodiments, the second shift processing may be used to achieve a normalization process of the second updated probability interval value. In some embodiments, the process 1620 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1620. The operations of the illustrated process presented below are intended to be illustrative. In some embodiments, the process 1620 may be accomplished with one or more additional operations not described, and/or without one or more of the operations discussed. Additionally, the order in which the operations of the process 1620 as illustrated in FIG. 16B, and described below are not intended to be limiting.

In 1622, whether the second normalized shift identifier is 1 may be determined.

In response to a determination that the second normalized shift identifier is not 1, the second shift processing on the second updated probability interval value may be canceled.

In response to a determination that the second normalized shift identifier is 1, in 1624, a second left-shift processing may be performed on the second updated probability interval value based on the second shift digit L1 (i.e., A1=A"<<L1). Accordingly, a second normalized probability interval value (A1) may be obtained.

It should be noted that the above descriptions of the process 1610 and the process 1620 are merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 17:
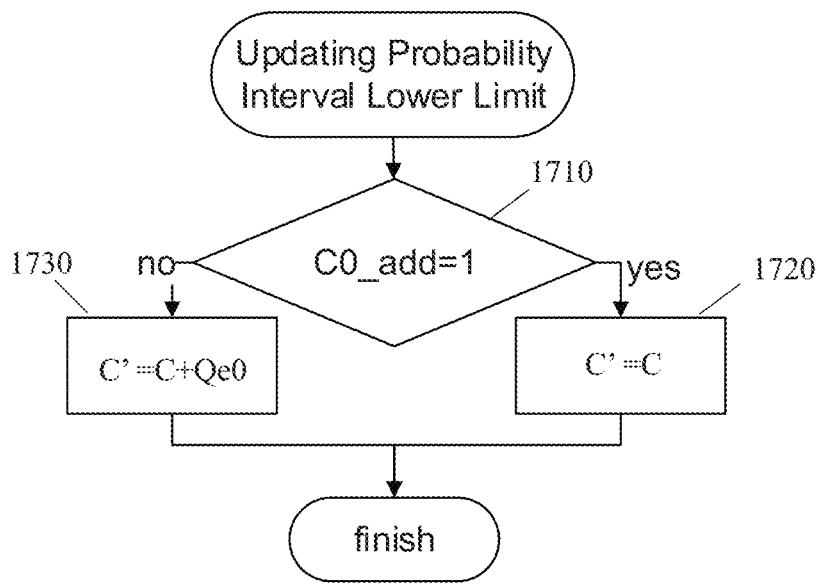
FIG. 17 is a flowchart illustrating an exemplary process for updating a first initial probability interval lower limit according to some embodiments of the present disclosure.

FIG. 17 is a flowchart illustrating an exemplary process for updating a first initial probability interval lower limit according to some embodiments of the present disclosure. In some embodiments, the process 1700 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1700. The operations of the illustrated process presented below are intended to be illustrative. In some embodiments, the process 1700 may be accomplished with one or more additional operations not described, and/or without one or more of the operations discussed. Additionally, the order in which the operations of the process 1700 as illustrated in FIG. 17 and described below is not intended to be limiting.

In 1710, whether the first indication signal (C0_add illustrated in FIG. 12A) of the update mode for updating the first initial probability interval lower limit is equal to 1 may be determined.

In response to a determination that the first indication signal is equal to 1, in 1720, a first updated probability interval lower limit may be determined to be equal to the first initial probability interval lower limit (i.e., C'=C).

In response to a determination that the first indication signal is not equal to 1, in 1730, the first updated probability interval lower limit may be determined as a sum of a first initial probability interval lower limit and the first context probability (i.e., C'=C+Qe).

It should be noted that the above description of the process 1700 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 18:
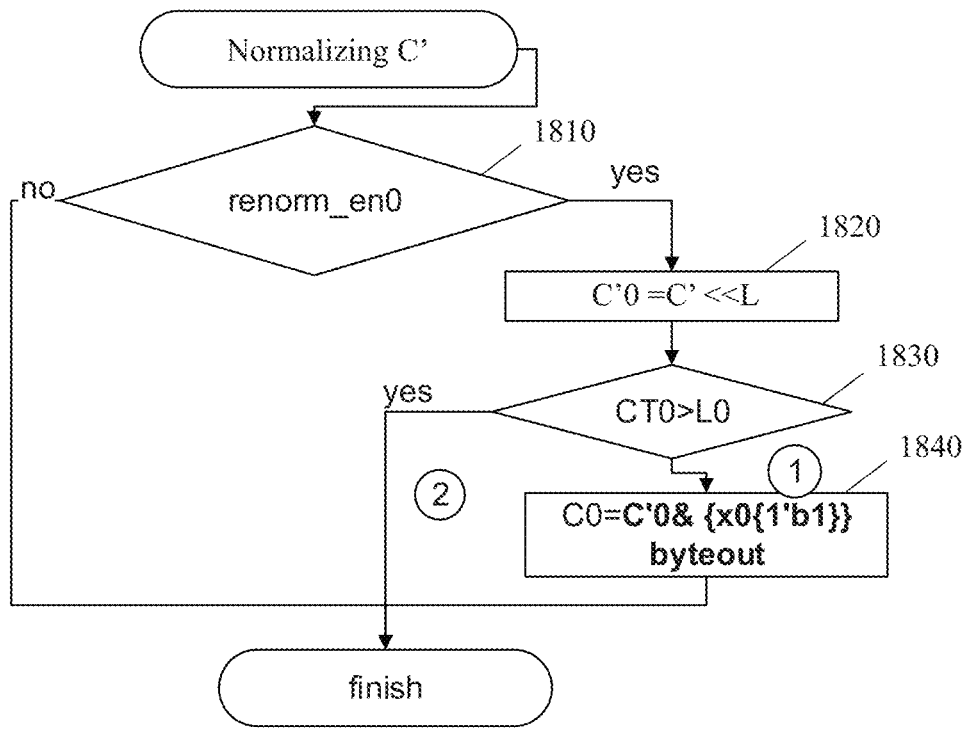
FIG. 18 is a flowchart illustrating an exemplary process for normalizing a first updated probability interval lower limit according to some embodiments of the present disclosure.

FIG. 18 is a flowchart illustrating an exemplary process for normalizing a first updated probability interval lower limit according to some embodiments of the present disclosure. In some embodiments, the process 1800 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1800. The operations of the illustrated process presented below are intended to be illustrative. In some embodiments, the process 1800 may be accomplished with one or more additional operations not described, and/or without one or more of the operations discussed. Additionally, the order in which the operations of the process 1800 as illustrated in FIG. 18 and described below is not intended to be limiting.

In 1810, whether the first normalized shift identifier (renorm_en0 illustrated in FIG. 14A) is equal to 1 may be determined.

In 1820, in response to a determination that the first normalized shift identifier is equal to 1, a first intermediate probability interval lower limit (C'0) may be determined by left-shifting the first updated probability interval lower limit by the first shift digit (L0 illustrated in FIG. 13) (i.e., C'0=C'<<L0).

In 1830, in response to a determination that the first normalized shift identifier is not equal to 1, whether a first count of bits to be output (CT0) in a register (e.g., a C-register illustrated in FIG. 21) corresponding to the first updated probability interval lower limit is larger than the first shift digit may be determined.

As indicated in branch 2, in response to a determination that the first count of bits to be output is larger than the first shift digit, there is no byte to be output. Further, the first count of bits to be output may be updated to be equal to a difference between the first count of bits to be output and the first shift digit (CT'0=CT0−L0).

As indicated in branch 1, in response to a determination that the first count of bits to be output is not larger than the first shift digit, in 1840, x0 (e.g., "27-m" illustrated in FIG. 21) bits starting from the lowest bit in the first intermediate probability interval lower limit may be retained and remainder bits may be zero cleared. Then the processed result may be determined as a result (i.e., the first normalized probability interval lower limit) of normalizing the first updated probability interval lower limit (i.e., C0=C'0&{x0{1'b1}}). At the same time, one or more bytes may be output, which may be written as a code stream to be output. Further, the first updated count of bits to be output may be determined based on a fill flag (more descriptions may be found in FIG. 21).

It should be noted that the above description of the process 1800 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 19:
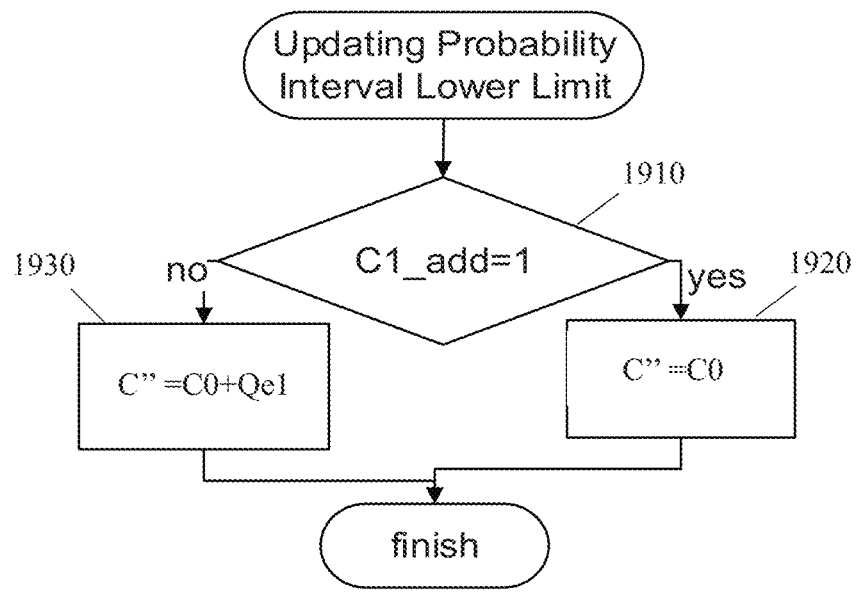
FIG. 19 is a flowchart illustrating an exemplary process for updating a second initial probability interval lower limit according to some embodiments of the present disclosure.

FIG. 19 is a flowchart illustrating an exemplary process for updating a second initial probability interval lower limit according to some embodiments of the present disclosure. In some embodiments, the process 1900 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 1900. The operations of the illustrated process presented below are intended to be illustrative. In some embodiments, the process 1900 may be accomplished with one or more additional operations not described, and/or without one or more of the operations discussed. Additionally, the order in which the operations of the process 1900 as illustrated in FIG. 19 and described below is not intended to be limiting.

In 1910, whether the second indication signal (C1_add illustrated in FIG. 12B) of the update mode for updating the second initial probability interval lower limit is equal to 1 may be determined.

In response to a determination that the second indication signal is equal to 1, in 1920, a second updated probability interval lower limit may be determined to be equal to the second initial probability interval lower limit (which is designated to be the first normalized probability interval lower limit) (i.e., C''=C0).

In response to a determination that the second indication signal is not equal to 1, in 1930, the second updated probability interval lower limit may be determined as a sum of the second initial probability interval lower limit and the second context probability (i.e., C''=C0+Qe1).

It should be noted that the above description of the process 1900 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figure 20:
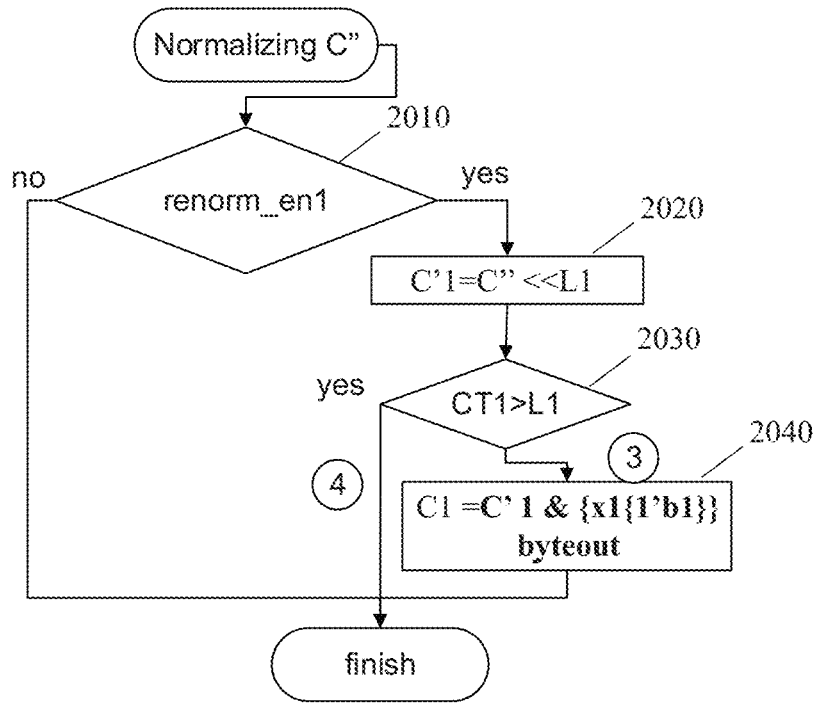
FIG. 20 is a flowchart illustrating an exemplary process for normalizing a second updated probability interval lower limit according to some embodiments of the present disclosure.

FIG. 20 is a flowchart illustrating an exemplary process for normalizing a second updated probability interval lower limit according to some embodiments of the present disclosure. In some embodiments, the process 2000 may be implemented as a set of instructions (e.g., an application) stored in the storage ROM 230 or RAM 240. The processor 220, the image coding engine 430, and/or modules in FIG. 22 may execute the set of instructions, and when executing the instructions, the processor 220, the image coding engine 430, and/or the modules may be configured to perform the process 2000. The operations of the illustrated process presented below are intended to be illustrative. In some embodiments, the process 2000 may be accomplished with one or more additional operations not described, and/or without one or more of the operations discussed. Additionally, the order in which the operations of the process 2000 as illustrated in FIG. 20 and described below is not intended to be limiting.

In 2010, whether the second normalized shift identifier (renorm_en1 illustrated in FIG. 16A) is equal to 1 may be determined.

In 2020, in response to a determination that the second normalized shift identifier is equal to 1, a second intermediate probability interval lower limit (C'1) may be determined by left-shifting the second updated probability interval lower limit by the second shift digit (L1 illustrated in FIG. 15) (i.e., C'1=C"<<L1).

In 2030, in response to a determination that the second normalized shift identifier is not equal to 1, whether a second count of bits to be output (CT1) in a register (e.g., a C-register illustrated in FIG. 21) corresponding to the second updated probability interval lower limit is larger than the second shift digit may be determined.

As indicated in branch 4, in response to a determination that the second count of bits to be output is larger than the second shift digit, there is no byte to be output. Further, the first count of bits to be output may be updated to be equal to a difference between the second count of bits to be output and the second shift digit (CT'1=CT1−L1).

As indicated in branch 3, in response to a determination that the second count of bits to be output is not larger than the second shift digit, in 2040, x1 (e.g., "27−m" illustrated in FIG. 21) bits starting from the lowest bit in the second intermediate probability interval lower limit may be retained and remainder bits may be zero cleared. Further, the processed result may be determined as a result (i.e., the second normalized probability interval lower limit) of normalizing the second updated probability interval lower limit (i.e., C1=C'1&{x1{1'b1}}). At the same time, one or more bytes may be output, which may be written as a code stream to be output. Further, the second updated count of bits to be output may be determined based on a fill flag (more descriptions may be found in FIG. 21).

It should be noted that the above description of the process 2000 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

Figures 21, 22:
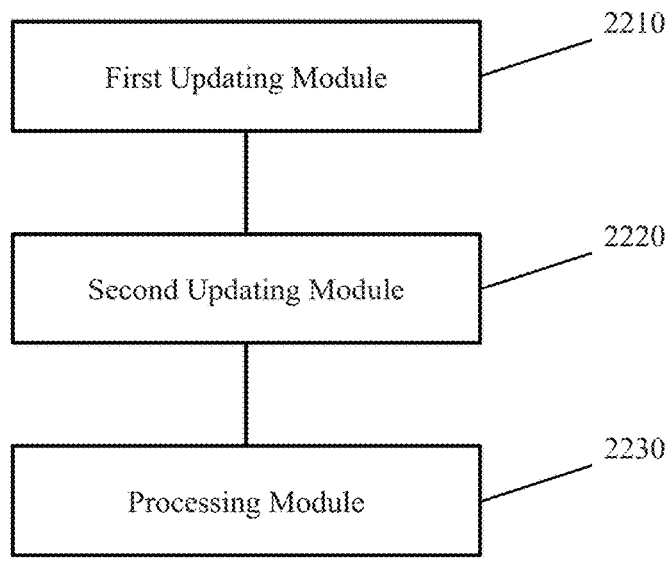
FIG. 21 is a schematic diagram illustrating an exemplary process for normalizing a first updated probability interval lower limit according to some embodiments of the present disclosure.
FIG. 22 is a block diagram illustrating an exemplary arithmetic entropy coding device according to some embodiments of the present disclosure.

FIG. 21 is a schematic diagram illustrating an exemplary process for normalizing an updated probability interval lower limit according to some embodiments of the present disclosure. As illustrated, C-register refers to a register through which a probability interval lower limit of a context may be processed; register A refers to a register through which a probability interval value of the context may be processed. MSB refers to a most significance bit-plane and LSB refers to a least significant bit-plane (LSB). Accordingly, the bits of the probability interval lower limit may range from the MSB to the LSB.

Further, "B" refers to a previous output byte (which is a part of a code stream to be output), "Cc" refers to a "c" bit of the C-register, "Cb" refers to a "b" bit of the C-register, "B1" refers to a new byte to be output, and "c" refers to a value of a normalized probability interval lower limit after the new byte is output. Accordingly, take the first normalized probability interval lower limit (C0) as an example, the value of the normalized probability interval lower limit can be expressed as {m'd0, C[27−m−n:0], n'd0}, wherein C[27−m−n:0] refers to that (27−m−n) significant bits (starting from the LSB) of the first updated probability interval lower limit (C') may be retained, m'd0 refers to that m bits of 0 may be stuffed before the (27−m−n) significant bits, and n'd0 refers to that n bits of 0 may be stuffed after the (27−m−n) significant bits. That is, the first normalized probability interval lower limit (C0) may consist of m bits of 0, (27−m−n) significant bits, and n bits of 0. As described in connection with FIG. 18, x0 bits starting from the lowest bit in the first intermediate probability interval lower limit (C'0) (which is obtained by left-shifting the first updated probability interval lower limit by the first shift digit (L0)) is retained, therefore, the value of n is equal to L0 and x0 is equal to (27−m). In some embodiments, the value of m may be determined based on a first shift digit (L0) and a first count of bits to be output (CT0) in the C-register corresponding to the first updated probability interval lower limit.

After the first normalized probability interval lower limit is determined, the first count of bits to be output may be updated. In some embodiments, a fill flag (F) may be used for determining a first updated count of bits to be output (CT'0) and/or the value of m. In some embodiments, the fill flag may be expressed as "F=((B==0xff)|(B==0xfe)& C'[p])," wherein B refers to the previous byte, C'[p] refers to the "c" bit of C-register before a new byte is output, and p is equal to a difference between 27 and the first count of bits to be output (i.e., p=27−CT0).

Merely by way of example, Table 1 is an exemplary table illustrating a process for normalizing the first updated probability interval lower limit and outputting a code stream. As shown, B refers to the previous output byte, CT0 refers to the first count of bits to be output, CT'0 refers to the first updated count of bits to be output, B' refers to an updated result of the previous output byte after the normalization of the first updated probability interval lower limit, B0 refers to a first byte to be output in the present normalization, and B1 refers to a second new byte to be output in the present normalization. Take the first row in the table as an example, "F?7+CT0−L:8+CT0−L" refers to that if the fill flag is 1, m is equal to "7+CT0−L," and if the fill flag is 0, m is equal to "8+CT0−L". Further, CT'0 is equal to "m−CT0."

TABLE 1

| Data Before Byteout | | | Data After Byteout | | | |
|---|---|---|---|---|---|---|
| CT0 | L | m= | CT'0= | B' | B0 | B1 |
| 1 | 1~7 | F?7+CT0−L: 8+CT0−L | m−CT0 | F? 0xff:B+ C'[p] | B==0xff?C'[p: p−7]: (F?{1'b0, C'[p−1: p−7]}:C'[p−1: p−1−7]) | NA |

TABLE 1-continued

| Data Before Byteout | | Data After Byteout | | | | |
|---|---|---|---|---|---|---|
| CT0 | L | m= | CT'0= | B' | B0 | B1 |
| 1 | 8 | F?15+CT0-L: 8+CT0-L | F?8: 1 | F? 0xff: B+ C'[p] | B==0xff?C'[p: p-7]: (F?{1'b0, C'[p-1: p-7]}:C'[p-1: p-1-7]) | F? C'[p-8: p-15]:NA |
| 1 | 9~15 | F?15+CT0-L: 16+CT0-L | F? 15+CT0-L: B0==0xff? 15+CT0-L:16+CT0-L | F? 0xff: B+ C'[p] | B==0xff?C'[p: p-7]: (F?{1'b0, C'[p-1: p-7]}:C'[p-1: p-8]) | F? C'[p-8: p-15]:B0==0xff? {1'b0,C'[p-9: p-15]}: C'[p-9: p-16] |
| 2 | 2~8 | F?7+CT0-L: 8+CT0-L | m-CT0 | F? 0xff: B+ C'[p] | B==0xff?C'[p: p-7]: (F?{1'b0, C'[p-1: p-7]}:C'[p-1: p-1-7]) | NA |
| 2 | 9 | F?15+CT0-L: 8+CT0-L | F?8: 1 | F? 0xff: B+ C'[p] | B==0xff?C'[p: p-7]: (F?{1'b0, C'[p-1: p-7]}:C'[p-1: p-1-7]) | F? C'[p-8: p-15]: NA |
| 2 | 10~15 | F?15+CT0-L: 16+CT0-L | F? 15+CT0-L: B0==0xff? 15+CT0-L:16+CT0-L | F? 0xff: B+ C'[p] | B==0xff?C'[p: p-7]: (F?{1'b0, C'[p-1: p-7]}:C'[p-1: p-8]) | F? C'[p-8: p-15]:B0==0xff? {1'b0,C'[p-9: p-15]}: C'[p-9: p-16] |
| 3 | 3~9 | F?7+CT0-L: 8+CT0-L | m-CT0 | F? 0xff:B+ C'[p] | B==0xff?C'[p: p-7]: (F?{1'b0, C'[p-1: p-7]}:C'[p-1: p-1-7]) | NA |
| 3 | 10 | F?15+CT0-L: 8+CT0-L | F?8: 1 | F? 0xff: B+ C'[p] | B==0xff?C'[p: p-7]: (F?{1'b0, C'[p-1: p-7]}:C'[p-1: p-1-7]) | F? C'[p-8: p-15]:NA |
| 3 | 11~15 | F?15+CT0-L: 16+CT0-L | F? 15+CT0-L: B0==0xff? 15+CT0-L:16+CT0-L | F? 0xff: B+ C'[p] | B==0xff?C'[p: p-7]: (F?{1'b0, C'[p-1: p-7]}:C'[p-1: p-8]) | F? C'[p-8: p-15]:B0==0xff? {1'b0,C'[p-9: p-15]}: C'[p-9: p-16] |
| 4 | 4~10 | F?7+CT0-L: 8+CT0-L | m-CT0 | F? 0xff:B+ C'[p] | B==0xff?C'[p: p-7]: (F?{1'b0, C'[p-1: p-7]}:C'[p-1: p-1-7]) | NA |
| 4 | 11 | F?15+CT0-L: 8+CT0-L | F?8: 1 | F? 0xff: B+ C'[p] | B==0xff?C'[p: p-7]: (F?{1'b0, C'[p-1: p-7]}:C'[p-1: p-1-7]) | F? C'[p-8: p-15]:NA |
| 4 | 12~15 | F?15+CT0-L: 16+CT0-L | F? 15+CT0-L: B0==0xff? 15+CT0-L:16+CT0-L | F? 0xff: B+ C'[p] | B==0xff?C'[p: p-7]: (F?{1'b0, C'[p-1: p-7]}:C'[p-1: p-8]) | F? C'[p-8: p-15]:B0==0xff? {1'b0,C'[p-9: p-15]}: C'[p-9: p-16] |
| 5 | 5~11 | F?7+CT0-L: 8+CT0-L | m-CT0 | F? 0xff:B+ C'[p] | B==0xff?C'[p: p-7]: (F?{1'b0, C'[p-1: p-7]}:C'[p-1: p-1-7]) | NA |
| 5 | 12 | F?15+CT0-L: 8+CT0-L | F?8: 1 | F? 0xff: B+ C'[p] | B==0xff?C'[p: p-7]: (F?{1'b0, C'[p-1: p-7]}:C'[p-1: p-1-7]) | F? C'[p-8: p-15]:NA |
| 5 | 13~15 | F?15+CT0-L: 16+CT0-L | F? 15+CT0-L: B0==0xff? 15+CT0-L:16+CT0-L | F? 0xff: B+ C'[p] | B==0xff?C'[p: p-7]: (F?{1'b0, C'[p-1: p-7]}:C'[p-1: p-8]) | F? C'[p-8: p-15]:B0==0xff? {1'b0,C'[p-9: p-15]}: C'[p-9: p-16] |
| 6 | 6~12 | F?7+CT0-L: 8+CT0-L | m-CT0 | F? 0xff:B+ C'[p] | B==0xff?C'[p: p-7]: (F?{1'b0, C'[p-1: p-7]}:C'[p-1: p-1-7]) | NA |
| 6 | 13 | F?15+CT0-L: 8+CT0-L | F?8: 1 | F? 0xff: B+ C'[p] | B==0xff?C'[p: p-7]: (F?{1'b0, C'[p-1: p-7]}:C'[p-1: p-1-7]) | F? C'[p-8: p-15]:NA |
| 6 | 14~15 | F?15+CT0-L: 16+CT0-L | F? 15+CT0-L: B0==0xff? 15+CT0-L:16+CT0-L | F? 0xff: B+ C'[p] | B==0xff?C'[p: p-7]: (F?{1'b0, C'[p-1: p-7]}:C'[p-1: p-8]) | F? C'[p-8: p-15]:B0==0xff? {1'b0,C'[p-9: p-15]}: C'[p-9: p-16] |
| 7 | 7~13 | F?7+CT0-L: 8+CT0-L | m-CT0 | F? 0xff:B+ C'[p] | B==0xff?C'[p: p-7]: (F?{1'b0, C'[p-1: p-7]}:C'[p-1: p-1-7]) | NA |

TABLE 1-continued

| Data Before Byteout | | | Data After Byteout | | | |
|---|---|---|---|---|---|---|
| CT0 | L | m= | CT'0= | B' | B0 | B1 |
| 7 | 14 | F?15+CT0-L: 8+CT0-L | F?8: 1 | F? 0xff: B+ C'[p] | B==0xff?C'[p: p-7]: (F?{1'b0, C'[p-1: p-7]}:C'[p-1: p-1-7]) | F? C'[p-8: p-15]:NA |
| 7 | 15 | F?15+CT0-L: 16+CT0-L | F? 15+CT0-L: B0==0xff? 15+CT0-L:16+CT0-L | F? 0xff: B+ C'[p] | B==0xff?C'[p: p-7]: (F?{1'b0, C'[p-1: p-7]}:C'[p-1: p-8]) | F? C'[p-8: p-15]:B0==0xff? {1'b0,C'[p-9: p-15]}: C'[p-9: p-16] |
| 8 | 8~14 | F?7+CT0-L: 8+CT0-L | m-CT0 | F? 0xff:B+ C'[p] | B==0xff?C'[p: p-7]: (F?{1'b0, C'[p-1: p-7]}:C'[p-1: p-1-7]) | NA |
| 8 | 15 | F?15+CT0-L: 8+CT0-L | F?8: 1 | F? 0xff: B+ C'[p] | B==0xff?C'[p: p-7]: (F?{1'b0, C'[p-1: p-7]}:C'[p-1: p-1-7]) | F? C'[p-8: p-15]:NA |
| 9 | 9~15 | 8+CT0-L | m-CT0 | B+ C'[p] | C'[p-1: p-1-7] | NA |
| 10 | 10~15 | 8+CT0-L | m-CT0 | B+ C'[p] | C'[p-1: p-1-7] | NA |
| 11 | 11~15 | 8+CT0-L | m-CT0 | B+ C'[p] | C'[p-1: p-1-7] | NA |
| 12 | 12~15 | 8+CT0-L | m-CT0 | B+ C'[p] | C'[p-1: p-1-7] | NA |
| 13 | 13~15 | 8+CT0-L | m-CT0 | B+ C'[p] | C'[p-1: p-1-7] | NA |

According to Table 1, the first normalized probability interval lower limit, a first new byte, and/or a second new byte corresponding to the first context may be determined. Further, a first bit indication signal (b0_flag) and a second bit indication signal (b1_flag) may be generated so as to indicate whether there is a first new byte to be output and whether there is a second new byte to be output respectively.

In some embodiments, the second normalized probability interval lower limit (C1), a third new byte (B2), and/or a fourth new byte (B3) corresponding to the second context may be determined in a similar way, during which a final byte (e.g., the first new byte, the second new byte) corresponding to the first context may be used as a previous byte. Further, a third bit indication signal (b2_flag) and a fourth bit indication signal (b3_flag) may be generated so as to indicate whether there is a third new byte to be output and whether there is a fourth new byte to be output respectively. In some embodiments, the new bytes corresponding to the first context and the new bytes corresponding to the second context may be written into the code stream and byte(s) without output may be removed based on the bit indication signal(s).

It should be noted that the above description of the process 2100 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

FIG. 22 is a block diagram illustrating an exemplary arithmetic entropy coding device according to some embodiments of the present disclosure. In some embodiments, the arithmetic entropy coding device 2200 may be implemented on various devices (e.g., the computing device 200 illustrated in FIG. 2, the mobile device 300 illustrated in FIG. 3). As shown in FIG. 22, the arithmetic entropy coding device 2200 may include a first updating module 2210, a second updating module 2220, and a processing module 2230. In some embodiments, one or more components of the arithmetic entropy coding device 2200 may be integrated into the processing device 112 (e.g., into the image coding engine 430).

The first updating module 2210 may be configured to update a probability interval value of each of two context-decision pairs (e.g., a first context-decision pair and a second context-decision pair), wherein the two context-decision pairs are input in parallel. The first updating module 2210 may be also configured to perform a shift processing on the updated probability interval value. In some embodiments, the first updating module 2210 may be further configured to obtain an initial probability interval value of each of the two context-decision pairs and update the initial probability interval value. In some embodiments, the first updating module 2210 may include a first determination sub-module (not shown), a first updating sub-module (not shown), a second determination sub-module (not shown), and a shift processing sub-module (not shown).

The first determination sub-module may be configured to determine at least one first coding-related parameter of the first context and at least one second coding-related parameter of the second context respectively. The at least one first coding-related parameter may include a first context probability, a first next less probable symbol (NLPS) index, a first next more probable symbol (NMPS) index, a first more probable symbol (MPS) index, a first interval switch flag, a first count of leading zeros (LZs), or the like, or a combination thereof. Similarly, the at least one second coding-related parameter may include a second context probability, a second next less probable symbol (NLPS) index, a second next more probable symbol (NMPS) index, a second more probable symbol (MPS) index, a second interval switch flag, a second count of leading zeros (LZs), or the like, or a combination thereof.

In some embodiments, if the first context is not equal to the second context, the first determination sub-module may be configured to obtain the at least one first coding-related parameter of the first context-decision pair and the at least one second coding-related parameter of the second context-decision pair respectively from a pre-stored lookup table. If the first context is equal to the second context, the first determination sub-module may be configured to obtain the at least one first coding-related parameter of the first context-decision pair from the pre-stored lookup table, and obtain the at least one second coding-related parameter of the second context-decision pair based on a first NLPS index or a first NMPS index of the first context-decision pair from a pre-stored probability estimation table.

In some embodiments, the first determination sub-module may be further configured to determine whether the first MPS index of the first context-decision pair is equal to the first decision. In response to a determination that the first MPS index of the first context-decision pair is equal to the first decision, the first determination sub-module may obtain the at least one second coding-related parameter of the second context-decision pair from the pre-stored probability estimation table by using the first NMPS index of the first context-decision pair as an index. In response to a determination that the first MPS index of the first context-decision pair is not equal to the first decision, the first determination sub-module may obtain the at least one second coding-related parameter of the second context-decision pair from the pre-stored probability estimation table by using the first NLPS index of the first context-decision pair as an index.

The first updating sub-module may be configured to update the initial probability interval value (e.g., a first initial probability interval value corresponding to the first context, a second initial probability interval value corresponding to the second context) based on the at least one coding-related parameter of each of the first context-decision pair and the second context-decision pair. In some embodiments, the first updating sub-module may include a first updating unit (not shown), a normalization unit (not shown), and a second updating unit (not shown).

The first updating unit may be configured to obtain a first updated probability interval value by updating the first initial probability interval value of the first context-decision pair based on the first decision, the first MPS index, and the first context probability. In some embodiments, in response to determining that the first updated probability interval value is equal to a difference between the first initial probability interval value and the first context probability based on the first decision, the first MPS index, and the first context probability, the first updating unit may determine a first indication signal of an update mode for updating a first initial probability interval lower limit of the first context-decision pair as 1. In some embodiments, in response to determining that the first updated probability interval value is equal to the first context probability based on the first decision, the first MPS index, and the first context probability, the first updating unit may determine the first indication signal of the update mode for updating the first initial probability interval lower limit of the first context-decision pair as 0.

The normalization unit may be configured to obtain a first normalized probability interval value (also referred to as a "second probability interval value") by normalizing the first updated probability interval value.

The second updating unit may be configured to obtain a second updated probability interval value (also referred to as a "third probability interval value") by updating a second initial probability interval value (which is designated to be the first normalized probability interval value) of the second context-decision pair based on the second decision, the second MPS index, the second context probability, and the first normalized probability interval value (i.e., the second probability interval value). In some embodiments, in response to determining that the second updated probability interval value (i.e., the third probability interval value) is equal to a difference between the first normalized probability interval value (i.e., the second probability interval value) and the second context probability based on the second decision, the second MPS index, the second context probability, and the first normalized probability interval value (i.e., the second probability interval value), the second updating unit may determine a second indication signal of an update mode for updating a second initial probability interval lower limit of the second context-decision pair as 1. In response to determining that the second updated probability interval value (i.e., the third probability interval value) is equal to the second context probability based on the second decision, the second MPS index, the second context probability, and the first normalized probability interval value (i.e., the second probability interval value), the second updating unit may determine the second indication signal of the update mode for updating the second initial probability interval lower limit of the second context-decision pair as 0.

The second determination sub-module may be configured to determine a first shift digit of the first context-decision pair and a second shift digit of the second context-decision pair respectively. In some embodiments, the second determination sub-module may determine the first shift digit as a first count of LZs corresponding to the first context-decision pair, or determine the first shift digit as one of 0, 1, or 2. In some embodiments, the second determination sub-module may determine the second shift digit as a second count of LZs corresponding to the second context-decision pair, or determine the second shift digit as one of 0, 1, or 2.

The shift processing sub-module may be configured to perform a first shift processing on the first updated probability interval value of the first context-decision pair based on the first shift digit and perform a second shift processing on the second updated probability interval value of the second context-decision pair based on the second shift digit. In some embodiments, if both a first normalized shift identifier of the first context-decision pair and a second normalized shift identifier of the second context-decision pair are 0, the shift processing sub-module may cancel the shift processing on the first updated probability interval value of the first context-decision pair and the second updated probability interval value of the second context-decision pair. If both the first normalized shift identifier of the first context-decision pair and the second normalized shift identifier of the second context-decision pair are 1, the shift processing sub-module may perform a left-shift processing on the first updated probability interval value of the first context-decision pair based on the first shift digit and perform a left-shift processing on the second updated probability interval value of the second context-decision pair based on the second shift digit.

The second updating module 2220 may be configured to update a probability interval lower limit (which can be considered as an "initial probability interval value") of each of the two context-decision pairs. In some embodiments, the second updating module 2220 may include a third determination sub-module (not shown) and a first calculation sub-module (not shown).

The third determination sub-module may be configured to determine a first updated probability interval lower limit of the first context-decision pair based on the first indication signal of the update mode for updating the first initial probability interval lower limit of the first context-decision pair, and obtain a first normalized probability interval lower limit of the first context-decision pair by normalizing the first updated probability interval lower limit. In some embodiments, if the first indication signal is equal to 1, the third determination sub-module may determine the first updated probability interval lower limit as the first initial probability interval lower limit. If the first indication signal is not equal to 1, the third determination sub-module may determine the first updated probability interval lower limit as a sum of the first initial probability interval lower limit and the first context probability.

The first calculation sub-module may be configured to determine a second updated probability interval lower limit of the second context-decision pair based on the first normalized probability interval lower limit (which can be considered as a "second initial probability interval lower limit") of the first context-decision pair, and obtain a second normalized probability interval lower limit of the second context-decision pair by normalizing the updated probability interval lower limit of the second context-decision pair. In some embodiments, if the second indication signal is equal to 1, the first calculation sub-module may determine the second updated probability interval lower limit of the second context-decision pair as the first normalized probability interval lower limit of the first context-decision pair. If the second indication signal is not equal to 1, the first calculation sub-module may determine the second updated probability interval lower limit of the second context-decision pair as a sum of the first normalized probability interval lower limit and the second context probability.

The processing module 2230 may be configured to normalize the probability interval lower limit and outputting a code stream. In some embodiments, the processing module 2230 may include a first normalization sub-module (not shown) and a second normalization sub-module (not shown).

The first normalization sub-module may be configured to normalize the first updated probability interval lower limit of the first context-decision pair based on the first shift digit and the first normalized shift identifier and output a code stream. In some embodiments, if the first normalized shift identifier is equal to 1 and a first count of bits to be output in a register corresponding to the first updated probability interval lower limit is not larger than the first shift digit, the first normalization sub-module may retain x0 bits starting from the lowest bit in a result (which can be considered as a "first intermediate probability interval lower limit") obtained by left shifting the first updated probability interval lower limit by the first shift digit, zero clear remainder bits, determine the processed result as a result (i.e., a first normalized probability interval lower limit) of normalizing the first updated probability interval lower limit, and output the code stream.

The second normalization sub-module may be configured to normalize the second updated probability interval lower limit of the second context-decision pair based on the second shift digit and the second normalized shift identifier and output a code stream. In some embodiments, if the second normalized shift identifier of the second context-decision pair is equal to 1 and a second count of bits to be output in a register corresponding to the second updated interval lower limit of the second context-decision pair is not larger than the second shift digit, the second normalization sub-module may retain x1 bits starting from the lowest bit in a result (which can be considered as a "second intermediate probability interval lower limit") obtained by left shifting the second updated probability interval lower limit of the second context-decision pair by the second shift digit, zero clear remainder bits, determine the processed result as a result (i.e., a second normalized probability interval lower limit) of normalizing the second updated probability interval lower limit of the second context-decision pair, and output the code stream.

In some embodiments, the arithmetic entropy coding device 2200 may also include a third updating module (not shown) and a maintaining module (not shown).

The third updating module may be configured to update the first MPS index of the first context-decision pair and the second MPS index of the second context-decision pair. In some embodiments, the third updating module may include a second calculation sub-module and a second updating sub-module.

The second calculation sub-module may be configured to, if the first context is not equal to the second context, determine a first updated MPS index of the first context-decision pair and a second updated MPS index of the second context-decision pair respectively.

The second updating sub-module may be configured to, if the first context is equal to the second context, obtain the first updated MPS index by updating the first MPS index of the first context-decision pair and obtain the second updated MPS index by updating the second MPS index (which is designated to be the first updated MPS index). In some embodiments, if the first decision is equal to the first MPS index of the first context-decision pair, the second updating sub-module may determine the first updated MPS index based on the first MPS index of the first context-decision pair. If the first decision is not equal to the first MPS index of the first context-decision pair, the second updating sub-module may determine the first updated MPS index based on the first MPS index of the first context-decision pair and the first interval switch flag. Furthermore, if the second decision is equal to the first updated MPS index, the second updating sub-module may determine the second updated MPS index based on the first updated MPS index. If the second decision is not equal to the first updated MPS index, the second updating sub-module may determine the second updated MPS index based on the first updated MPS index and the second interval switch flag of the second context-decision pair.

The maintaining module may be configured to maintain the first updated MPS index of the first context-decision pair and the second updated MPS index of the second context-decision pair into the lookup table. In some embodiments, the maintaining module may be configured to maintain the at least one first updated coding-related parameter and the at least one second updated coding-related parameter the lookup table.

It should be noted that the modules in the arithmetic entropy coding device 2200 may be implemented by software and/or hardware. For example, the modules may be implemented in a same processor. As another example, the modules may be implemented in different processors in any combination. In some embodiments, the modules in the arithmetic entropy coding device 2200 may be connected to or communicate with each other via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth, a ZigBee, a Near Field Communication (NFC), or the like, or any combination thereof. Two or more of the modules may be combined as a single module, and any one of the modules may be divided into two or more units.

In some embodiments, the processes such as obtaining at least one coding parameter, updating a probability interval value, determining a normalized probability interval value, and updating an MPS index (i.e., processes 900-1620) may be completed in a first beat. Further, the processes such as updating a probability interval lower limit, determining a normalized probability interval lower limit, and outputting at least one byte (i.e., processes 1700-2100) may be completed in a second beat. According to the first beat and the second beat, a coding process may be arranged in a two-stage flow and may be realized by a register transfer level (RTL). After performing a design compiler (DC) synthesis on the RTL based on a 9t process of united microelectronics corporation (UTC) 40 nm, a clock frequency of the RTL may be larger than or equal to 300 MHz. Therefore, the systems and methods of the present disclosure may provide a practical significance for chip design.

Figure 23:
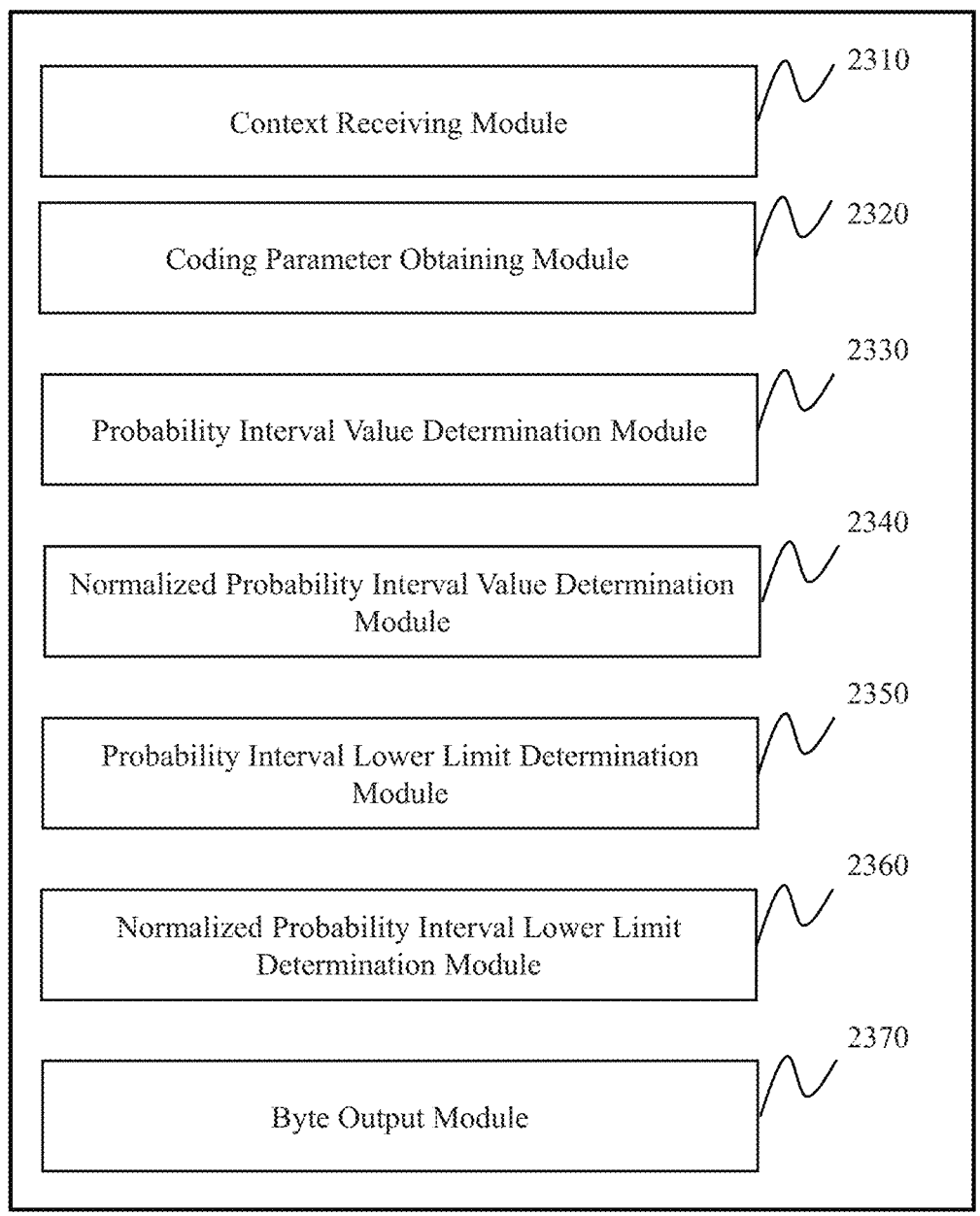
FIG. 23 is a block diagram illustrating an exemplary image coding engine according to some embodiments of the present disclosure.

FIG. 23 is a block diagram illustrating an exemplary image coding engine according to some embodiments of the present disclosure. In some embodiments, the image coding engine 430 may be implemented on various devices (e.g., the computing device 200 illustrated in FIG. 2, the mobile device 300 illustrated in FIG. 3). As shown in FIG. 23, the image coding engine 430 may include a context receiving module 2310, a coding parameter obtaining module 2320, a probability interval value determination module 2330, a normalized probability interval value determination module 2340, a probability interval lower limit determination module 2350, a normalized probability interval lower limit determination module 2360, and a byte output module 2370.

The context receiving module 2310 may be configured to receive at least two contexts including a first context and a second context. In some embodiments, the context receiving module 2310 may receive the at least two contexts from a bit-plane coding device. Each of the at least two contexts may correspond to a decision. For example, the first context corresponds to a first decision and the second context corresponds to a second decision.

The coding parameter obtaining module 2320 may be configured to obtain at least one coding parameter corresponding to the context from at least one lookup table. In some embodiments, the at least one coding parameter may include a context probability, a next less probable symbol (NLPS) index, a next more probable symbol (NMPS) index, a more probable symbol (MPS) index, a interval switch flag, or a count of leading zeros (LZs), or the like, or any combination thereof. In some embodiments, the at least one lookup table may include a first lookup table (e.g., a LUT), a second lookup table (e.g., a PET), or the like, or a combination thereof.

Take a coding process for coding two contexts (e.g., the first context and the second context) as an example, the coding parameter obtaining module 2320 may determine whether the first context is not equal to the second context. In response to a determination that the first context is not equal to the second context, the coding parameter obtaining module 2320 may retrieve at least one first coding parameter corresponding to the first context and at least one second coding parameter corresponding to the second context from the at least one lookup table (e.g., the first lookup table) with the first context and the second context as indexes respectively.

In response to a determination that the first context is equal to the second context, the coding parameter obtaining module 2320 may retrieve the at least one first coding parameter corresponding to the first context from the first lookup table of the at least one lookup table with the first context as index. Further, the coding parameter obtaining module 2320 may determine whether a first MPS index in the at least one first coding parameter is not equal to the first decision corresponding to the first context. In response to a determination that the first MPS index is not equal to the first decision, the coding parameter obtaining module 2320 may retrieve the at least one second coding parameter corresponding to the second context from the second lookup table of the at least one lookup table with a first NLPS index in the at least one first coding parameter as index. In response to a determination that the first MPS index is equal to the first decision, the coding parameter obtaining module 2320 may determine whether a previous probability interval value (also referred to as "first initial probability interval value") is less than an OR operation result of a first context probability in the at least one first coding parameter and a predetermined value (e.g., A<(Qe0|0x8000) illustrated in FIG. 10). In response to a determination that the previous probability interval value is less than the OR operation result of the first context probability and the predetermined value, the coding parameter obtaining module 2320 may retrieve the at least one second coding parameter from the second lookup table with a first NMPS index in the at least one first coding parameter as index. In response to a determination that the previous probability interval value is larger than or equal to the OR operation result of the first context probability and the predetermined value, the coding parameter obtaining module 2320 may determine the at least one second coding parameter based on the at least one first coding parameter.

The probability interval value determination module 2330 may be configured to determine a probability interval value corresponding to the context based on a previous probability interval value and the at least one coding parameter.

In some embodiments, the probability interval value determination module 2330 may determine whether the decision corresponding to the context, the MPS index, the context probability, and the previous probability interval value satisfy a preset condition. Specifically, the preset condition may be that the decision is not equal to the MPS index and the previous probability interval value is larger than twice of the context probability, or the decision is equal to the MPS index and the previous probability interval value is less than twice of the context probability. In response to a determination that the decision, the MPS index, the context probability, and the previous probability interval value satisfy the preset condition, the probability interval value determination module 2330 may determine the probability interval value equal to the context probability. Additionally, an indication signal of an update mode for updating a probability interval lower limit of the context may be determined as 0. In response to a determination that the decision, the MPS index, the context probability, and the previous probability interval value do not satisfy the preset condition, the probability interval value determination module 2330 may determine the probability interval value equal to the previous probability interval value minus the context probability. Additionally, the indication signal of the update mode for updating the probability interval lower limit of the context may be determined as 1.

The normalized probability interval value determination module 2340 may be configured to determine a normalized probability interval value corresponding to the context by performing a normalization operation on the probability interval value.

In some embodiments, as described above, in response to a determination that the decision, the MPS index, the context probability, and the previous probability interval value satisfy the preset condition, the normalized probability interval value determination module 2340 may determine a shift digit corresponding to the context equal to a count of LZs in the at least one coding parameter. In response to a determination that the decision, the MPS index, the context probability, and the previous probability interval value do not satisfy the preset condition, the normalized probability interval value determination module 2340 may determine the shift digit corresponding to the context based on the previous probability interval value and the context probability in the at least one coding parameter. Specifically, as described above, in response to a determination that the decision, the MPS index, the context probability, and the previous probability interval value do not satisfy the preset condition, the probability interval value determination module 2330 may determine the probability interval value equal to the previous probability interval value minus the context probability. Accordingly, the normalized probability interval value determination module 2340 may determine whether the highest bit of the probability interval value is equal to 1. In response to a determination that the highest bit of the probability interval value is equal to 1, the normalized probability interval value determination module 2340 may determine the shift digit as 0. In response to a determination that the highest bit of the probability interval value is not equal to 1, the normalized probability interval value determination module 2340 may further determine whether the second highest bit of the probability interval value is equal to 1. In response to a determination that the second highest bit of the probability interval value is equal to 1, the normalized probability interval value determination module 2340 may determine the shift digit as 1. In response to a determination that the second highest bit of the probability interval value is not equal to 1, the normalized probability interval value determination module 2340 may determine the shift digit as 2.

Further, after determining the shift digit corresponding to the context, the normalized probability interval value determination module 2340 may determine the normalized probability interval value corresponding to the context by performing the normalization operation on the probability interval value based on the shift digit. In some embodiments, the normalization operation may be achieved by performing a shift processing on the probability interval value based on the shift digit. In some embodiments, the normalized probability interval value determination module 2340 may also determine a normalized shift identifier of the context that may be used to determine whether to perform the normalization operation (e.g., the shift processing) on the probability interval value ("0" indicates that the normalization operation may not be performed on the probability interval value; "1" indicates that the normalization operation may be performed on the probability interval value). More descriptions regarding the normalized shift identifier may be found elsewhere in the present disclosure (e.g., FIG. 14A, FIG. 16A, and the descriptions thereof).

The probability interval lower limit determination module 2350 may be configured to determine a probability interval lower limit corresponding to the context based on a previous probability interval lower limit and the at least one coding parameter.

In some embodiments, as described above, in response to a determination that the decision, the MPS index, the context probability, and the previous probability interval value satisfy the preset condition (the indication signal of the update mode for updating the probability interval lower limit of the context may be determined is 0), the probability interval lower limit determination module 2350 may determine the probability interval lower limit equal to the previous probability interval lower limit plus a context probability in the at least one coding parameter. In response to a determination that the decision, the MPS index, the context probability, and the previous probability interval value do not satisfy the preset condition (the indication signal of the update mode for updating the probability interval lower limit of the context may be determined is 1), the probability interval lower limit determination module 2350 may determine the probability interval lower limit equal to the previous probability interval lower limit. More descriptions regarding the determination of the probability interval lower limit may be found elsewhere in the present disclosure (e.g., FIG. 17, FIG. 19, and the descriptions thereof).

The normalized probability interval lower limit determination module 2360 may be configured to determine a normalized probability interval lower limit corresponding to the context by performing the normalization operation on the probability interval lower limit.

In some embodiments, as described above, the normalized shift identifier of the context also may be used to determine whether to perform the normalization operation on the probability interval lower limit ("0" indicates that the normalization operation may not be performed on the probability interval lower limit; "1" indicates that the normalization operation may be performed on the probability interval lower limit). If the normalized shift identifier is equal to 1, the normalized probability interval lower limit determination module 2360 may determine an intermediate probability interval lower limit corresponding to the context by performing the normalization operation on the probability interval lower limit based on the shift digit. Further, the normalized probability interval lower limit determination module 2360 may determine whether a count of bits to be output in a register corresponding to the probability interval lower limit is larger than the shift digit of the normalization operation. In response to a determination that the count of bites to be output is larger than the shift digit of the normalization operation, the normalized probability interval lower limit determination module 2360 may designate the intermediate probability interval lower limit as the normalized probability interval lower limit. In response to a determination that the count of bits to be output is less than or equal to the shift digit of the normalization operation, the normalized probability interval lower limit determination module 2360 may determine a processing result by retaining x bits starting from the lowest bit in the intermediate probability interval lower limit and zero clearing remainder bits. Further, the normalized probability interval lower limit determination module 2360 may determine the processing result as the normalized probability interval lower limit.

The byte output module 2370 may be configured to output at least one byte corresponding to the context based on the normalized probability interval lower limit. In some embodiments, in the normalization operation performed on the probability interval lower limit, the byte output module 2370 may determine the at least one byte corresponding to the context synchronously. More descriptions regarding outputting the at least one byte may be found elsewhere in the present disclosure (e.g., FIG. 18, FIG. 20, FIG. 21, and the descriptions thereof).

The modules in the image coding engine 430 may be connected to or communicate with each other via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth, a ZigBee, a Near Field Communication (NFC), or the like, or any combination thereof. Two or more of the modules may be combined as a single module, and any one of the modules may be divided into two or more units. For example, the normalized probability interval value determination module 2340 and the normalized probability interval lower limit determination module 2360 may be combined as a single module which may be configured to determine the normalized probability interval value and the normalized probability interval lower limit. As another example, the normalized probability interval lower limit determination module 2360 and the byte output module 2370 may be combined as a single module, which may be configured to determine the normalized probability interval lower limit and output the at least one byte synchronously.

Figure 24:
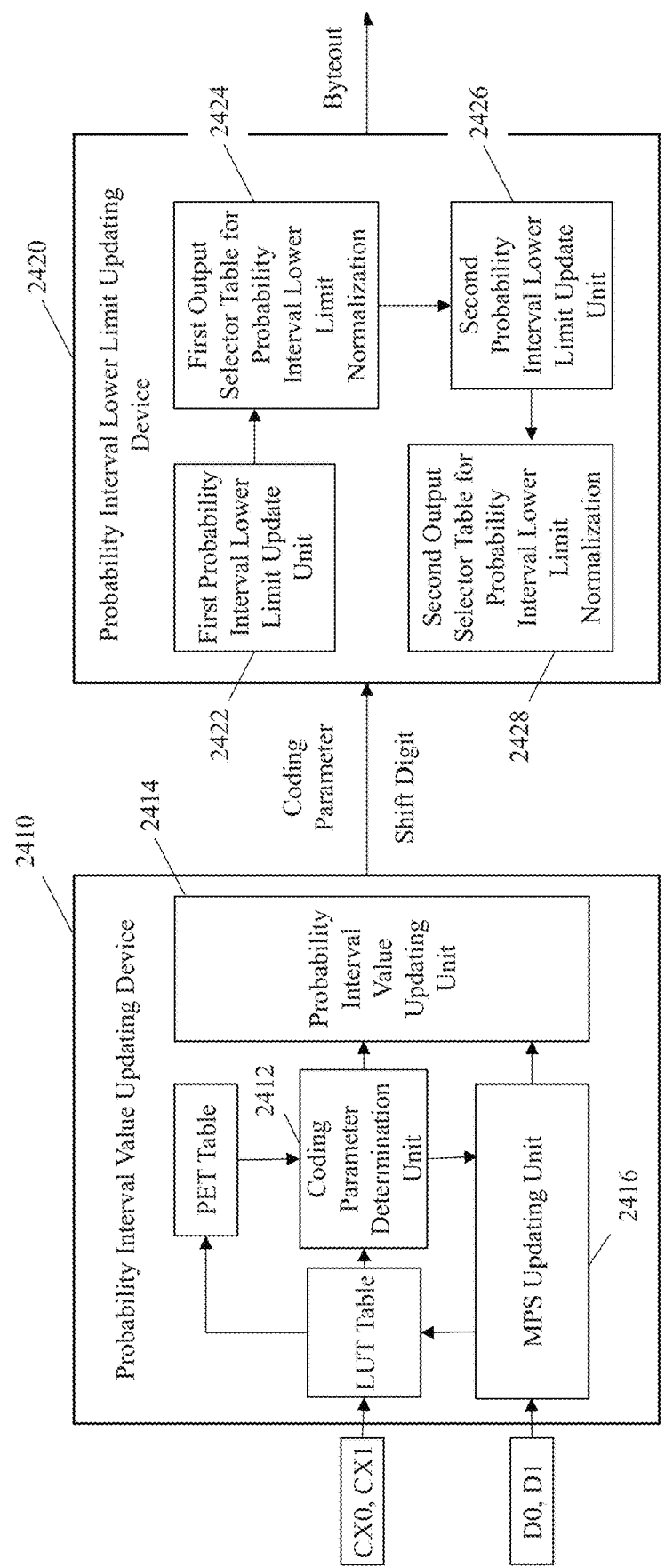
FIG. 24 is a schematic diagram illustrating an exemplary coding device according to some embodiments of the present disclosure.

FIG. 24 is a schematic diagram illustrating an exemplary coding device according to some embodiments of the present disclosure. In some embodiments, the coding device 2400 may be implemented on various devices (e.g., the computing device 200 illustrated in FIG. 2, the mobile device 300 illustrated in FIG. 3). As shown in FIG. 24, the coding device 2400 may include a probability interval value updating device 2410 and a probability interval lower limit updating device 2420. In some embodiments, one or more components (e.g., one or more units of the probability interval value updating device 2410 and/or the probability interval lower limit updating device 2420) of the coding device 2400 may be integrated into the processing device 112 (e.g., into the image coding engine 430).

The probability interval value updating device 2410 may be configured to determine a probability interval value (also referred to as an "updated probability interval value") corresponding to a context (e.g., a first context (CX0), a second context (CX1)) based on a previous probability interval value (also referred to as an "initial probability interval value") corresponding to the context. In some embodiments, the probability interval value updating device 2410 may be further configured to determine a normalized probability interval value corresponding to the context by performing a normalization operation on the probability interval value.

In some embodiments, the probability interval value updating device 2410 may include a coding parameter determination unit 2412, a probability interval value updating unit 2414, and an MPS index updating unit 2416.

As illustrated, the probability interval value updating device 2410 may receive the first context and the second context, then the coding parameter determination unit 2412 may obtain at least one first coding parameter (also referred to as "coding-related parameter") corresponding to the first context and at least one second coding parameter corresponding to the second context from at least one lookup table (e.g., a LUT and/or a PET). For example, the coding parameter determination unit 2412 may determine whether the first context is not equal to the second context. In response to a determination that the first context is not equal to the second context, the coding parameter determination unit 2412 may obtain the at least one first coding parameter corresponding to the first context and the at least one second coding parameter corresponding to the second context from the LUT with the first context and the second context as indexes respectively. In response to a determination that the first context is equal to the second context, the coding parameter determination unit 2412 may obtain the at least one first coding parameter corresponding to the first context from the LUT with the first context as index and obtain the at least one second coding parameter corresponding to the second context from the PET with a first NLPS index or a first NMPS index of the first context as index.

The probability interval value updating unit 2414 may determine a first probability interval value (also referred to as a "first updated probability interval value") corresponding to the first context based on a first previous probability interval value (also referred to as a "first initial probability interval value") and the at least one first coding parameter. Further, the probability interval value updating unit 2414 may determine a first normalized probability interval value corresponding to the first context by performing a first normalization operation on the first probability interval value. For example, the probability interval value updating unit 2414 may determine a first shift digit corresponding to the first context and determine the first normalized probability interval value corresponding to the first context by performing a first normalization operation on the first probability interval value based on the first shift digit. Furthermore, the probability interval value updating unit 2414 may determine a second probability interval value (also referred to as a "second updated probability interval value") corresponding to the second context based on a second previous probability interval value (also referred to as a "second initial probability interval value," which is designated to be the first normalized probability interval value) and the at least one second coding parameter. Moreover, the probability interval value updating unit 2414 may determine a second normalized probability interval value corresponding to the second context by performing a second normalization operation on the second probability interval value. For example, the probability interval value updating unit 2414 may determine a second shift digit corresponding to the second context and determine the second normalized probability interval value corresponding to the second context by performing a second normalization operation on the second probability interval value based on the second shift digit.

The MPS index updating unit 2416 may update an MPS index in the at least one coding parameter (e.g., the at least one first coding parameter, the at least one second coding parameter) and store the updated MPS index into the at least one lookup table (e.g., the LUT).

In some embodiments, data generated by the probability interval value updating device 2410 may be transmitted to the probability interval lower limit updating device 2420 for further processing. The data may include the at least one first coding parameter, the at least one second coding parameter, the first shift digit, the second shift digit, or the like, or any combination thereof.

The probability interval lower limit updating device 2420 may be configured to determine a probability interval lower limit (also referred to as an "updated probability interval lower limit") corresponding to the context (e.g., the first context, the second context) based on a previous probability interval lower limit (also referred to as "initial probability interval lower limit") and the at least one coding parameter. In some embodiments, the probability interval lower limit updating device 2420 may be further configured to determine a normalized probability interval lower limit corresponding to the context by performing the normalization operation on the probability interval lower limit. Further, the probability interval lower limit updating device 2420 may output at least one byte corresponding to the context based on the normalized probability interval lower limit.

In some embodiments, the probability interval lower limit updating device 2420 may include a first probability interval lower limit updating unit 2422, a first output selector table 2424, a second probability interval lower limit updating unit 2426, and a second output selector table. According to the data generated by the probability interval value updating device 2410, the first probability interval lower limit updating unit 2422 may determine a first probability interval lower limit corresponding to the first context based on a first previous probability interval lower limit (also referred to as a "first initial probability interval lower limit") and the at least one first coding parameter. Further, the first output selector table 2424 may determine a first normalized probability interval lower limit corresponding to the first context by performing the first normalization operation on the first probability interval lower limit. Additionally, the first output selector table 2424 may also determine at least one first byte corresponding to the first context. Furthermore, the second probability interval lower limit updating unit 2426 may determine a second probability interval value corresponding to the second context based on a second previous probability interval lower limit (also referred to as a "second initial probability interval lower limit" which is designated to be the first normalized probability interval value) and the at least one second coding parameter. Moreover, the second output selector table 2428 may determine a second normalized probability interval lower limit corresponding to the second context by performing the second normalization operation on the second probability interval lower limit. Additionally, the second output selector 2428 may also determine at least one second byte corresponding to the second context. The at least one first byte corresponding to the first context and/or the at least one second byte corresponding to the second context may be output by the probability interval lower limit updating device 2420.

The components in the coding device 2400 may be connected to or communicate with each other via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth, a ZigBee, a Near Field Communication (NFC), or the like, or any combination thereof. Two or more of the components may be combined as a single component, and any one of the components may be divided into two or more sub-components.

Figure 25:
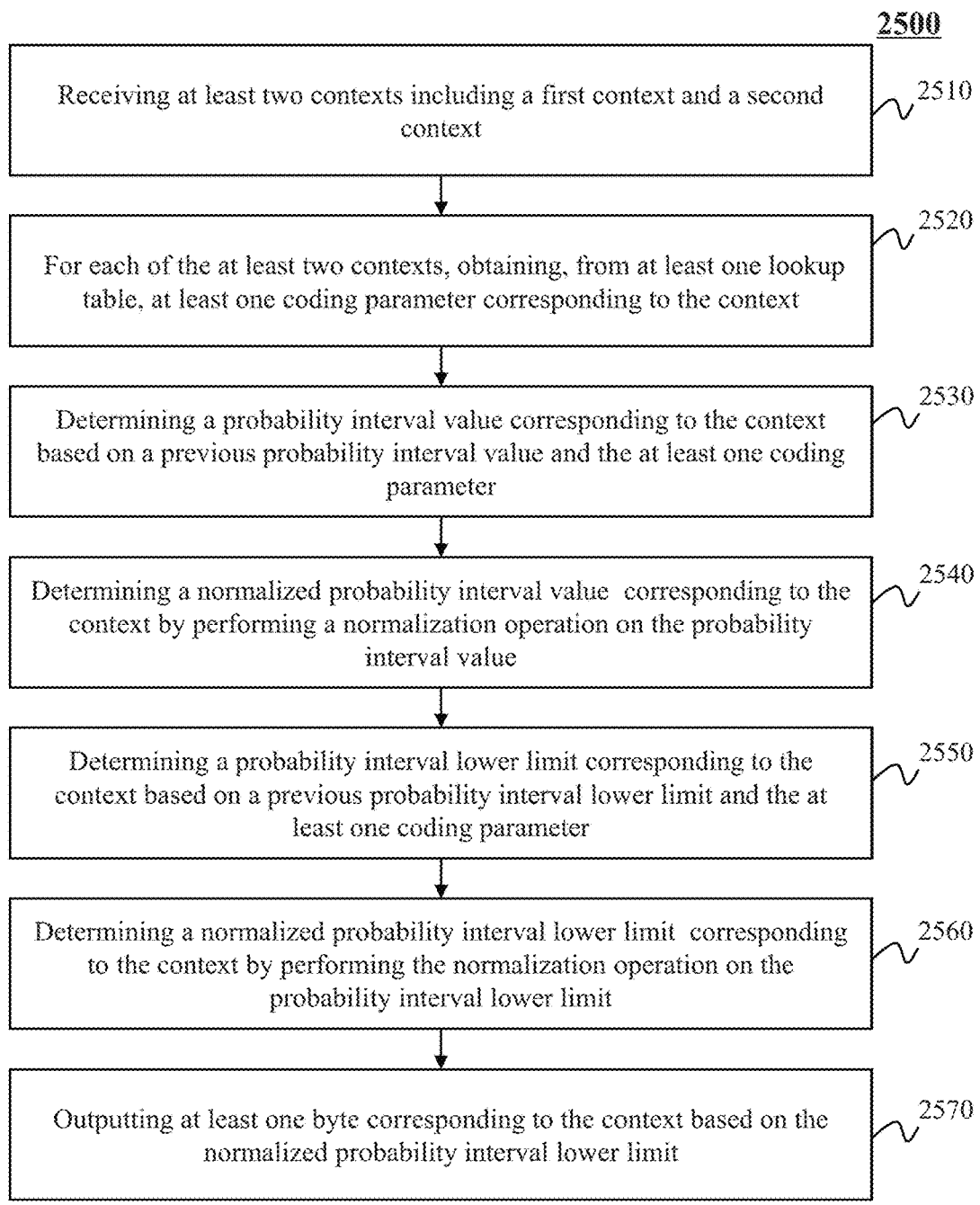
FIG. 25 is a flowchart illustrating an exemplary process for coding according to some embodiments of the present disclosure.

FIG. 25 is a flowchart illustrating an exemplary process for coding according to some embodiments of the present disclosure. In some embodiments, the process 2500 may be implemented as a set of instructions (e.g., an application) stored in the storage ROM 230 or RAM 240. The processor 220 and/or the modules in FIG. 23 may execute the set of instructions, and when executing the instructions, the processor 220 and/or the modules may be configured to perform the process 2500. The operations of the illustrated process presented below are intended to be illustrative. In some embodiments, the process 2500 may be accomplished with one or more additional operations not described, and/or without one or more of the operations discussed. Additionally, the order in which the operations of the process 2500 as illustrated in FIG. 25 and described below is not intended to be limiting.

In 2510, the processing device 112 (e.g., the context receiving module 2310 in the image coding engine 430) may receive at least two contexts including a first context and a second context.

As described in connection with FIG. 4, the processing device 112 may receive the at least two contexts from a bit-plane coding device. In some embodiments, each of the at least two contexts corresponds to a decision. For example, the first context corresponds to a first decision and the second context corresponds to a second decision.

In 2520, for each of the at least two contexts, the processing device 112 (e.g., the coding parameter obtaining module 2320 in the image coding engine 430) may obtain at least one coding parameter corresponding to the context from at least one lookup table.

In some embodiments, the at least one coding parameter may include a context probability, a next less probable symbol (NLPS) index, a next more probable symbol (NMPS) index, a more probable symbol (MPS) index, a interval switch flag, or a count of leading zeros (LZs), or the like, or any combination thereof. In some embodiments, the at least one lookup table may include a first lookup table (e.g., a LUT), a second lookup table (e.g., a PET), or the like, or a combination thereof. As described in connection with FIG. 9, the first lookup table may be obtained by combining a probability lookup table and an index lookup table in JPEG 2000, and may be implemented using a register. The second lookup table may be obtained based on a traditional PET in JPEG 2000.

Take the coding process for coding two contexts as an example, the processing device 112 may determine whether the first context is not equal to the second context. In response to a determination that the first context is not equal to the second context, the processing device 112 may retrieve at least one first coding parameter corresponding to the first context and at least one second coding parameter corresponding to the second context from the at least one lookup table (e.g., the first lookup table) with the first context and the second context as indexes respectively.

In response to a determination that the first context is equal to the second context, the processing device 112 may retrieve the at least one first coding parameter corresponding to the first context from the first lookup table of the at least one lookup table with the first context as index. Further, the processing device 112 may determine whether a first MPS index in the at least one first coding parameter is not equal to the first decision (also referred to as "first context decision") corresponding to the first context. In response to a determination that the first MPS index is not equal to the first decision, the processing device 112 may retrieve the at least one second coding parameter corresponding to the second context from the second lookup table of the at least one lookup table with a first NLPS index in the at least one first coding parameter as index. In response to a determination that the first MPS index is equal to the first decision, the processing device 112 may determine whether a previous probability interval value (also referred to as a "first initial probability interval value") is less than an OR operation result of a first context probability in the at least one first coding parameter and a predetermined value (e.g., A<(Qe0|0x8000) illustrated in FIG. 10). In the present disclosure, the OR operation is introduced, which requires a relatively small computation than a subtraction operation (i.e., A−Qe0<0x8000) used in JPEG 2000. In response to a determination that the previous probability interval value is less than the OR operation result of the first context probability and the predetermined value, the processing device 112 may retrieve the at least one second coding parameter from the second lookup table with a first NMPS index in the at least one first coding parameter as index. In response to a determination that the previous probability interval value is larger than or equal to the OR operation result of the first context probability and the predetermined value, the processing device 112 may determine the at least one second coding parameter based on the at least one first coding parameter. More descriptions regarding obtaining the at least one coding parameter may be found elsewhere in the present disclosure (e.g., FIG. 9, FIG. 10, and the descriptions thereof).

In 2530, the processing device 112 (e.g., the probability interval value determination module 2330 in the image coding engine 430) may determine a probability interval value corresponding to the context based on a previous probability interval value and the at least one coding parameter.

In some embodiments, the processing device 112 may determine whether the decision corresponding to the context, the MPS index, the context probability, and the previous probability interval value satisfy a preset condition. Specifically, the preset condition may be that the decision is not equal to the MPS index and the previous probability interval value is larger than or equal to twice of the context probability, or the decision is equal to the MPS index and the previous probability interval value is less than twice of the context probability. In response to a determination that the decision, the MPS index, the context probability, and the previous probability interval value satisfy the preset condition, the processing device 112 may determine the probability interval value equal to the context probability. Additionally, an indication signal of an update mode for updating a probability interval lower limit of the context may be determined as 0. In response to a determination that the decision, the MPS index, the context probability, and the previous probability interval value do not satisfy the preset condition, the processing device 112 may determine the probability interval value equal to the previous probability interval value minus the context probability. Additionally, the indication signal of the update mode for updating the probability interval lower limit of the context may be determined as 1.

Take the coding process for coding two contexts as an example, the processing device 112 may determine a first probability interval value corresponding to the first context based on a previous probability interval value and the at least one first coding parameter. For example, as described in connection with FIG. 12A, the processing device 112 may determine whether the first decision, the first MPS index, the first context probability, and the pervious probability interval value satisfy a first preset condition. In response to a determination that the first decision, the first MPS index, the first context probability, and the pervious probability interval value do not satisfy the first preset condition, the processing device 112 may determine the first probability interval value equal to the previous probability interval value minus the first context probability. In response to a determination that the first decision, the first MPS index, the first context probability, and the pervious probability interval value satisfy the first preset condition, the processing device 112 may determine the first probability interval value equal to the first context probability. In some embodiments, the processing device 112 may further determine a first normalized probability interval value corresponding to the first context by performing a first normalization operation on the first probability interval value.

Further, as described in connection with FIG. 12B, the processing device 112 may determine whether the second decision, the second MPS index, the second context probability, and the previous probability interval value (which is designated to be the first normalized probability interval value) satisfy a second preset condition. In response to a determination that the second decision, the second MPS index, the second context probability, and the first normalized probability interval value do not satisfy the second preset condition, the processing device 112 may determine the second probability interval value equal to the first normalized probability interval value minus the second context probability. In response to a determination that the second decision, the second MPS index, the second context probability, and the first normalized probability interval value satisfy the second preset condition, the processing device 112 may determine the second probability interval value equal to the second context probability. More descriptions regarding the determination of the probability interval value may be found elsewhere in the present disclosure (e.g., FIG. 12A, FIG. 12B, and the descriptions thereof).

In 2540, the processing device 112 (e.g., the normalized probability interval value determination module 2340 in the image coding engine 430) may determine a normalized probability interval value corresponding to the context by performing a normalization operation on the probability interval value. In some embodiments, the processing device may determine a shift digit corresponding to the context and determine the normalized probability interval value corresponding to the context by performing the normalization operation on the probability interval value based on the shift digit.

In some embodiments, as described above, in response to a determination that the decision, the MPS index, the context probability, and the previous probability interval value satisfy the preset condition, the processing device 112 may determine a shift digit corresponding to the context equal to a count of LZs in the at least one coding parameter.

In response to a determination that the decision, the MPS index, the context probability, and the previous probability interval value do not satisfy the preset condition, the processing device 112 may determine the shift digit corresponding to the context based on the previous probability interval value and the context probability in the at least one coding parameter. Specifically, as described in connection with operation 2530, in response to a determination that the decision, the MPS index, the context probability, and the previous probability interval value do not satisfy the preset condition, the processing device 112 may determine the probability interval value equal to the previous probability interval value minus the context probability. Accordingly, the processing device 112 may determine whether the highest bit of the probability interval value is equal to 1. In response to a determination that the highest bit of the probability interval value is equal to 1, the processing device 112 may determine the shift digit as 0. In response to a determination that the highest bit of the probability interval value is not equal to 1, the processing device 112 may further determine whether the second highest bit of the probability interval value is equal to 1. In response to a determination that the second highest bit of the probability interval value is equal to 1, the processing device 112 may determine the shift digit as 1. In response to a determination that the second highest bit of the probability interval value is not equal to 1, the processing device 112 may determine the shift digit as 2.

Further, after determining the shift digit corresponding to the context, the processing device 112 may determine the normalized probability interval value corresponding to the context by performing the normalization operation on the probability interval value based on the shift digit. In some embodiments, the normalization operation may be achieved by performing a shift processing on the probability interval value based on the shift digit. In some embodiments, the processing device 112 may determine a normalized shift identifier of the context that may be used to determine whether to perform the normalization operation (e.g., the shift processing) on the probability interval value. For example, as described in connection with FIG. 14A and FIG. 16A, if the decision is not equal to the MPS index, or the previous probability interval value is less than or equal to the OR operation result of the first context probability and the predetermined value, the processing device 112 may determine the normalized shift identifier as 1 (which indicates that the normalization operation (e.g., a left-shift processing) may be performed on the probability interval value based on the shift digit). Otherwise, the processing device 112 may determine the normalized shift identifier as 0 (which indicates that the normalization operation may not be performed on the probability interval value).

Take the coding process for coding two contexts as an example, as described in connection with FIGS. 13-14B, the processing device 112 may determine a first shift digit corresponding to the first context and determine a first normalized probability interval value corresponding to the first context by performing a first normalization operation on the first probability interval value based on the first shift digit. As described in connection with FIG. 15-FIG. 16B, the processing device 112 may determine a second shift digit corresponding to the second context and determine a second normalized probability interval value corresponding to the second context by performing a second normalization operation on the second probability interval value based on the second shift digit.

In 2550, the processing device 112 (e.g., the probability interval lower limit determination module 2350 in the image coding engine 430) may determine a probability interval lower limit corresponding to the context based on a previous probability interval lower limit and the at least one coding parameter. As used herein, the probability interval lower limit may refer to the smallest value of the probability interval value. For example, if the probability interval value is [0.75, 1.5], a probability interval lower limit thereof may be 0.75.

In some embodiments, as described above, in response to a determination that the decision, the MPS index, the context probability, and the previous probability interval value satisfy the preset condition (the indication signal of the update mode for updating the probability interval lower limit of the context may be determined is 0), the processing device 112 may determine the probability interval lower limit equal to the previous probability interval lower limit plus the context probability in the at least one coding parameter. In response to a determination that the decision, the MPS index, the context probability, and the previous probability interval value do not satisfy the preset condition (the indication signal of the update mode for updating the probability interval lower limit of the context may be determined is 1), the processing device 112 may determine the probability interval lower limit equal to the previous probability interval lower limit.

Take the coding process for coding two contexts as an example, the processing device 112 may determine a first probability interval lower limit corresponding to the first context based on a previous probability interval lower limit and the at least one first coding parameter. For example, as described in connection with FIG. 17, if a first indication signal of an update mode for updating a first probability interval lower limit of the first context is 1, the processing device 112 may determine the first probability interval lower limit equal to the previous probability interval lower limit. If the first indication signal of the update mode for updating the first probability interval lower limit of the first context is 0, the processing device 112 may determine the first probability interval lower limit equal to the previous probability interval lower limit plus the first context probability. In some embodiments, the processing device 112 may further determine a first normalized probability interval lower limit corresponding to the first context by performing the first normalization operation on the first probability interval lower limit.

Further, as described in connection with FIG. 19, if a second indication signal of an update mode for updating a second probability interval lower limit of the second context is 1, the processing device 112 may determine the second probability interval lower limit equal to a previous probability interval lower limit (which is designated to be the first normalized probability interval lower limit). If the second indication signal of the update mode for updating the second probability interval lower limit of the second context is 0, the processing device 112 may determine the second probability interval lower limit equal to the previous probability interval lower limit (i.e., the first normalized probability interval lower limit) plus the second context probability. In some embodiments, the processing device 112 may further determine a second normalized probability interval lower limit corresponding to the second context by performing the second normalization operation on the second probability interval lower limit. More descriptions regarding the determination of the probability interval lower limit may be found elsewhere in the present disclosure (e.g., FIG. 17, FIG. 19, and the descriptions thereof).

In 2560, the processing device 112 (e.g., the normalized probability interval lower limit determination module 2360 in the image coding engine 430) may determine a normalized probability interval lower limit corresponding to the context by performing the normalization operation on the probability interval lower limit.

In some embodiments, as described in connection with operation 2540, the normalized shift identifier of the context also may be used to determine whether to perform the normalization operation on the probability interval lower limit ("0" indicates that the normalization operation may not be performed on the probability interval lower limit; "1" indicates that the normalization operation may be performed on the probability interval lower limit). If the normalized shift identifier is equal to 1, the processing device 112 may determine an intermediate probability interval lower limit corresponding to the context by performing the normalization operation (e.g., a left-shift processing) on the probability interval lower limit based on the shift digit. Further, the processing device 112 may determine whether a count of bits to be output in a register corresponding to the probability interval lower limit is larger than the shift digit of the normalization operation. In response to a determination that the count of bits to be output is larger than the shift digit of the normalization operation, the processing device 112 may designate the intermediate probability interval lower limit as the normalized probability interval lower limit. In response to a determination that the count of bits to be output is less than or equal to the shift digit of the normalization operation, the processing device 112 may determine a processing result by retaining x bits starting from the lowest bit in the intermediate probability interval lower limit and zero clearing remainder bits. Further, the processing device 112 may determine the processing result as the normalized probability interval lower limit.

Take the coding process for coding two contexts as an example, as described in connection with FIGS. 18 and 20, the processing device 112 may determine a first normalized probability interval lower limit corresponding to the first context by performing a first normalization operation on the first probability interval lower limit and determine a second normalized probability interval lower limit corresponding to the second context by performing a second normalization operation on the second probability interval lower limit. More descriptions regarding the determination of the normalized probability interval lower limit may be found elsewhere in the present disclosure (e.g., FIG. 18, FIG. 20, FIG. 21, and the descriptions thereof).

In 2570, the processing device 112 (e.g., the byte output module 2370 in the image coding engine 430) may output at least one byte corresponding to the context based on the normalized probability interval lower limit. In some embodiments, when performing the normalization operation on the probability interval lower limit, the processing device 112 may determine the at least one byte corresponding to the context synchronously. More descriptions regarding outputting the at least one byte may be found elsewhere in the present disclosure (e.g., FIG. 18, FIG. 20, FIG. 21, and the descriptions thereof).

It should be noted that the above description of the process 2500 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, one or more other optional operations (e.g., a storing operation) may be added elsewhere in the process 2500. In the storing operation, information and/or data (e.g., the probability interval value, the normalized probability interval value, the probability interval lower limit, the normalized probability interval lower limit, the at least one byte) associated with the coding may be stored in a storage device (e.g., the storage device 150) disclosed elsewhere in the present disclosure.

Figure 26:
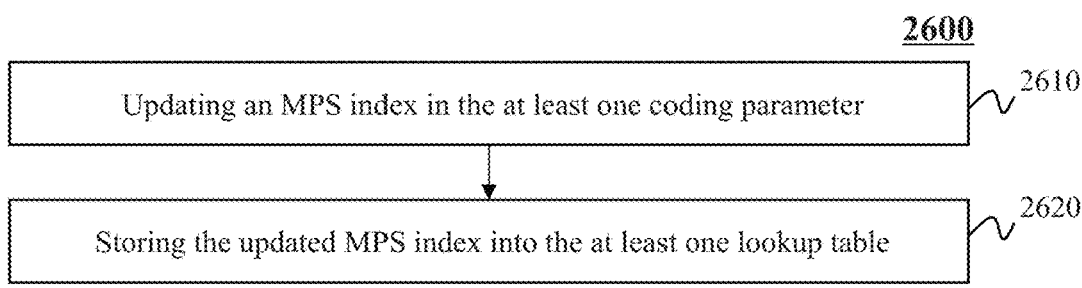
FIG. 26 is a flowchart illustrating an exemplary process for updating a more probable symbol index according to some embodiments of the present disclosure.

FIG. 26 is a flowchart illustrating an exemplary process for updating an MPS index according to some embodiments of the present disclosure. In some embodiments, the process 2600 may be implemented as a set of instructions (e.g., an application) stored in the storage ROM 230 or RAM 240. The processor 220 and/or the coding parameter obtaining module 2320 may execute the set of instructions, and when executing the instructions, the processor 220 and/or the coding parameter obtaining module 2320 may be configured to perform the process 2600. The operations of the illustrated process presented below are intended to be illustrative. In some embodiments, the process 2600 may be accomplished with one or more additional operations not described, and/or without one or more of the operations discussed. Additionally, the order in which the operations of the process 2600 as illustrated in FIG. 26 and described below is not intended to be limiting.

In 2610, the processing device 112 (e.g., the coding parameter obtaining module 2320) may update an MPS index in the at least one coding parameter.

Take the coding process for coding two contexts as an example, the processing device 112 may determine whether the first context is not equal to the second context.

In response to a determination that the first context is not equal to the second context, for each of the first context and the second context, the processing device 112 may determine whether a decision corresponding to the context is equal to an MPS index corresponding to the context. In response to a determination that the decision is equal to the MPS index, the processing device 112 may determine the updated MPS index equal to the MPS index (i.e., it is not needed to update the MPS index). In response to a determination that the decision is not equal to the MPS index, the processing device 112 may determine the updated MPS index based on the MPS index and an interval switch flag corresponding to the context.

In response to a determination that the first context is equal to the second context, the processing device 112 may determine whether a first decision corresponding to the first context is equal to a first MPS index corresponding to the first context. In response to a determination that the first decision is equal to the first MPS index, the processing device 112 may determine a first updated MPS index equal to the first MPS index. In response to a determination that the first decision is not equal to the first MPS index, the processing device 112 may determine the first updated MPS index based on the first MPS index and a first interval switch flag corresponding to the first context. Further, the processing device 112 may determine whether a second decision corresponding to the second context is equal to the first updated MPS index (which is designated as the second MPS index). In response to a determination that the second decision is equal to the first updated MPS index, the processing device 112 may determine a second updated MPS index equal to the first updated MPS index. In response to a determination that the second decision is not equal to the first updated MPS index, the processing device 112 may determine the second updated MPS index based on the first updated MPS index and a second interval switch flag corresponding to the second context. More descriptions regarding updating the MPS index may be found elsewhere in the present disclosure (e.g., FIG. 11 and the description thereof).

In 2620, the processing device 112 (e.g., the coding parameter obtaining module 2320) may store the updated MPS index into the at least one lookup table (e.g., the first lookup table). In some embodiments, as described in connection with FIG. 10, the at least one coding parameter other than the MPS index also may be updated and stored into the first lookup table for a next cycle.

It should be noted that the above description of the process 2600 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure.

In some embodiments, the present disclosure may also provide a storage medium storing a computer program thereon. When executed by a processor, the computer program may direct the processor to perform a process (e.g., processes 900-2100, process 2600, process 2700) described elsewhere in the present disclosure. For example, when executed by the processor, the computer program may direct the processor to update a probability interval value of each of two context-decision pairs input in parallel, perform a shift processing on the updated probability interval value, update a probability interval lower limit of each of the two context-decision pairs, normalize the probability interval lower limit, and output a code stream.

In some embodiments, the present disclosure may also provide a computing device including a processor and a storage, wherein the storage stores a computer program. When executed by a processor, the computer program may direct the processor to perform a process (e.g., processes 900-2100, process 2600, process 2700) described elsewhere in the present disclosure.

The systems and methods of the present disclosure have one or more advantage effects. According to the systems and methods of the present disclosure, a portion of processes in JPEG 2000 may be combined and/or optimized. For example, at least two contexts can be processed in a single clock and a single hardware logic is used instead of complex processing units. As another example, a single normalizer is used and code streams are output in order, which requires relatively low code stream buffer.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction performing system, apparatus, or device. Program code embodied on a computer readable signal medium may be transmitted using any appropriate medium, including wireless, wireline, optical fiber cable, RF, or the like, or any suitable combination of the foregoing.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A system for coding, comprising:
   at least one storage medium including a set of instructions; and
   at least one processor in communication with the at least one storage medium, wherein when executing the set of instructions, the at least one processor is directed to cause the system to:
      receive at least two contexts including a first context and a second context;
      for each of the at least two contexts,
         obtain, from at least one lookup table, at least one coding parameter corresponding to the context;
         determine a probability interval value corresponding to the context based on a previous probability interval value and the at least one coding parameter;
         determine a normalized probability interval value corresponding to the context by performing a normalization operation on the probability interval value;
         determine a probability interval lower limit corresponding to the context based on a previous probability interval lower limit and the at least one coding parameter;
         determine a normalized probability interval lower limit corresponding to the context by at least performing the normalization operation on the probability interval lower limit; and
         output at least one byte corresponding to the context based on the normalized probability interval lower limit.

2. The system of claim 1, wherein the at least one coding parameter includes at least one of a context probability, a next less probable symbol (NLPS) index, a next more probable symbol (NIPS) index, a more probable symbol (MPS) index, a interval switch flag, or a count of leading zeros (LZs).

3. The system of claim 1, wherein to obtain, from the at least one lookup table, the at least one coding parameter corresponding to the context, the at least one processor is directed to cause the system to:
   determine whether the first context is not equal to the second context;
   in response to a determination that the first context is not equal to the second context, retrieve at least one first coding parameter corresponding to the first context and at least one second coding parameter corresponding to the second context from the at least one lookup table with the first context and the second context as indexes respectively.

4. The system of claim 3, wherein to obtain, from the at least one lookup table, the at least one coding parameter corresponding to the context, the at least one processor is directed to cause the system to:
   in response to a determination that the first context is equal to the second context, retrieve the at least one first coding parameter corresponding to the first context from a first lookup table of the at least one lookup table with the first context as index;
   determine whether a first MPS index in the at least one first coding parameter is not equal to a first decision corresponding to the first context; and
   in response to a determination that the first MPS index is not equal to the first decision, retrieve the at least one second coding parameter corresponding to the second context from a second lookup table of the at least one lookup table with a first NLPS index in the at least one first coding parameter as index.

5. The system of claim 4, wherein to obtain, from the at least one lookup table, the at least one coding parameter corresponding to the context, the at least one processor is directed to cause the system to:
   in response to a determination that the first MPS index is equal to the first decision, determine whether the previous probability interval value is less than an OR operation result of a first context probability in the at least one first coding parameter and a predetermined value;

in response to a determination the previous probability interval value is less than the OR operation result of the first context probability and the predetermined value, retrieve the at least one second coding parameter from the second lookup table with a first NMPS index in the at least one first coding parameter as index; and in response to a determination the previous probability interval value is larger than or equal to the OR operation result of the first context probability and the predetermined value, determine the at least one second coding parameter based on the at least one first coding parameter.

6. The system of claim 1, wherein the at least one processor is directed to cause the system further to:
determine whether a decision corresponding to the context, an MPS index in the at least one coding parameter, a context probability in the at least one coding parameter, and the previous probability interval value satisfy a preset condition.

7. The system of claim 6, wherein to determine the probability interval value corresponding to the context based on the previous probability interval value and the at least one coding parameter, the at least one processor is directed to cause the system to:
in response to a determination that the decision, the MPS index, the context probability, and the previous probability interval value satisfy the preset condition, determine the probability interval value equal to the context probability; and
in response to a determination that the decision, the MPS index, the context probability, and the previous probability interval value do not satisfy the preset condition, determine the probability interval value equal to the previous probability interval value minus the context probability.

8. The system of claim 6, wherein to determine the normalized probability interval value corresponding to the context by performing the normalization operation on the probability interval value, the at least one processor is directed to cause the system to:
in response to a determination that the decision, the MPS index, the context probability, and the previous probability interval value satisfy the preset condition, determine a shift digit corresponding to the context equal to a count of LZs in the at least one coding parameter;
in response to a determination that the decision, the MPS index, the context probability, and the previous probability interval value do not satisfy the preset condition, determine the shift digit corresponding to the context based on the previous probability interval value and a context probability in the at least one coding parameter; and
determine the normalized probability interval value corresponding to the context by performing the normalization operation on the probability interval value based on the shift digit.

9. The system of claim 6, wherein to determine the probability interval lower limit corresponding to the context based on a previous probability interval lower limit and the at least one coding parameter, the at least one processor is directed to cause the system to:
in response to a determination that the decision, the MPS index, the context probability, and the previous probability interval value satisfy the preset condition, determine the probability interval lower limit equal to the previous probability interval lower limit plus a context probability in the at least one coding parameter; and in response to a determination that the decision, the MPS index, the context probability, and the previous probability interval value do not satisfy the preset condition, determine the probability interval lower limit equal to the previous probability interval lower limit.

10. The system of claim 1, wherein to determine the normalized probability interval lower limit corresponding to the context by at least performing the normalization operation on the probability interval lower limit, the at least one processor is directed to cause the system to:
determine an intermediate probability interval lower limit corresponding to the context by performing the normalization operation on the probability interval lower limit;
determine whether a count of bits to be output is larger than a shift digit of the normalization operation; and
in response to a determination that the count of bits to be output is larger than the shift digit of the normalization operation, determine the intermediate probability interval lower limit as the normalized probability interval lower limit.

11. The system of claim 10, wherein the at least one processor is directed to cause the system further to:
in response to a determination that the count of bits to be output is less than or equal to the shift digit of the normalization operation, determine a processing result by retaining x bits starting from the lowest bit of the intermediate probability interval lower limit and zero clearing remainder bits; and
determine the processing result as the normalized probability interval lower limit.

12. The system of claim 1, wherein the at least one processor is directed to cause the system to:
update an MPS index in the at least one coding parameter; and
store the updated MPS index into the at least one lookup table.

13. The system of claim 12, wherein to update the MPS index in the at least one coding parameter, the at least one processor is directed to cause the system to:
determine whether the first context is not equal to the second context;
in response to a determination that the first context is not equal to the second context, for each of the first context and the second context,
determine whether a decision corresponding to the context is equal to an MPS index corresponding to the context;
in response to a determination that the decision is equal to the MPS index, determine the updated MPS index equal to the MPS index; and
in response to a determination that the decision is not equal to the MPS index, determine the updated MPS index based on the MPS index and an interval switch flag corresponding to the context.

14. The system of claim 13, wherein to update the MPS index in the at least one coding parameter, the at least one processor is directed to cause the system to:
in response to a determination that the first context is equal to the second context, determine whether a first decision corresponding to the first context is equal to a first MPS index corresponding to the first context;
in response to a determination that the first decision is equal to the first MPS index, determine a first updated MPS index equal to the first MPS index;
in response to a determination that the first decision is not equal to the first MPS index, determine the first updated MPS index based on the first MPS index and a first interval switch flag corresponding to the first context;
determine whether a second decision corresponding to the second context is equal to the first updated MPS index;
in response to a determination that the second decision is equal to the first updated MPS index, determine a second updated MPS index equal to the first updated MPS index; and
in response to a determination that the second decision is not equal to the first updated MPS index, determine the second updated MPS index based on the first updated MPS index and a second interval switch flag corresponding to the second context.

15. A method implemented on a computing device including at least one processor, at least one non-transitory storage medium, and a communication platform connected to a network, the method comprising:
receiving at least two contexts including a first context and a second context;
for each of the at least two contexts,
obtaining, from at least one lookup table, at least one coding parameter corresponding to the context;
determining a probability interval value corresponding to the context based on a previous probability interval value and the at least one coding parameter;
determining a normalized probability interval value corresponding to the context by performing a normalization operation on the probability interval value;
determining a probability interval lower limit corresponding to the context based on a previous probability interval lower limit and the at least one coding parameter;
determining a normalized probability interval lower limit corresponding to the context by at least performing the normalization operation on the probability interval lower limit; and
outputting at least one byte corresponding to the context based on the normalized probability interval lower limit.

16. The method of claim 15, wherein the obtaining, from the at least one lookup table, the at least one coding parameter corresponding to the context includes:
determining whether the first context is not equal to the second context;
in response to a determination that the first context is not equal to the second context, retrieving at least one first coding parameter corresponding to the first context and at least one second coding parameter corresponding to the second context from the at least one lookup table with the first context and the second context as indexes respectively.

17. The method of claim 16, wherein the obtaining, from the at least one lookup table, the at least one coding parameter corresponding to the context includes:
in response to a determination that the first context is equal to the second context, retrieving the at least one first coding parameter corresponding to the first context from a first lookup table of the at least one lookup table with the first context as index;
determining whether a first MPS index in the at least one first coding parameter is not equal to a first decision corresponding to the first context; and
in response to a determination that the first MIPS index is not equal to the first decision, retrieving the at least one second coding parameter corresponding to the second context from a second lookup table of the at least one lookup table with a first NLPS index in the at least one first coding parameter as index.

18. The method of claim 17, wherein the obtaining, from the at least one lookup table, the at least one coding parameter corresponding to the context includes:
in response to a determination that the first MIPS index is equal to the first decision, determining whether the previous probability interval value is less than an OR operation result of a first context probability in the at least one first coding parameter and a predetermined value;
in response to a determination the previous probability interval value is less than the OR operation result of the first context probability and the predetermined value, retrieving the at least one second coding parameter from the second lookup table with a first NMPS index in the at least one first coding parameter as index; and
in response to a determination the previous probability interval value is larger than or equal to the OR operation result of the first context probability and the predetermined value, determining the at least one second coding parameter based on the at least one first coding parameter.

19. The method of claim 15 wherein the method further includes:
updating an MPS index in the at least one coding parameter; and
storing the updated MPS index into the at least one lookup table.

20. A non-transitory computer readable medium, comprising executable instructions that, when executed by at least one processor, direct the at least one processor to perform a method, the method comprising:
receiving at least two contexts including a first context and a second context;
for each of the at least two contexts,
obtaining, from at least one lookup table, at least one coding parameter corresponding to the context;
determining a probability interval value corresponding to the context based on a previous probability interval value and the at least one coding parameter;
determining a normalized probability interval value corresponding to the context by performing a normalization operation on the probability interval value;
determining a probability interval lower limit corresponding to the context based on a previous probability interval lower limit and the at least one coding parameter;
determining a normalized probability interval lower limit corresponding to the context by at least performing the normalization operation on the probability interval lower limit; and
outputting at least one byte corresponding to the context based on the normalized probability interval lower limit.

* * * * *